United States Patent
Park et al.

(10) Patent No.: US 12,029,048 B2
(45) Date of Patent: Jul. 2, 2024

(54) RESISTIVE MEMORY DEVICE

(71) Applicant: SAMSUNG ELECTRONICS CO., LTD., Suwon-si (KR)

(72) Inventors: Hyunmog Park, Seoul (KR); Jungyu Lee, Hwaseong-si (KR); Daehwan Kang, Seongnam-si (KR); Sungho Eun, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 470 days.

(21) Appl. No.: 17/526,262

(22) Filed: Nov. 15, 2021

(65) Prior Publication Data
US 2022/0310698 A1 Sep. 29, 2022

(30) Foreign Application Priority Data
Mar. 24, 2021 (KR) .................. 10-2021-0038277

(51) Int. Cl.
*H10B 63/00* (2023.01)
*G11C 13/00* (2006.01)
*H10N 70/00* (2023.01)

(52) U.S. Cl.
CPC ......... *H10B 63/84* (2023.02); *G11C 13/0023* (2013.01); *H10N 70/011* (2023.02); *H10N 70/882* (2023.02)

(58) Field of Classification Search
CPC .. H10N 70/253; H10N 70/231; H10N 70/021; H10B 63/30; H10B 63/00; H10B 63/10; H10B 63/24; H10B 63/845; H10B 63/84; G11C 13/0004
See application file for complete search history.

(56) References Cited

U.S. PATENT DOCUMENTS

| | | | |
|---|---|---|---|
| 8,124,968 B2 * | 2/2012 | Koo | ............ H10B 63/20 257/42 |
| 8,664,663 B2 * | 3/2014 | Konno | ............ H01L 21/0243 257/76 |
| 9,276,041 B2 | 3/2016 | Toh et al. | |
| 9,728,584 B2 | 8/2017 | Ramaswamy et al. | |

(Continued)

FOREIGN PATENT DOCUMENTS

| JP | 4363136 B2 | 11/2009 |
|---|---|---|
| KR | 10-2020-0008704 A | 1/2020 |

*Primary Examiner* — Richard Elms
*Assistant Examiner* — Margaret B Hayes
(74) *Attorney, Agent, or Firm* — Muir Patent Law, PLLC

(57) ABSTRACT

A resistive memory device includes: memory cells overlapping one another in a vertical direction within a cell array region and each including a switching element and a variable resistive element; first conductive lines each being connected to the switching element; a second conductive line connected to the variable resistive element and conductive pads arranged in a connection region and connected to respective one ends of the first conductive lines, respectively, and having different lengths in the second horizontal direction. A lower conductive pad from among the conductive pads includes a first portion covered by an upper conductive pad, and a second portion not covered by the upper conductive pad, and a thickness of each of the first and second portions in the vertical direction is greater than a thickness of each of the first conductive lines in the vertical direction.

20 Claims, 49 Drawing Sheets

(56) References Cited

U.S. PATENT DOCUMENTS

| | | | |
|---|---|---|---|
| 9,887,199 B2* | 2/2018 | Lim | H10B 43/27 |
| 9,947,721 B2 | 4/2018 | Fantini | |
| 10,186,658 B2 | 1/2019 | Nonoguchi et al. | |
| 10,256,248 B2 | 4/2019 | Lu et al. | |
| 10,546,998 B2 | 1/2020 | Hopkins | |
| 10,566,345 B2 | 2/2020 | Kanamori et al. | |
| 10,608,642 B2* | 3/2020 | Lee | H10B 61/00 |
| 10,665,606 B2 | 5/2020 | Baek et al. | |
| 10,811,430 B2 | 10/2020 | Baek et al. | |
| 10,872,919 B2 | 12/2020 | Takizawa et al. | |
| 10,930,847 B2* | 2/2021 | Yamaguchi | G11C 13/0028 |
| 10,971,548 B2 | 4/2021 | Eun et al. | |
| 11,127,792 B2* | 9/2021 | Song | H10B 63/845 |
| 11,574,956 B2* | 2/2023 | Park | H10B 63/84 |
| 11,665,914 B2* | 5/2023 | Song | H10N 70/841 |
| | | | 257/4 |
| 2011/0240948 A1* | 10/2011 | Kagawa | H10B 63/00 |
| | | | 257/E21.003 |
| 2018/0358056 A1* | 12/2018 | Lee | H10B 63/80 |
| 2020/0075850 A1 | 3/2020 | Park et al. | |
| 2020/0185400 A1 | 6/2020 | Park et al. | |
| 2022/0052113 A1* | 2/2022 | Lee | H10N 70/8825 |
| 2023/0049283 A1* | 2/2023 | Suk | H01L 24/19 |

* cited by examiner

X2 - X2'

X2 - X2'

X2 - X2'

Y1 - Y1'

RESISTIVE MEMORY DEVICE

CROSS-REFERENCE TO RELATED APPLICATION

This application is based on and claims priority under 35 U.S.C. § 119 to Korean Patent Application No. 10-2021-0038277, filed on Mar. 24, 2021, in the Korean Intellectual Property Office, the disclosure of which is incorporated by reference herein in its entirety.

BACKGROUND

1. Field

Embodiments relate to a resistive memory device.

2. Description of the Related Art

With the development of electronic technology, a variety of research into down-scaling and increased integration of semiconductor devices is being conducted. In particular, resistive memory devices including a plurality of memory cells having a 3D layout structure have been proposed as a method for increasing the integration of resistive memory devices.

SUMMARY

Embodiments are directed to a resistive memory device including a plurality of memory cells overlapping one another at locations spaced apart from one another in a vertical direction within a cell array region on a substrate, each of the plurality of memory cells including a switching element and a variable resistive element aligned with each other in a first horizontal direction; a plurality of first conductive lines overlapping one another at locations spaced apart from one another in the vertical direction within the cell array region on the substrate, each of the plurality of first conductive lines extending in a second horizontal direction perpendicular to the first horizontal direction, and each being connected to the switching element of a corresponding memory cell from among the plurality of memory cells; a second conductive line extending in the vertical direction within the cell array region on the substrate, being spaced apart from the plurality of first conductive lines in the first horizontal direction with the plurality of memory cells interposed between the second conductive line and the plurality of first conductive lines, and being connected to the variable resistive element of each of the plurality of memory cells; and a plurality of conductive pads arranged in a connection region adjacent to the cell array region on the substrate and connected to one end of a corresponding first conductive line from among the plurality of first conductive lines, the plurality of conductive pads having different lengths in the second horizontal direction. The plurality of conductive pads include a lower conductive pad and an upper conductive pad adjacent to each other in the vertical direction, the lower conductive pad includes a first portion covered by the upper conductive pad and a second portion not covered by the upper conductive pad, and a thickness of each of the first portion and the second portion in the vertical direction is greater than a thickness of each of the plurality of first conductive lines in the vertical direction.

Embodiments are directed to a resistive memory device including a pair of first conductive lines spaced apart from each other in a first horizontal direction within a cell array region on a substrate and each extending in a second horizontal direction perpendicular to the first horizontal direction at a first vertical level on the substrate; a second conductive line extending in a vertical direction between the pair of first conductive lines; a pair of memory cells spaced apart from each other in the first horizontal direction with the second conductive line interposed between the pair of memory cells, and each including a switching element and a variable resistive element, the switching element being arranged at the first vertical level and connected to one of the pair of first conductive lines and the variable resistive element being arranged at the first vertical level and connected to the second conductive line; a pair of lower conductive pads arranged at the first vertical level within a connection region adjacent to the cell array region on the substrate and connected to one end of a corresponding first conductive line from among the pair of first conductive lines; and a pair of upper conductive pads arranged at a second vertical level higher than the first vertical level within the connection region and covering respective portions of the pair of lower conductive pads. Each of the pair of lower conductive pads includes a first portion and a second portion, the first portion being covered by one upper conductive pad selected from the pair of upper conductive pads and the second portion not being covered by the selected upper conductive pad, and a thickness of each of the first portion and the second portion in the vertical direction is greater than a thickness of each of the pair of first conductive lines in the vertical direction.

Embodiments are directed to a resistive memory device including a peripheral circuit structure arranged on a substrate and including a plurality of circuits and a plurality of wiring layers; a pair of first conductive lines spaced apart from each other in a first horizontal direction within a cell array region on the peripheral circuit structure and each extending in a second horizontal direction perpendicular to the first horizontal direction at a first vertical level on the peripheral circuit structure; a second conductive line extending in a vertical direction between the pair of first conductive lines within the cell array region; a pair of memory cells arranged at the first vertical level within the cell array region and spaced apart from each other in the first horizontal direction with the second conductive line interposed between the pair of memory cells, each of the pair of memory cells including a switching element and a variable resistive element, the switching element being connected one of the pair of first conductive lines and the variable resistive element being arranged at the first vertical level and connected to the second conductive line; a pair of conductive pads arranged at the first vertical level within a connection region adjacent to the cell array region on the peripheral circuit structure, the conductive pads being connected to one end of a corresponding first conductive line from among the pair of first conductive lines; and a pair of upper conductive pads arranged at a second vertical level higher than the first vertical level within the connection region, the upper conductive pads covering respective portions of the pair of conductive pads. Each of the pair of conductive pads includes a first portion and a second portion, the first portion being covered by one upper conductive pad selected from the pair of upper conductive pads and the second portion not being covered by the selected upper conductive pad, and a thickness of each of the first portion and the second portion in the vertical direction is greater than a thickness of each of the pair of first conductive lines in the vertical direction.

BRIEF DESCRIPTION OF THE DRAWINGS

Features will become apparent to those of skill in the art by describing in detail example embodiments with reference to the attached drawings in which:

FIGS. 11A through 21D are cross-sectional views for explaining a method of manufacturing a semiconductor device according to an example embodiment, wherein FIG. 11A, FIG. 12A, FIG. 13A, FIG. 15A, FIG. 16A, FIG. 18A, FIG. 19A, and FIG. 21A are planar layouts of the local region LA1 of FIG. 3 according to a process sequence of the method, FIG. 11B, FIG. 12B, FIG. 13B, FIG. 14A, FIG. 15B, FIG. 16B, FIG. 17, and FIG. 18B are cross-sectional views of the local region LA1 along line X1-X1' of FIG. 4A according to a process sequence of the method, FIG. 20D is a partial perspective view of a partial region of FIG. 21C.

DETAILED DESCRIPTION

Figure 1:
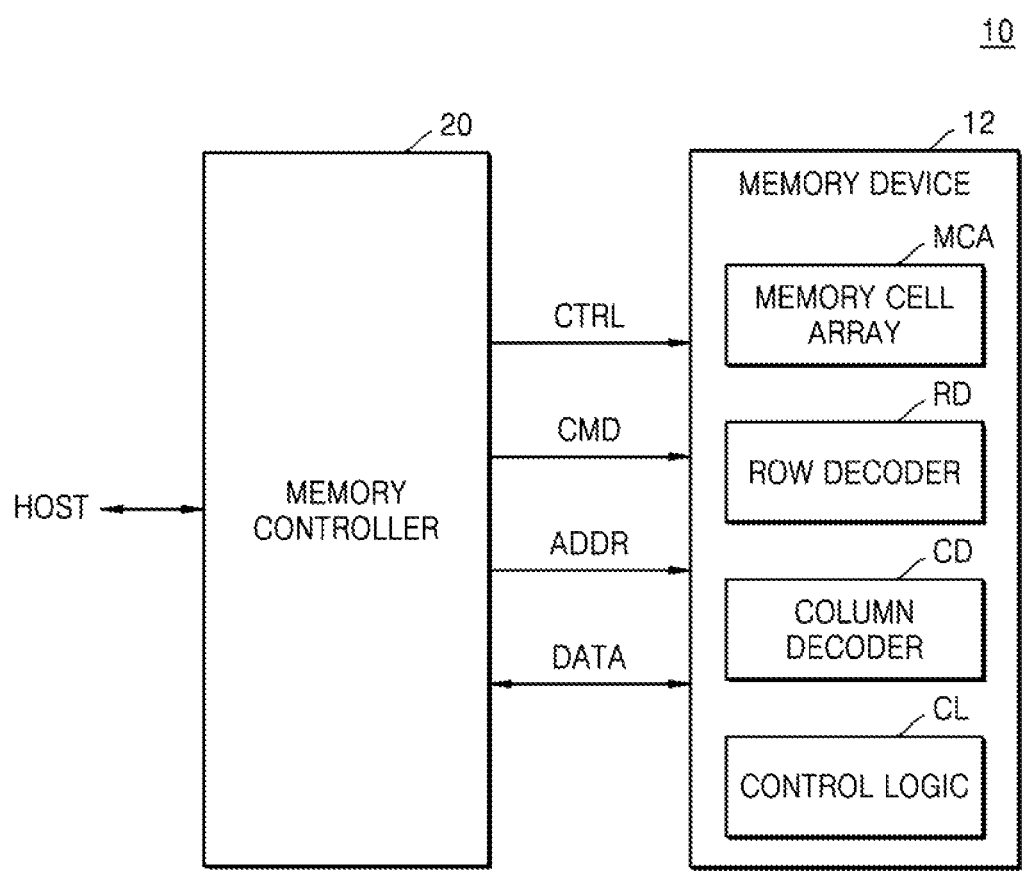
FIG. 1 is a block diagram for explaining a memory system including a resistive memory device according to an example embodiment.

FIG. 1 is a block diagram for explaining a memory system 10 including a resistive memory device according to an example embodiment.

Referring to FIG. 1, the memory system 10 may include a memory device 12 and a memory controller 20. The memory device 12 may include a memory cell array MCA, a row decoder RD, a column decoder CD, and a control logic CL.

The memory controller 20 may control the memory device 12 such that data stored in the memory device 12 is read out or data is stored in the memory device 12 in response to a read/write request from a host HOST. The memory controller 20 may provide the memory device 12 with an address ADDR, a command CMD and a control signal CTRL to control a program (or write) operation, a read operation and an erasure operation of the memory device 12. Data DATA to be written and read-out data DATA may be transmitted or received between the memory controller 20 and the memory device 12.

The memory cell array MCA may include a plurality of memory cells respectively disposed at intersections of a plurality of first signal lines and a plurality of second signal lines. The plurality of first signal lines may be a plurality of word lines and the plurality of second signal lines may be a plurality of bit lines. Each of the plurality of memory cells may include a single level cell (SLC) storing one bit, a multi-level cell (MLC) capable of storing data of at least two bits, a combination thereof, etc. The memory cell array MCA may include resistive memory cells including variable resistance elements. When the variable resistance elements include a phase-change material in which resistance changes according to temperature, the memory device 12 may be a phase-change random access memory (PRAM) device.

The row decoder RD may drive a plurality of word lines that constitute the memory cell array MCA, and the column decoder CD may drive a plurality of bit lines that constitute the memory cell array MCA. The row decoder RD may include a decoding unit that decodes a row address, and a switching unit that is switched in response to various row control signals according to a result of the decoding. The column decoder CD may include a decoding unit that decodes a column address, and a switching unit that is switched in response to various column control signals according to a result of the decoding.

The control logic unit CL may control overall operations of the memory device 12, and may control the row decoder RD and the column decoder CD to perform an operation of selecting a memory cell from the memory cell array MCA. For example, the control logic unit CL may process an external address to generate a row address and a column address.

The memory device 12 may include a power generation unit (not shown) that generates various write voltages and various read voltages for use in write and read operations, and a write voltage and a read voltage may be provided to a memory cell via the row decoder RD and the column decoder CD under the control of the control logic unit CL.

Figure 2:
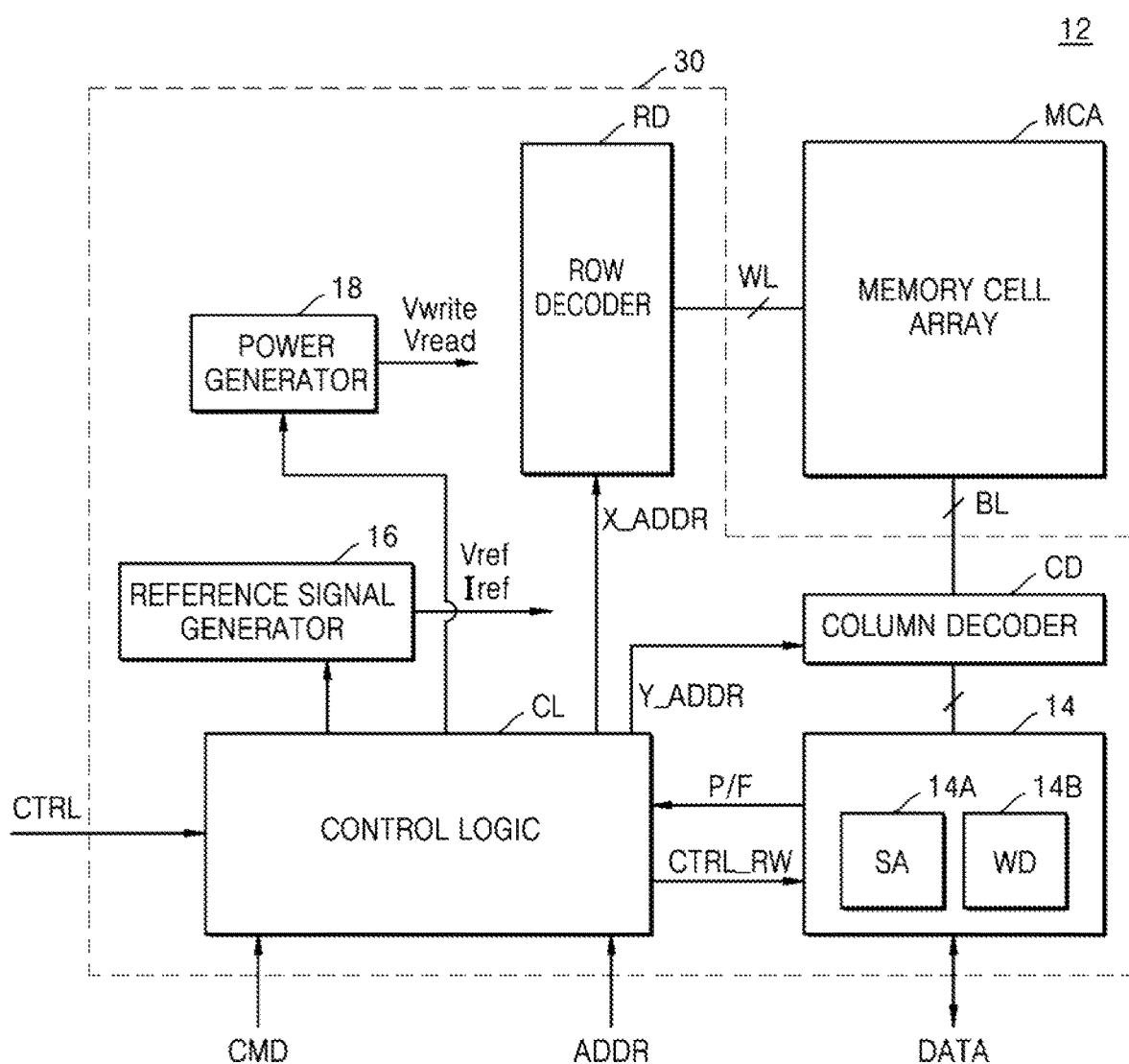
FIG. 2 is a block diagram of a structure of a memory device of FIG. 1.

FIG. 2 is a block diagram of a structure of the memory device 12 of FIG. 1.

Referring to FIG. 2, the memory device 12 may include a peripheral circuit 30 and the memory cell array MCA.

The peripheral circuit 30 may include the row decoder RD, the column decoder CD, the control logic CL, a write/read circuit 14, a reference signal generator 16, and a power generator 18. The peripheral circuit 30 may further include various circuits, such as a voltage generation circuit for generating various voltages used for an operation of the memory device 12, an error correction circuit for correcting an error to the data read out from the memory cell array MCA, and an input/output interface.

The memory cell array MCA may include a plurality of memory cells connected to a plurality of word lines WL and a plurality of bit lines BL. Various voltage signals or various current signals may be provided to the memory cell array MCA via the plurality of word lines WL and the plurality of bit lines BL, and thus data may be written to or read from memory cells selected from the memory cell array MCA and writing or reading with respect to unselected memory cells may be prevented.

The control logic unit CL may receive the address ADDR for indicating a memory cell to be accessed, in response to the command CMD. The address ADDR may include a row address X_ADDR for selecting a word line WL of the memory cell array MCA, and a column address Y_ADDR for selecting a bit line BL of the memory cell array MCA. The row decoder RD may perform a word line selection operation in response to the row address X_ADDR, and the column decoder CD may perform a bit line selection operation in response to the column address Y_ADDR.

The write/read circuit 14 may include a sense amplifier (SA) 14A and a write driver (WD) 14B. The write/read circuit 14 may be connected to a bit line BL to write data to a memory cell or read data from a memory cell.

The reference signal generator 16 may generate a reference voltage Vref and a reference current Iref as various reference signals associated with a data read operation.

The power generator 18 may generate a write voltage Vwrite for use in a write operation, and a read voltage Vread for use in a read operation. The write voltage Vwrite may include a set voltage and a reset voltage. The write voltage Vwrite and the read voltage Vread may be provided to the bit line BL via the column decoder CD), or may be provided to the word line WL via the row decoder RD.

In the write/read circuit 14, the SA 14A may be connected to a sensing node of the bit line BL in order to identify data by using the reference voltage Vref or the reference current Iref. The write/read circuit 14 may provide the control logic unit CL with the pass/fail signal P/F according to a result of identifying read-out data.

The control logic unit CL may control write and read operations of the memory cell array MCA by referring to the pass/fail signal P/F. The control logic unit CL may output various control signals CTRL RW for writing data to the memory cell array MCA or for reading data from the memory cell array MCA, based on the address signal ADDR, the command CMD, and the control signal CTRL received from the memory controller 20 of FIG. 1.

Figure 3:
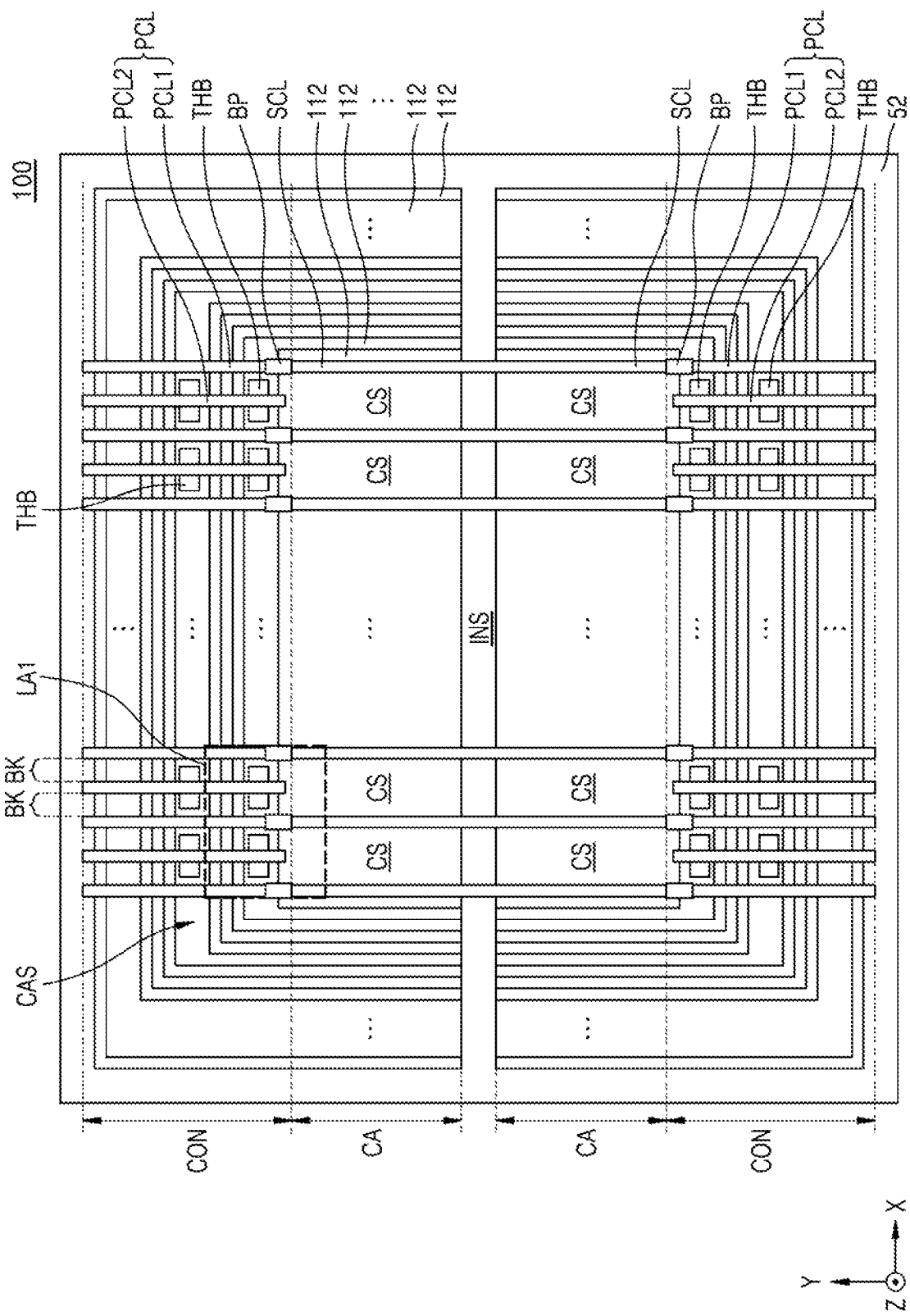
FIG. 3 is a schematic plan view of a resistive memory device according to an example embodiment.
Figure 4A:
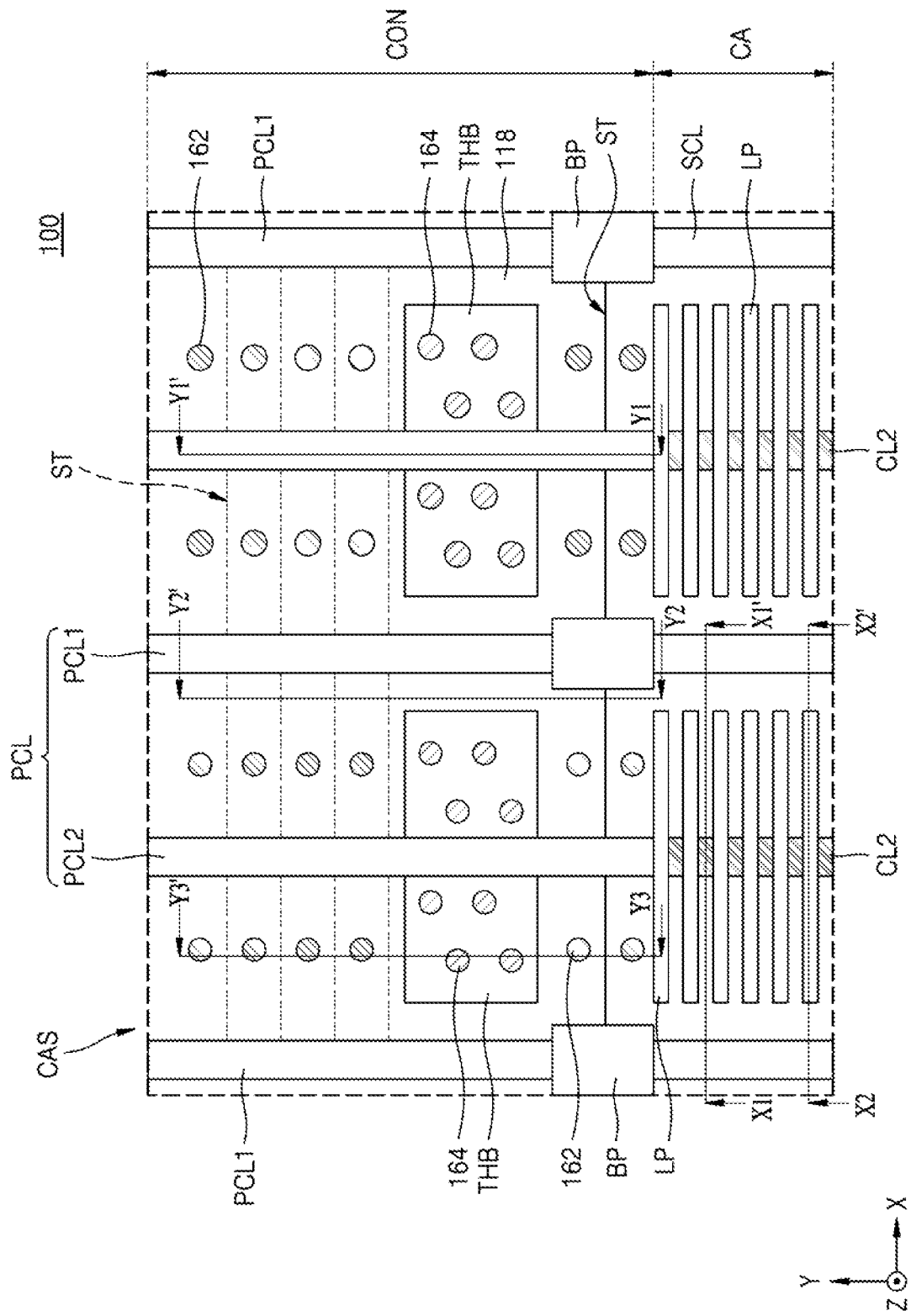
FIG. 4A is a plan layout of a local region indicated by LA1 in FIG. 3.
Figure 4B:
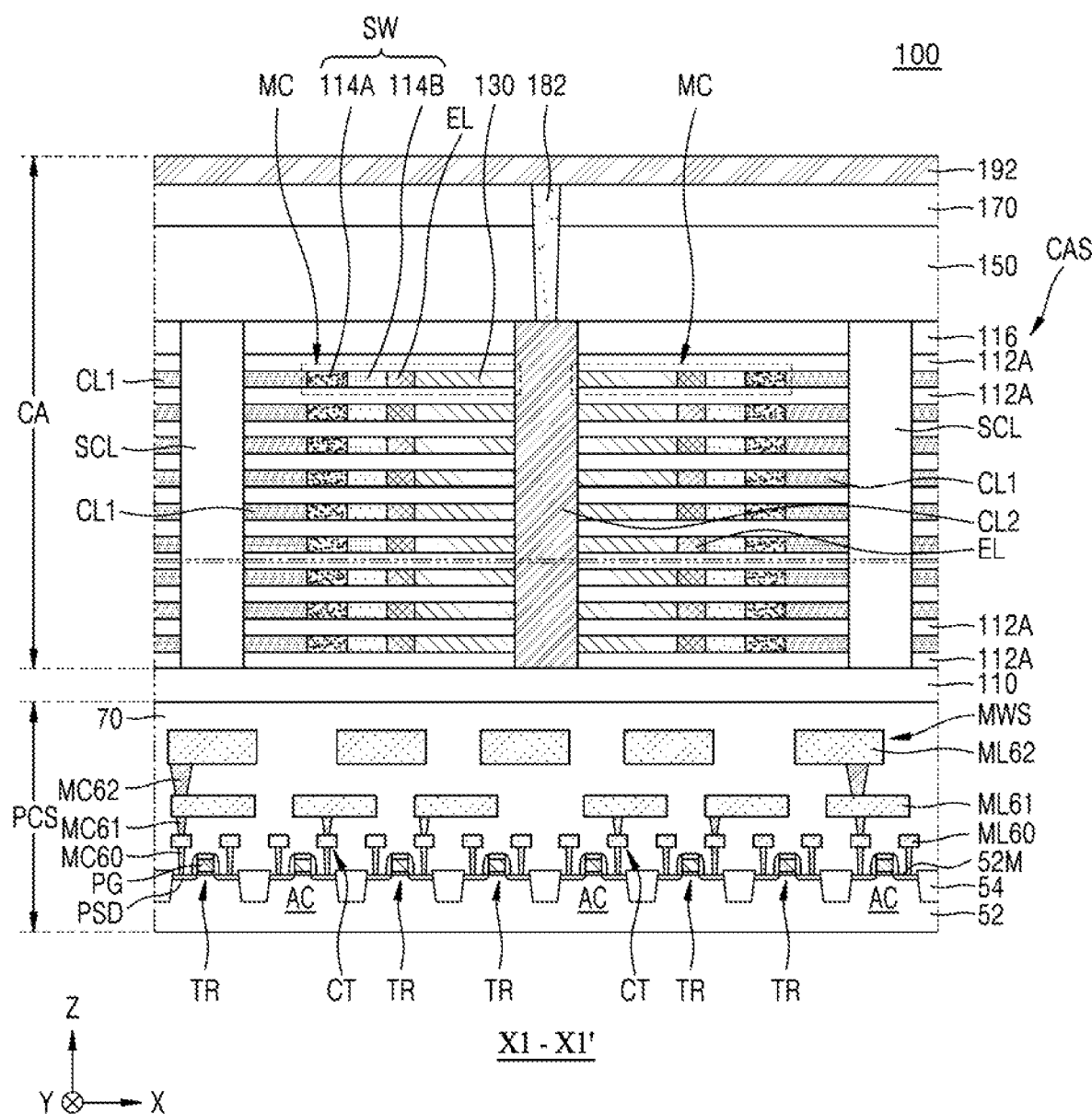
FIG. 4B is a cross-sectional view along line X1-X1' of FIG. 4A.
Figure 4C:
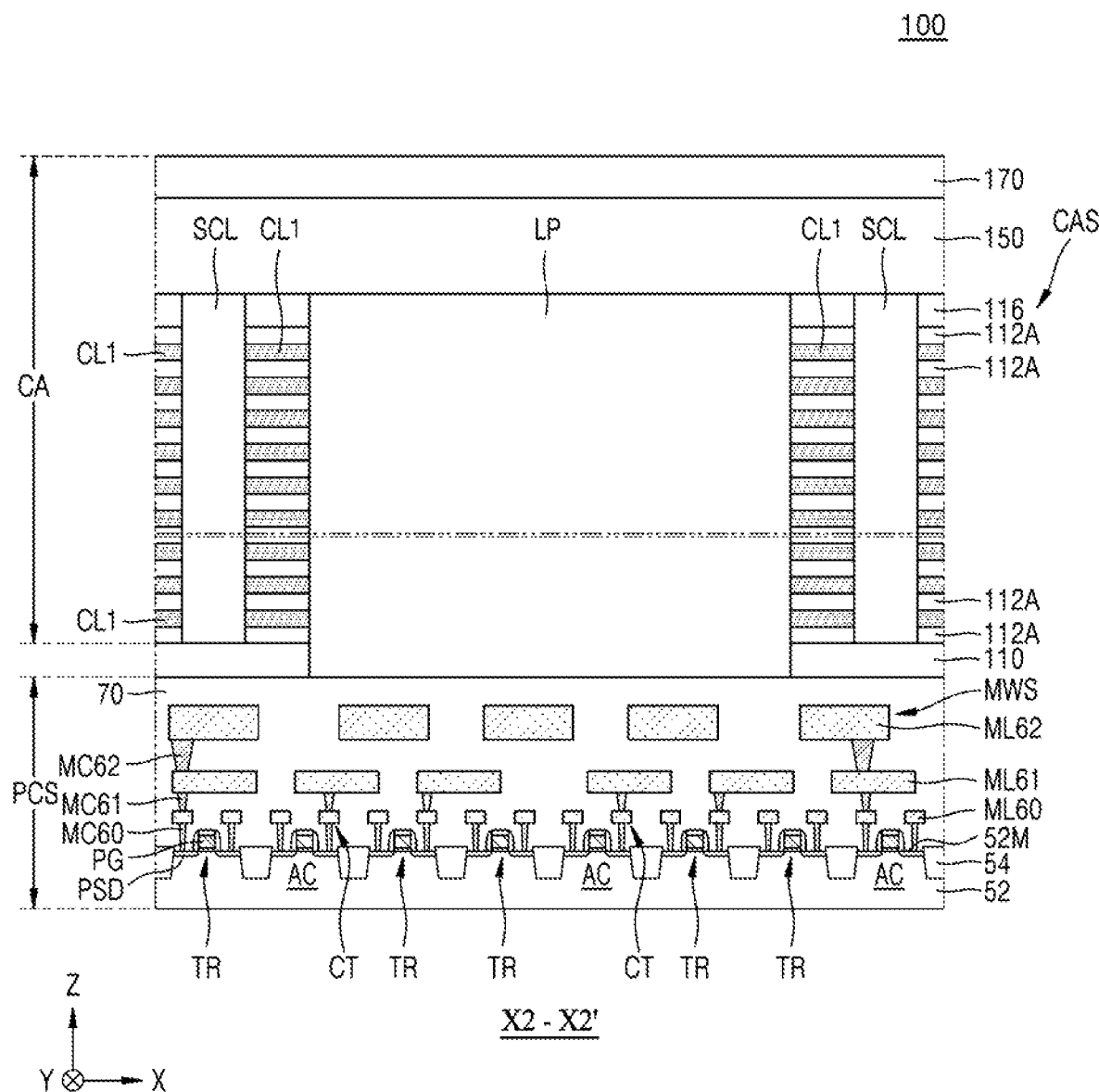
FIG. 4C is a cross-sectional view along line X2-X2' of FIG. 4A.
Figure 4D:
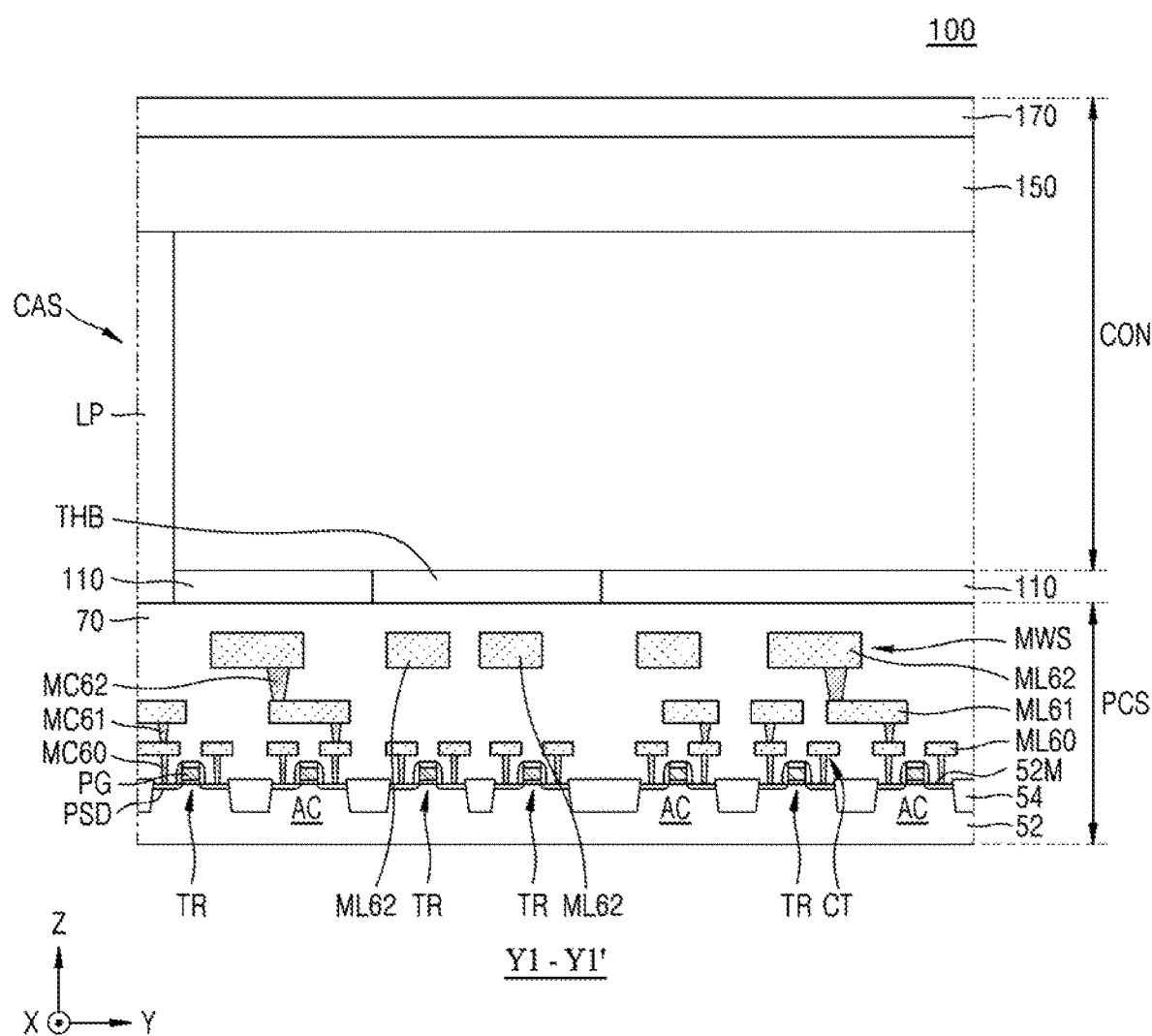
FIG. 4D is a cross-sectional view along line Y1-Y1' of FIG. 4A.
Figure 4E:
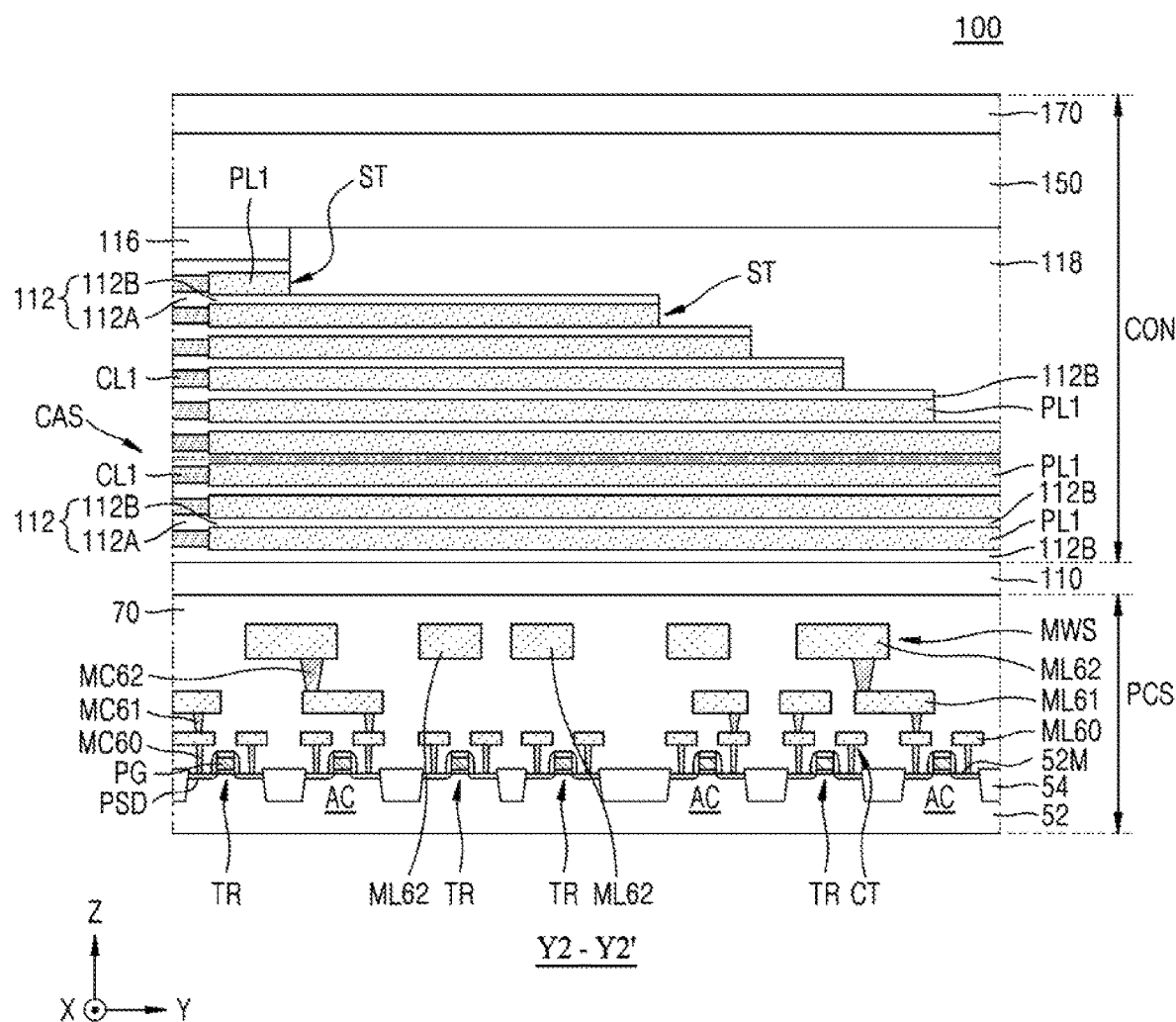
FIG. 4E is a cross-sectional view along line Y2-Y2' of FIG. 4A.
Figure 4F:
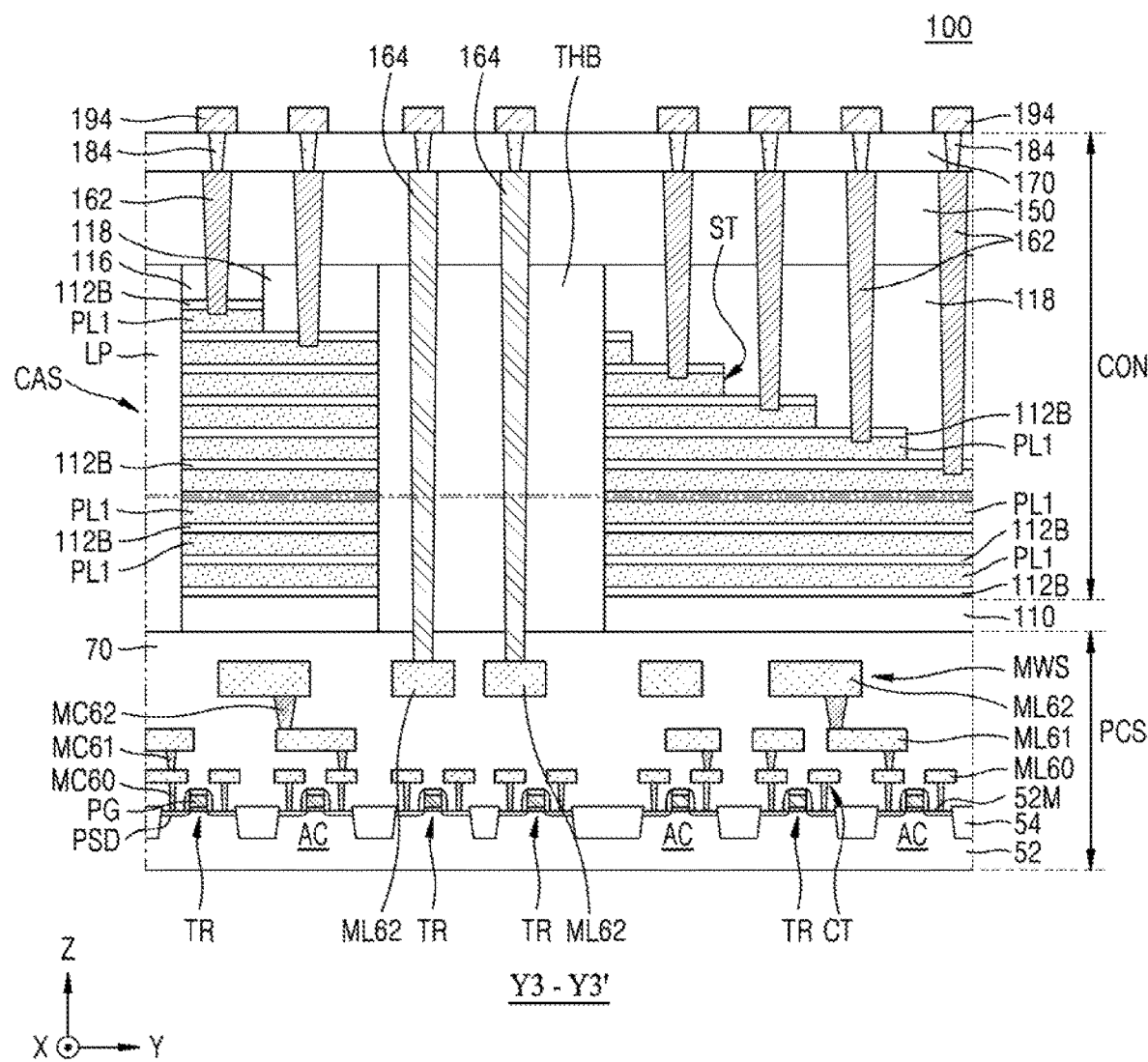
FIG. 4F is a cross-sectional view along line Y3-Y3' of FIG. 4A.
Figure 4G:
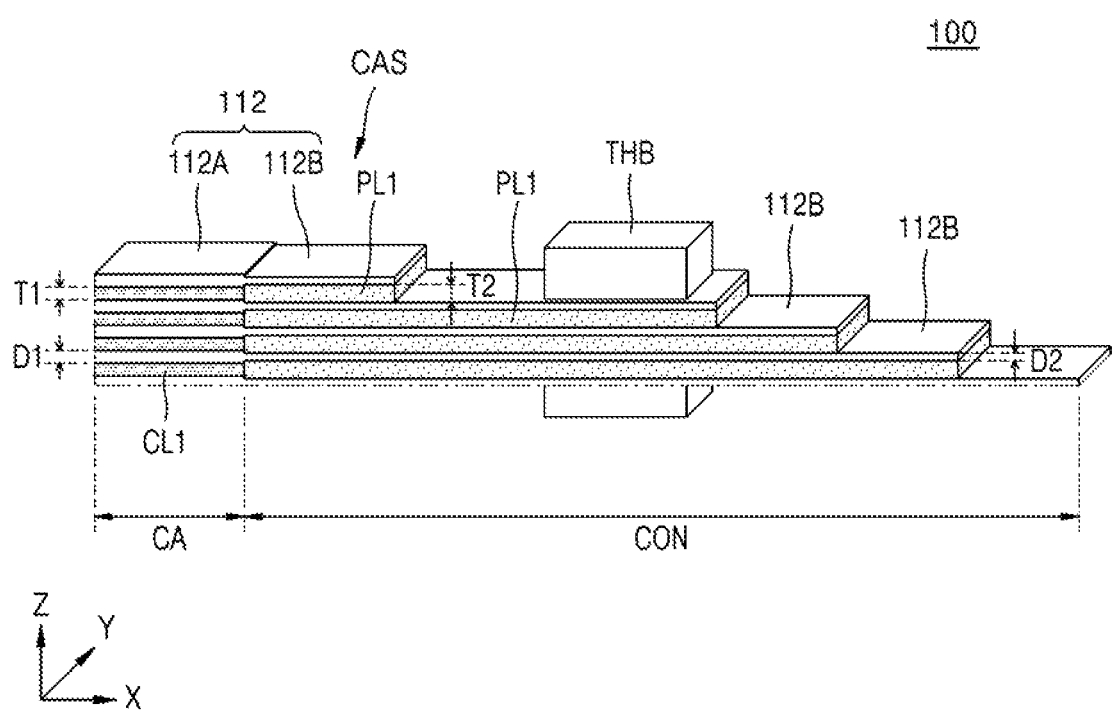
FIG. 4G is a schematic partial perspective view of some components of the resistive memory device of FIG. 3.
Figure 4H:
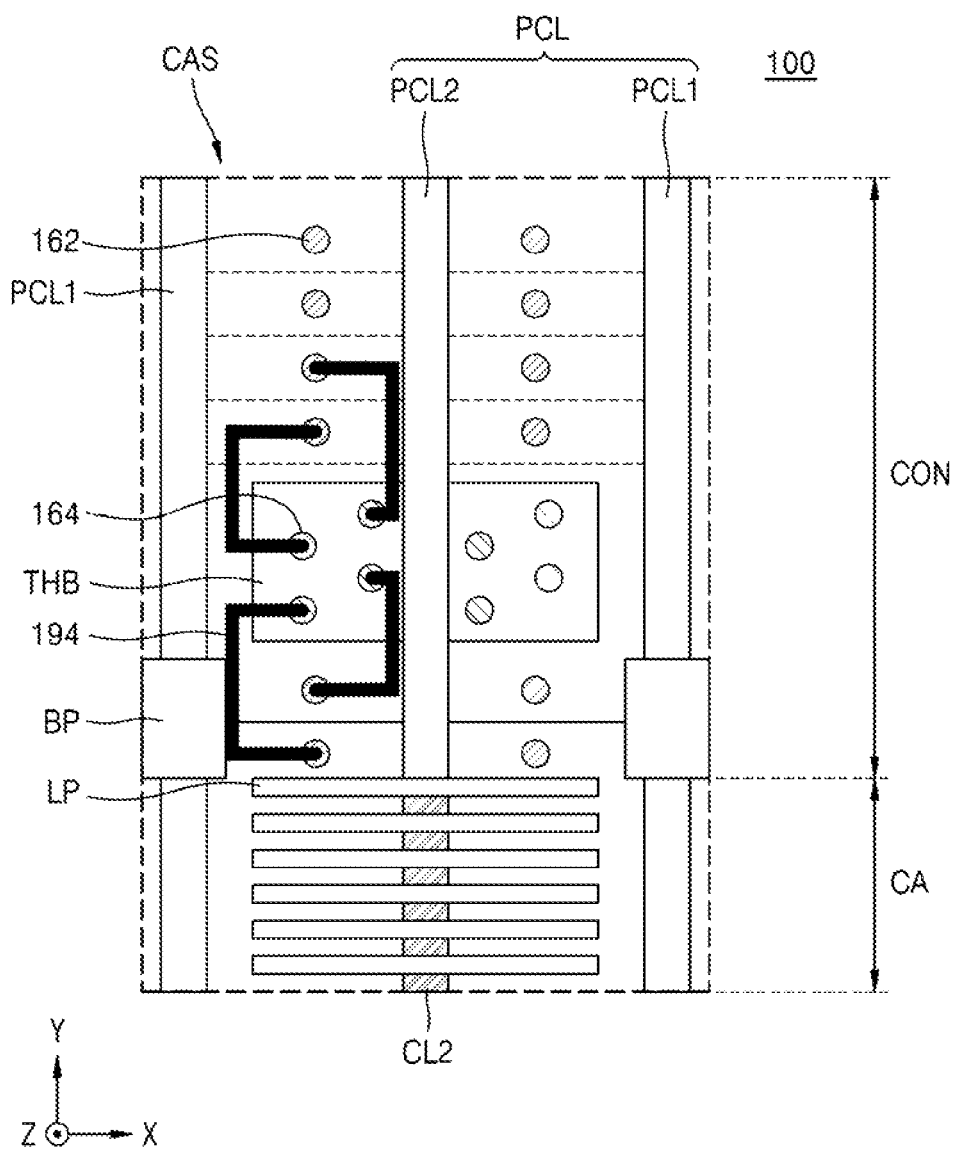
FIG. 4H is a planar layout showing an example wiring structure in a partial region of the resistive memory device of FIG. 3.

FIGS. 3 and 4A-4H are diagrams for explaining a resistive memory device 100 according to an example embodiment. In more detail, FIG. 3 is a schematic plan view of the resistive memory device 100. FIG. 4A is a plan layout of a local region indicated by LA1 in FIG. 3. FIG. 4B is a cross-sectional view along a line X1-X1' of FIG. 4A, and FIG. 4C is a cross-sectional view along a line X2-X2' of FIG. 4A. FIG. 4D is a cross-sectional view along a line Y1-Y1' of FIG. 4A, FIG. 4E is a cross-sectional view along a line Y2-Y2' of FIG. 4A, and FIG. 4F is a cross-sectional view along a line Y3-Y3' of FIG. 4A. FIG. 4G is a schematic partial perspective view of some components of the resistive memory device 100. FIG. 4H is a planar layout showing an example wiring structure in a partial region of the resistive memory device 100.

Referring to FIGS. 3 and 4A-4H, the resistive memory device 100 may include a plurality of cell array structures CAS arranged on a substrate 52. The plurality of cell array structures CAS may constitute the memory cell array MCA of the memory system 10 of FIG. 1.

Referring to FIGS. 4B-4F, a peripheral circuit structure PCS may be interposed between the substrate 52 and the plurality of cell array structures CAS. A support insulation layer 110 may be interposed between the peripheral circuit structure PCS and the plurality of cell array structures CAS. The support insulation layer 110 may support the cell array structure CAS by being located on the peripheral circuit structure PCS, and/or serve as an etch stop layer for protecting the peripheral circuit structure PCS during formation of the cell array structure CAS. The support insulation layer 110 may be a silicon nitride layer.

Referring to FIG. 3, a pair of cell array structures CAS adjacent to each other from among the plurality of cell array structures CAS may be spaced apart from each other with an isolation structure INS interposed therebetween. The pair of cell array structures CAS spaced apart from each other with an isolation structure INS interposed therebetween may have a mirror symmetrical structure having the isolation structure INS as its center.

Each of the plurality of cell array structures CAS may include a plurality of isolation insulation layers 112 spaced apart from one another in a vertical direction (Z direction) and overlapping one another in the vertical direction (Z direction). The plurality of isolation insulation layers 112 may have planar areas that decrease further away from the substrate 52 in the vertical direction (Z direction). The plurality of isolation insulation layers 112 may include a plurality of first isolation insulation layers 112A (illustrated in FIGS. 4A, 4C, and 4G) and a plurality of second isolation insulation layers 112B (illustrated in FIGS. 4E, 4F, and 4G). Each of the plurality of isolation insulation layers 112 may include a first isolation insulation layer 112A and a second isolation insulation layer 112B integrally formed with each other.

An uppermost isolation insulation layer 112 from among the plurality of isolation insulation layers 112 may be covered by an upper insulation layer 116. The plurality of isolation insulation layers 112 may be silicon oxide layers, and the upper insulation layer 116 may be a silicon nitride layer.

Referring to FIG. 3, each of the plurality of cell array structures CAS may include a cell array region CA, and a connection region CON arranged on one side of the cell array region CA to be adjacent to the cell array region CA. The cell array region CA of each of the plurality of cell array structures CAS may include a plurality of memory cells stack blocks CS distinguished from one another by a plurality of cell stack cut insulation lines SCL. The connection region CON of each of the plurality of cell array structures CAS may include a plurality of connection blocks BK distinguished from one another by a plurality of pad cut insulation lines PCL. A pitch of the plurality of cell stack cut insulation lines SCL in a first horizontal direction (X direction) may be about twice a pitch of the plurality of pad cut insulation lines PCL.

The isolation structure INS of FIG. 3 may be omitted. In this case, connection regions CON may be arranged on both sides of one memory cell stack block CS in a second horizontal direction (Y direction), respectively.

Referring to FIGS. 4B-4F, the peripheral circuit structure PCS may be interposed between the substrate 52 and a cell array structure CAS. The peripheral circuit structure PCS may include the peripheral circuit 30 described above with reference to FIG. 2. The peripheral circuit structure PCS may include a plurality of circuits CT formed on a main surface 52M of the substrate 52, and a multi-layered wiring structure MWS.

The cell array structure CAS may include a plurality of first conductive lines CL1 and a plurality of second conductive lines CL2. Each of the plurality of first conductive lines CL1 and the plurality of second conductive lines CL2 may be connected to at least one circuit CT selected from the plurality of circuits CT via the multi-layered wiring structure MWS included in the peripheral circuit structure PCS. The plurality of circuits CT may include various circuits included in the peripheral circuit 30 described above with reference to FIG. 2. The plurality of circuits CT may further include unit devices such as a resistor and a capacitor.

The substrate 52 may be a semiconductor substrate. For example, the substrate 52 may include Si, Ge, or SiGe. An active area AC may be defined in the substrate 52 by an isolation layer 54. A plurality of transistors TR constituting the plurality of circuits CT may be formed on the active area AC. Each of the plurality of transistors TR may include a gate PG, and source and drain regions PSD formed on both sides of the gate 60G within the active area AC.

The multi-layered wiring structure MWS may include a plurality of wiring layers ML60, ML61, and ML62 connected to the plurality of circuits CT, and a plurality of peripheral circuit contacts MC60, MC61, and MC62. At least some of the plurality of wiring layers ML60, ML61, and ML62 may be configured to be electrically connected to the plurality of transistors TR. The plurality of peripheral circuit contacts MC60, MC61, and MC62 may be configured to connect some of the plurality of transistors TR and the plurality of wiring layers ML60, ML61, and ML62 to each other.

Each of the plurality of wiring layers ML60, ML61, and ML62 and the plurality of peripheral circuit contacts MC60, MC61, and MC62 may be formed of metal, conductive metal nitride, metal silicide, a combination thereof, etc. For example, each of the plurality of wiring layers ML60, ML61, and ML62 and the plurality of peripheral circuit contacts MC60, MC61, and MC62 may include a conductive material such as tungsten, molybdenum, titanium, cobalt, tantalum, nickel, tungsten silicide, titanium silicide, cobalt silicide, tantalum silicide, or nickel silicide. Although the multi-layered wiring structure MWS has three wiring layers stacked on one another in the vertical direction (Z direction) in FIGS. 4B through 4F, the multi-layered wiring structure MWS may have, e.g., two wiring layers stacked on each other, or four or more wiring layers stacked on one another.

The plurality of circuits CT, the plurality of wiring layers ML60, ML61, and ML62, and the plurality of peripheral circuit contacts MC60, MC61, and MC62 may be covered by a peripheral circuit interlayer insulation layer 70. The peripheral circuit interlayer insulation layer 70 may include silicon oxide, SiON, SiOCN, etc.

Referring to FIG. 4B, the cell array structure CAS may include a plurality of memory cells MC overlapping each other at positions spaced apart from each other in the vertical direction (Z direction) within the cell array region CA. The resistive memory device 100 may have, e.g., 48, 64, or 96 memory cells MC overlapping each other in the vertical direction (Z direction). Each of the plurality of memory cells MC may include a switching element SW, an electrode element EL, and a variable resistive element 130 aligned with one another in the first horizontal direction (X direction).

A plurality of first conductive lines CL1 and a plurality of second conductive lines CL2 may be arranged in the cell array region CA. The plurality of first conductive lines CL1 may be disposed on one side of the plurality of memory cells MC overlapping one another in the vertical direction (Z direction) in the cell array region CA, and the plurality of second conductive lines CL2 may be disposed on the other side of the plurality of memory cells MC. Each of the plurality of first conductive lines CL1 may extend in a second horizontal direction (Y direction) perpendicular to the second horizontal direction (X direction). Each of the plurality of second conductive lines CL2 may extend in the vertical direction (Z direction).

In a portion of the cell array region CA, the plurality of first conductive lines CL1 may be spaced apart from each other in the vertical direction (Z direction) and may overlap one another. Each of the plurality of first conductive lines CL1 may be connected to the switching element SW of a corresponding memory cell MC from among the plurality of memory cells MC. The plurality of second conductive lines CL2 may be spaced apart from the plurality of first conductive lines CL1 in the first horizontal direction (X direction) with the plurality of memory cells MC overlapping one another in the vertical direction (Z direction) between the first and second conductive lines CL1 and CL2. Each of the plurality of second conductive lines CL2 may be connected to the variable resistive element 130 of each of the plurality of memory cells MC overlapping one another in the vertical direction (Z direction).

The plurality of memory cells MC overlapping one another in the vertical direction (Z direction) may be disposed on both sides of the plurality of second conductive lines CL2 in the first horizontal direction (X direction). Respective variable resistive elements 130 of a pair of memory cells MC on both sides of one second conductive line CL2 in the first horizontal direction (X direction) may be connected to the one second conductive line CL2. The pair of memory cells MC on both sides of the one second conductive line CL2 in the first horizontal direction (X direction) may be mirror-symmetrical to each other about the one second conductive line CL2.

Referring to FIG. 4A, a plurality of buried insulation patterns LP may be arranged in the cell array region CA. The plurality of second conductive lines CL2 may be disposed such that one second conductive line CL2 is interposed between two adjacent buried insulation patterns LP. The plurality of second conductive lines CL2 and the plurality of buried insulation patterns LP may be aligned with one another in the second horizontal direction (Y direction). A memory cell stack structure in which the plurality of memory cells MC overlap one another in the vertical direction (Z direction) as shown in FIG. 4B may be disposed on either side of the second conductive line CL2 in the first horizontal direction (X direction), between the plurality of buried insulation patterns LP.

Referring to FIGS. 4E and 4F, a plurality of conductive pads PL1 may be arranged in the connection region CON. Each of the plurality of conductive pads PL1 may be connected to one end of a corresponding first conductive line CL1 from among the plurality of first conductive lines CL1 arranged in the cell array region CA. The plurality of conductive pads PL1 may be spaced apart from one another in the vertical direction (Z direction), may overlap one another, and may have different lengths in the second horizontal direction (Y direction). Referring to FIGS. 4A, 4E, and 4F, in the connection region CON, respective ends of the plurality of conductive pads PL1 farthest from the memory cell array MCA in the second horizontal direction (Y direction) may form a plurality of steps ST.

Referring to FIGS. 4E and 4F, in the connection region CON, respective upper surfaces of the plurality of conductive pads PL1 and the plurality of steps ST thereof may be covered by a filling insulation layer 118. The respective upper surfaces of the plurality of conductive pads PL1 may be spaced apart from the filling insulation layer 118 with the second isolation insulation layers 112B therebetween, and sidewalls of the plurality of conductive pads PL1 that constitute the steps ST may contact the filling insulation layer 118. In the connection region CON, the upper insulation layer 116 and the filling insulation layer 118 may have respective upper surfaces that extend flatly on the same vertical level in the horizontal direction. The term "vertical level" used herein refers to a distance in the vertical direction (Z direction or –Z direction). The filling insulation layer 118 may be a silicon oxide layer.

Referring to FIGS. 4B, 4C, and 4G, a plurality of first isolation insulation layers 112A overlapping one another in the vertical direction (Z direction) may be arranged in the cell array region CA. In the cell array region CA, one first isolation insulation layer 112A may be interposed between the plurality of first conductive lines CL1 and the plurality of memory cells MC overlapping one another in the vertical direction (Z direction).

Referring to FIGS. 4E, 4F, and 4G, a plurality of second isolation insulation layers 112B overlapping one another in the vertical direction (Z direction) may be arranged in the cell array region CA. In the connection region CON, one second isolation insulation layer 112B may be interposed between the plurality of conductive pads PL1 overlapping one another in the vertical direction (Z direction). Referring to FIG. 4G, the first isolation insulation layer 112A and the second isolation insulation layer 112B at the same vertical level on the substrate 52 may be integrally connected to each other at a boundary between the cell array region CA and the connection region CON.

Referring to FIG. 4G, a thickness D2 of each of the plurality of second isolation insulation layers 112B in the vertical direction (Z direction) may be less than a thickness D1 of each of the plurality of first isolation insulation layers 112A in the vertical direction (Z direction). A maximum thickness of each of the plurality of second isolation insulation layers 112B in the vertical direction (Z direction) may be less than a minimum thickness of each of the plurality of first isolation insulation layers 112A in the vertical direction (Z direction), such that a separation distance in the vertical direction (Z direction) between the plurality of conductive pads PL1 existing in the connection region CON may be less than that between the plurality of first conductive lines CL1 existing in the cell array region CA.

Referring to FIGS. 4E, 4F, and 4G, the plurality of conductive pads PL1 may include a pair of conductive pad PL1 adjacent to each other in the vertical direction (Z direction). A conductive pad PL1 closer to the substrate 52 and present at a first vertical level from among the pair of conductive pads PL1 (hereinafter, referred to as a lower conductive pad PL1) may have a greater length in the second horizontal direction (Y direction) than a conductive pad PL1 farther from the substrate 52 and present at a second vertical level from among the pair of conductive pads PL1 (hereinafter, referred to as an upper conductive pad PL1). The lower conductive pad PL1 may include a first portion covered by the upper conductive pad PL1 and a second portion not covered by the upper conductive pad PL1. A thickness T2 of each of the first portion and the second portion in the vertical direction (Z direction) may be greater than a thickness T1 of each of the plurality of first conductive lines CL1. The thickness T2 of each of the first portion and the second portion in the vertical direction (Z direction) may be greater than a maximum thickness of each of the plurality of first conductive lines CL1.

The plurality of first conductive lines CL1 and the plurality of conductive pads PL1 may be each formed of metal, metal nitride, a combination thereof, etc. For example, the plurality of first conductive lines CL1 and the plurality of conductive pads PL1 may each include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, indium tin oxide (ITO), an alloy of each of these materials, a combination thereof, etc.

Referring to FIG. 4B, the switching element SW included in each of the plurality of memory cells MC may be formed of a diode including a first junction pattern 114A and a second junction pattern 114B having different conductivity types. The first junction pattern 114A may have a first conductivity type, and the second junction pattern 114B may have a second conductivity type that is different from the first conductivity type. When the first conductivity type is a P type, the second conductivity type may be an N type. When the first conductivity type is an N type, the second conductivity type may be a P type. The first junction pattern 114A may include impurities of the first conductivity type and impurities of the second conductivity type, and a concentration of the impurities of the first conductivity type may be greater than that of the impurities of the second conductivity type. The second junction pattern 114B may include impurities of the second conductivity type. In another implementation, the switching element SW included in each of the plurality of memory cells MC may include an amorphous chalcogenide switching material instead of the first junction pattern 114A and the second junction pattern 114B. This will be described in greater detail below with reference to FIG. 5A.

Referring to FIG. 4B, the electrode element EL included in each of the plurality of memory cells MC may be formed of a conductive material, e.g., W, Ti, Ta, Al, Cu, C, CN, TiN, TiAlN, TiSiN, TiCN, TiCSiN, WN, CoSiN, WSiN, TaN, TaCN, TaSiN, TiO, a combination thereof, etc.

The variable resistive element 130 included in each of the plurality of memory cells MC may include a phase change material that reversibly changes between an amorphous state and a crystalline state. For example, the variable resistive element 130 may include a material of which a phase may be reversibly changed due to Joule heat generated by a voltage applied to both ends of the variable resistive element 130 and a resistance may be changed due to the phase change. The variable resistive element 130 may include a chalcogenide material as the phase change material.

The variable resistive element 130 may be a single layer or multi-layer including a material selected from binary system materials such as GeTe, GeSe, GeS, Sb Se, SbTe, SbS, SbSe, SnSb, InSe, InSb, AsTe, AlTe, GaSb, AlSb, BiSb, ScSb, Ysb, CeSb, DySb, and NdSb, ternary system materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, four-component system materials such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and five-component system materials such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeZn, GeScSbTeGa, GeSbAsTeAl, GeScSbTeTl, GeScSbTeZn, GeScSbTeSn, GeSbSeTeSn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In another implementation, the variable resistive element 130 may include a material selected from the two-component through five-component system materials illustrated as the material used to form the variable resistive element 130, and at least one additional element selected from B, C, N, O, P, Cd, W, Ti, Hf, and Zr.

In the first horizontal direction (X direction), one end of the variable resistive element 130 may contact the electrode element EL, and an opposite end of the variable resistive element 130 may contact the second conductive line CL2. In another implementation, another electrode element having the same structure as or a similar structure to the electrode element EL may be interposed between the other end of the variable resistive element 130 and the second conductive line CL2. In another implementation, each of the plurality of memory cells MC may further include a plurality of barrier layers (not shown) contacting the one end and the other end of the variable resistive element 130. The plurality of barrier layers may be formed of a conductive material, e.g., W, WN, WC, a combination thereof, etc.

Referring to FIG. 4B, the plurality of memory cells MC and the plurality of first isolation insulation layer 112A may be arranged to alternate one by one with one another on the support insulation layer 110 in the vertical direction (Z direction). Respective lower surfaces and respective upper surfaces of the plurality of memory cells MC may be covered by the first isolation insulation layer 112A.

Referring to FIGS. 3 and 4A, in the connection region CON, a plurality of pad cut insulation lines PCL may each extend in the second horizontal direction (Y direction). The plurality of pad cut insulation lines PCL may include a plurality of first pad cut insulation lines PCL1 and a plurality of second pad cut insulation lines PCL2. The plurality of first pad cut insulation lines PCL1 and the plurality of second pad cut insulation lines PCL2 may be arranged to alternate one by one with one another in the first horizontal direction (X direction). In the second horizontal direction (Y direction), a length of each of the plurality of first pad cut insulation lines PCL1 may be less than that of each of the plurality of second pad cut insulation lines PCL2.

The plurality of first pad cut insulation lines PCL1 may each extend in the second horizontal direction (Y direction), and may be aligned with the cell stack cut insulation line SCL in a straight line in the second horizontal direction (Y direction). The plurality of second pad cut insulation lines PCL2 may each extend in the second horizontal direction (Y direction), and may define a width of each of the plurality of first pad cut insulation lines PCL1 in the first horizontal direction (X direction), together with the plurality of conductive pads PL1. The plurality of second pad cut insulation lines PCL2 may be aligned with the second conductive line CL2 in a straight line in the second horizontal direction (Y direction).

Referring to FIGS. 3 and 4B, in the cell array region CA, the plurality of cell stack cut insulation lines SCL may each extend in the second horizontal direction (Y direction). A pair of cell stack cut insulation lines SCL adjacent to each other from among the plurality of cell stack cut insulation lines SCL may be spaced apart from each other in the first horizontal direction (X direction) with the plurality of first conductive lines CL1, the plurality of second conductive lines CL2, and the plurality of memory cells MC interposed therebetween. The plurality of cell stack cut insulation lines SCL may be spaced apart from the second conductive line CL2 in the first horizontal direction (X direction) with the plurality of first conductive lines CL1 and the plurality of memory cells MC interposed therebetween.

Referring to FIGS. 3, 4A, 4F, and 4G, in the connection region CON, a plurality of insulation boxes THB may penetrate through some of the plurality of conductive pads PL1 and some of the plurality of second isolation insulation layers 112B in the vertical direction (Z direction). In the connection region CON, the plurality of insulation boxes THB may contact some of the second isolation insulation layers 112B and may support the some second isolation insulation layers 112B. Referring to FIG. 4F, the plurality of insulation boxes THB may penetrate through the support insulation layer 110 to contact the peripheral circuit interlayer insulation layer 70 of the peripheral circuit structure PCS. In another implementation, in contrast with FIG. 4F, the plurality of insulation boxes THB may not penetrate through the support insulation layer 110. In this case, the respective lower surfaces of the plurality of insulation boxes THB may contact the support insulation layer 110.

Referring to FIGS. 3 and 4A, a plurality of blocking insulation patterns BP may be arranged between the plurality of cell stack cut insulation lines SCL and the plurality of first pad cut insulation lines PCL1 at a location adjacent to the boundary between the cell array region CA and the connection region CON. Each of the plurality of blocking insulation patterns BP may contact a cell stack cut insulation line SCL and a first pad cut insulation line PCL1 adjacent to the blocking insulation pattern BP with the blocking insulation pattern BP interposed therebetween.

Each of the plurality of blocking insulation patters BP may be spaced apart from a pair of second pad cut insulation lines PCL2 adjacent to each other from among the plurality of second pad cut insulation lines PCL2, in the first horizontal direction (X direction). A pair of blocking insulation patterns BP adjacent to each other from among the plurality of blocking insulation patterns BP may be spaced apart from each other in the first horizontal direction (X direction) with one second pad cut insulation line PCL2 interposed therebetween. The plurality of blocking insulation patterns BP may face the pair of second pad cut insulation lines PCL2 in the first horizontal direction (X direction), at a location adjacent to the boundary between the cell array region CA and the connection region CON.

Referring to FIG. 3, the plurality of second pad cut insulation lines PCL2 may penetrate through the plurality of insulation boxes THB arranged in the second horizontal direction (Y direction), and may extend in the second horizontal direction (Y direction). Referring to FIG. 4D, a lower surface of a second pad cut insulation line PCL2 may contact the support insulation layer 110, and a sidewall of the second pad cut insulation line PCL2 closest to the cell array region CA from among the sidewalls thereof may contact a buried insulation pattern LP. Referring to FIG. 4C, in the cell array region CA, the buried insulation pattern LP may be spaced apart from a cell stack cut insulation line SCL in the first horizontal direction (X direction) with the plurality of first conductive lines CL1 overlapping one another in the vertical direction (Z direction) interposed therebetween.

Each of the plurality of cell stack cut insulation lines SCL, the buried insulation pattern LP, the plurality of insulation boxes THB, the plurality of first pad cut insulation lines PCL1, the plurality of second pad cut insulation lines PCL2, and the plurality of blocking insulation patterns BP may be a silicon oxide layer.

Referring to FIGS. 4B through 4F, in the cell array region CA and the connection region CON, the upper insulation layer 116 and the filling insulation layer 118 may be covered by the first interlayer insulation layer 150, and the first interlayer insulation layer 150 may be covered by the second interlayer insulation layer 170. Each of the first interlayer insulation layer 150 and the second interlayer insulation layer 170 may be a silicon oxide layer.

Referring to FIG. 4B, in the cell array region CA, a cell contact plug 182 may be arranged on the second conductive line CL2. The cell contact plug 182 may penetrate through the first interlayer insulation layer 150 and the second interlayer insulation layer 170 and may contact the upper surface of the second conductive line CL2. A cell conductive line 192 may be arranged on the cell contact plug 182 and the second interlayer insulation layer 170. The cell conductive line 192 may be connected to the cell conductive line 192 via the cell contact plug 182. A plurality of cell conductive lines 192 connected to the plurality of second conductive lines CL2 may be arranged in the cell array region CA. FIG. 4B illustrates one second conductive line CL2 from among the plurality of second conductive lines CL2. The plurality of cell conductive lines 192 may be arranged parallel to one another in the first horizontal direction (X direction).

Referring to FIGS. 4A and 4F, a plurality of peripheral contact plugs 162 may be arranged on the plurality of conductive pads PL1 in the connection region CON. Each of the plurality of peripheral contact plugs 162 may start from the upper surface of each of the conductive pads PL1, may penetrate through the second isolation insulation layer 112B, the filling insulation layer 118, and the first interlayer insulation layer 150, and may extend upwards in the vertical direction (Z direction).

Referring to FIGS. 4A and 4F, the connection region CON may include a plurality of through-hole via electrode regions defined by the plurality of insulation boxes THB. In the plurality of through-hole via electrode regions, each of a plurality of through-hole via electrodes 164 may penetrate through the insulation box THB in the vertical direction (Z direction) and may extend in the vertical direction (Z direction). The plurality of through-hole via electrodes 164 may be connected to one wiring layer selected from among a plurality of wiring layers ML60, ML61, and ML62 included in the peripheral circuit structure PCS. Although FIGS. 4A and 4H illustrate a case where the plurality of through-hole via electrodes 164 penetrating through the insulation box THB are arranged in a zigzag form when viewed in a plan view, the layout of the plurality of through-hole via electrodes 164 may vary.

Referring to FIG. 4F, in the connection region CON, upper surfaces of the plurality of peripheral contact plugs 162 and upper surfaces of the plurality of through-hole via electrodes 164 may be at the same vertical level on the substrate 52. A plurality of contact studs 184 may be arranged on the plurality of peripheral contact plugs 162 and the plurality of through-hole via electrodes 164. A plurality of peripheral conductive lines 194 may be arranged on the plurality of contact studs 184 and the second interlayer insulation layer 170. The plurality of peripheral conductive lines 194 may be connected to the peripheral contact plugs 162 or the plurality of through-hole via electrodes 164 via the contact studs 184, respectively.

The plurality of peripheral conductive lines 194 may be arranged at the same level as the cell conductive line 192. In another implementation, the plurality of contact studs 184 may be omitted, and the plurality of peripheral conductive lines 194 may be arranged on the first interlayer insulation layer 150 and may be directly connected to the plurality of peripheral contact plugs 162 and the plurality of through-hole via electrodes 164.

Each of the plurality of peripheral contact plugs 162 may be connected to one of the plurality of through-hole via electrodes 164 via a conductive line 194. FIG. 4H illustrates a planar structure of the plurality of peripheral conductive lines 194. Although illustration of the plurality of contact studs 184 is omitted in FIG. 4H, the plurality of contact studs 184 may be interposed between the plurality of peripheral contact plugs 162 and the plurality of through-hole via electrodes 164 and the plurality of peripheral conductive lines 194. The arrangement of the plurality of contact studs 184 between the plurality of through-hole via electrodes 164 and the plurality of peripheral conductive lines 194 may facilitate a routing wiring design for forming the plurality of peripheral conductive lines 194.

Each of the plurality of peripheral contact plugs 162, the plurality of through-hole via electrodes 164, the cell contact plug 182, the plurality of contact studs 184, the cell conductive line 192, and the plurality of peripheral conductive lines 194 may be formed of W, Ti, Ta, Cu, Al, TiN, TaN, WN, a combination thereof, etc.

As described above with reference to FIG. 3 and FIGS. 4A through 4H, the resistive memory device 100 may include an insulation box THB penetrating through some of the plurality of conductive pads PL1 and some of the plurality of second isolation insulation layers 112B in the vertical direction (Z direction), and extending in the vertical direction (Z direction) within the connection region CON. In the connection region CON, the insulation box THB may contact a second isolation insulation layer 112B and may support the second isolation insulation layer 112B. Accordingly, in a process of manufacturing the resistive memory device 100, when a space between the plurality of second isolation insulation layers 112B remains empty before the plurality of conductive pads PL1 are formed, the plurality of second isolation insulation layers 112B may be supported by the insulation box THB to maintain a desired shape, and thus sagging, deformation, or the like of the plurality of second isolation insulation layers 112B through the empty space may be prevented. The thickness T2 of each of the plurality of conductive pads PL1 arranged in the connection region CON of the resistive memory device 100 may be greater than the thickness T1 of each of the plurality of first conductive lines CL1 arranged in the cell array region CA thereof. Thus, when an etch process for forming a plurality of contact holes that expose the respective upper surface of the plurality of conductive pads PL1 is performed to form the plurality of peripheral contact plugs 162, the plurality of conductive pads PL1 may sufficiently serve as an etch stop layer during the etch process for forming the plurality of contact holes. Therefore, extension of the contact holes to another conductive pad PL1 under a target conductive pad PL1 to be exposed through a contact hole due to unwanted penetration of the contact hole through the target conductive pad PL1 during the etch process may be prevented. Accordingly, occurrence of a process defect may be minimized in the process of manufacturing the resistive memory device 100, and a stable electrical connection between the plurality of memory cells MC and other neighboring circuits may be provided.

Figure 5A:
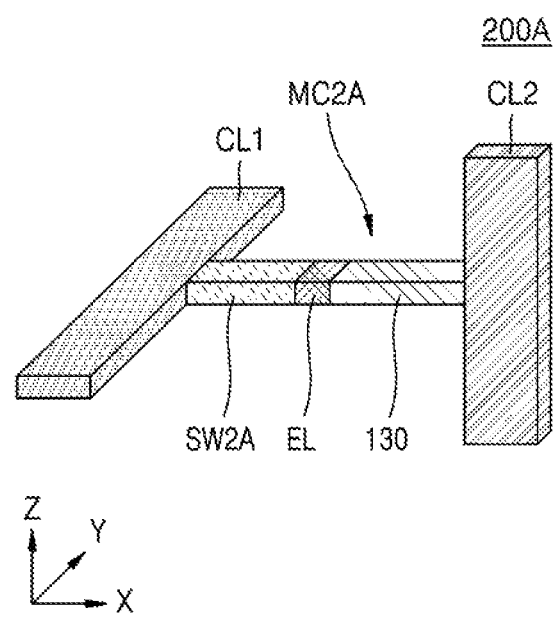
FIGS. 5A and 5B are partial perspective views for explaining a resistive memory device according to other example embodiments, respectively.
Figure 5B:
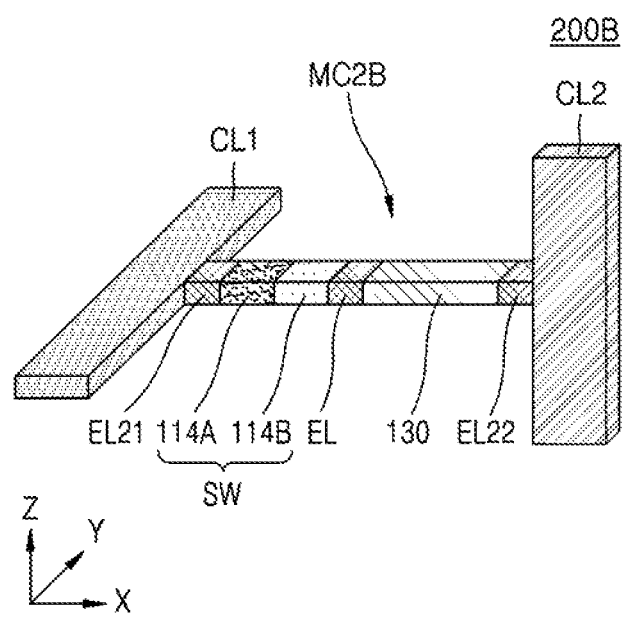

FIGS. 5A and 5B are partial perspective views for explaining resistive memory devices 200A and 200B according to other example embodiments, respectively. The same reference characters and numerals in FIGS. 5A and 5B as those in FIGS. 3 and 4A through 4H denote the same elements, and thus their description will be omitted herein.

Referring to FIG. 5A, the resistive memory device 200A has almost the same structure as that of the resistive memory device 100 described above with reference to FIGS. 3 and 4A through 4H. However, the resistive memory device 200A includes a memory cell MC2A instead of a memory cell MC.

The memory cell MC2A may include a switching element SW2A connected to a first conductive line CL1, a variable resistive element 130 connected to a second conductive line CL2, and an electrode element EL interposed between the switching element SW2A and the variable resistive element 130.

The switching element SW2A may include an amorphous chalcogenide switching material. The switching element SW2A may include a material layer of which resistance may change according to the magnitude of a voltage applied to both ends of the switching element SW2A. For example, the switching element SW2A may include an Ovonic Threshold Switching (OTS) material. The OTS material may include a chalcogenide switching material.

The switching element SW2A may be a single layer or multi-layer including a material selected from binary system materials such as GeSe, GeS, AsSe, AsTe, AsS, SiTe, SiSe, SiS, GeAs, SiAs, SnSe, and SnTe, ternary system materials such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe, four-component system materials such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, five-component system materials such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeالسl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and six-component system materials such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeBi, GeSiAsSeTeP, GeSiAsSeIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

In another implementation, the switching element SW2A may include at least one material selected from the two-component through six-component system materials illustrated as the material used to form the switching element SW2A, and at least one additional element selected from B, C, N, and O.

Referring to FIG. 5B, the resistive memory device 200B has almost the same structure as that of the resistive memory device 100 described above with reference to FIGS. 3 and 4A through 4H. However, the resistive memory device 200B includes a memory cell MC2B instead of a memory cell MC.

The memory cell MC2B may have almost the same structure as that of the memory cell MC of the resistive memory device 100. However, the memory cell MC2B further includes a first electrode element EL21 interposed between the first conductive line CL1 and the switching element SW2A, and a second electrode element EL22 interposed between the second conductive line CL2 and the variable resistive element 130. One of the first electrode element EL21 and the second electrode element EL22 may be omitted. Each of the first electrode element EL21 and the second electrode element EL22 may be formed of W, Ti, Ta, Al, Cu, C, CN, TiN, TiAlN, TiSiN, TiCN, TiCSiN, WN, CoSiN, WSiN, TaN, TaCN, TaSiN, TiO, a combination thereof, etc.

Figure 6A:
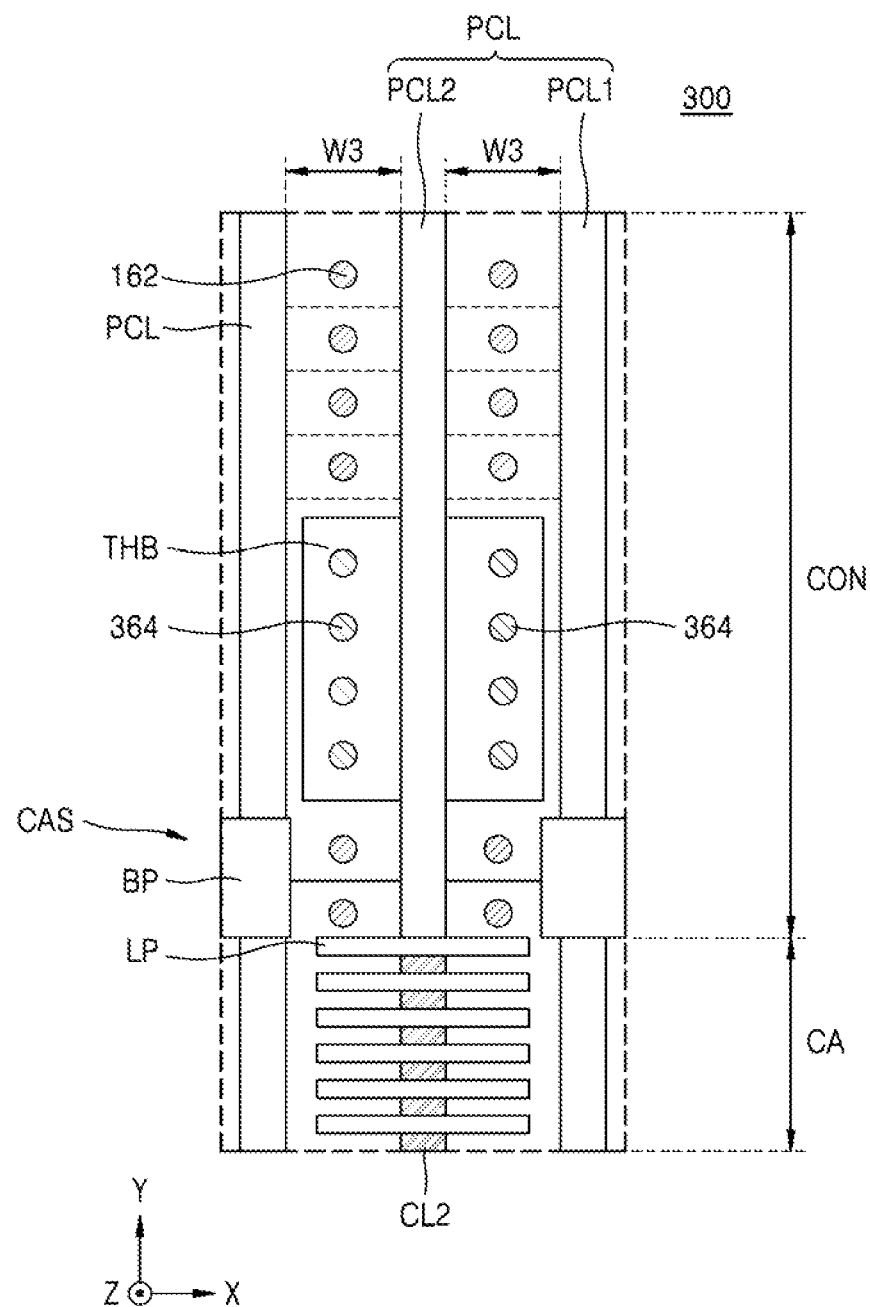
FIGS. 6A and 6B are cross-sectional views for explaining a resistive memory device according to other example embodiments.
Figure 6B:
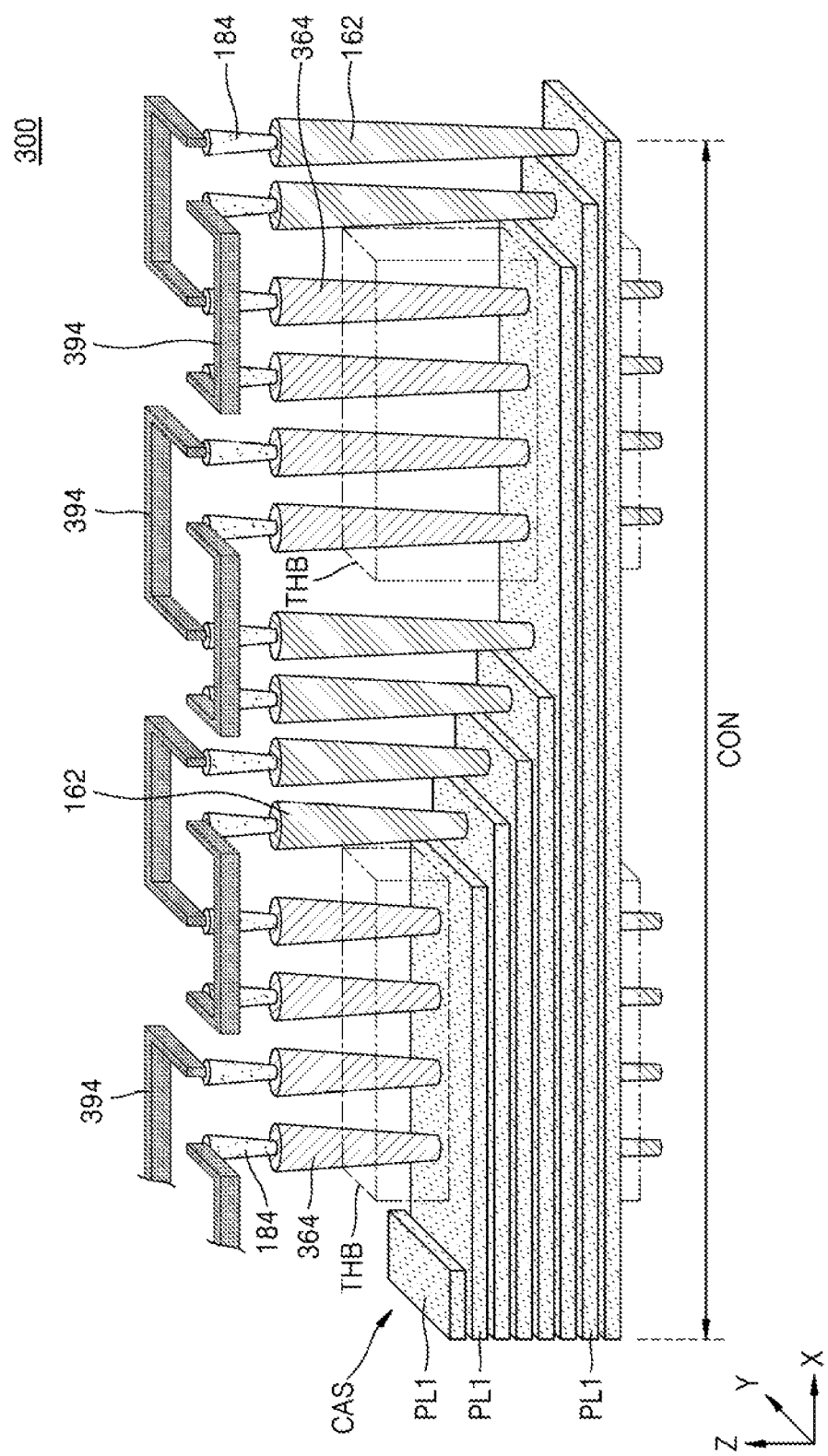

FIGS. 6A and 6B are views for explaining a resistive memory device 300 according to other example embodiments. FIG. 6A is a planar layout of a portion of the local region LA1 of FIG. 3, and FIG. 6B is a partial perspective view of the resistive memory device 300. The same reference characters and numerals in FIGS. 6A and 6B as those in FIGS. 3 and 4A through 4H denote the same elements, and thus their description will be omitted herein.

Referring to FIGS. 6A and 6B, the resistive memory device 300 has almost the same structure as that of the resistive memory device 100 described above with reference to FIGS. 3 and 4A through 4H. However, in the connection region CON of the resistive memory device 300, a separation distance W3 in the first horizontal direction (X direction) between the first pad cut insulation line PCL1 and the second pad cut insulation line PCL2 may be less than in the resistive memory device 100.

A through-hole via electrode region defined by an insulation box THB may be arranged in the connection region CON. In the through-hole via electrode region, a plurality of through-hole via electrodes 364 may penetrate through the insulation box THB in the vertical direction (Z direction) and may be connected to one of the plurality of wiring layers ML60, ML61, and ML62 of FIGS. 4B through 4F included in the peripheral circuit structure PCS.

The plurality of through-hole via electrodes 364 may have almost the same structure as that of the plurality of through-hole via electrodes 164 described above with reference to FIGS. 4A and 4F. However, as viewed in an X-Y plane, the plurality of through-hole via electrodes 364 may be aligned with one another on either side of a second pad cut insulation line PCL2 penetrating through the insulation box THB, in the second horizontal direction (Y direction).

Referring to FIG. 6B, a plurality of peripheral conductive lines 394 may be connected to the peripheral contact plugs 162 or the plurality of through-hole via electrodes 364 via the plurality of contact studs 184. Detailed descriptions of the plurality of through-hole via electrodes 364 and the plurality of peripheral conductive lines 394 are mostly the same as those of the plurality of through-hole via electrodes 164 and the plurality of peripheral conductive lines 194 given above with reference to FIGS. 4A, 4F, and 4H.

Figure 7:
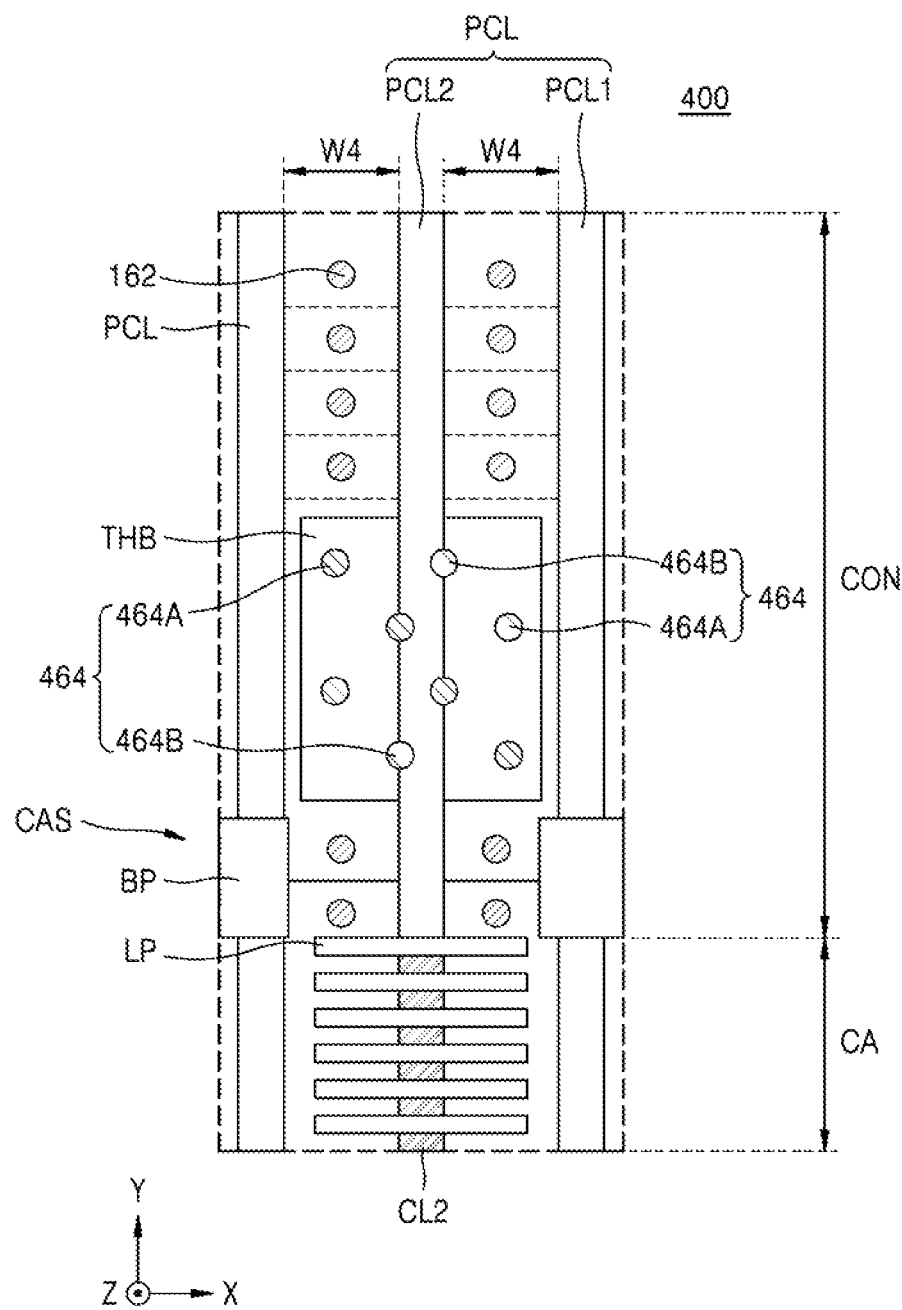
FIG. 7 is a planar layout for explaining a resistive memory device according to other example embodiments.

FIG. 7 is a planar layout for explaining a resistive memory device 400 according to other example embodiments. FIG. 7 illustrates a structure of a portion of the local region LA1 of FIG. 3. The same reference characters and numerals in FIG. 7 as those in FIGS. 3 and 4A through 4H denote the same elements, and thus their description will be omitted herein.

Referring to FIG. 7, the resistive memory device 400 has almost the same structure as that of the resistive memory device 100 described above with reference to FIGS. 3 and 4A through 4H. However, in the connection region CON of the resistive memory device 400, a separation distance W4 in the first horizontal direction (X direction) between the first pad cut insulation line PCL1 and the second pad cut insulation line PCL2 may be less than the resistive memory device 100.

A through-hole via electrode region defined by an insulation box THB may be arranged in the connection region CON. In the through-hole via electrode region, a plurality of through-hole via electrodes 464 may penetrate through the insulation box THB in the vertical direction (Z direction) and may be connected to one of the plurality of wiring layers ML60, ML61, and ML62 of FIGS. 4B through 4F included in the peripheral circuit structure PCS.

The plurality of through-hole via electrodes 464 may have almost the same structure as that of the plurality of through-hole via electrodes 164 described above with reference to FIGS. 4A and 4F. However, the plurality of through-hole via electrodes 464 may include a plurality of first through-hole via electrodes 464A penetrating through the insulation box THB in the vertical direction (Z direction), and a plurality of second through-hole via electrodes 464B penetrating through the second pad cut insulation line PCL2 in the vertical direction (Z direction). Some sidewalls of the plurality of second through-hole via electrodes 464B contact the insulation box THB, and the other sidewalls of the plurality of second through-hole via electrodes 464B may contact the second pad cut insulation line PCL2. Detailed descriptions of the plurality of through-hole via electrodes 464 are mostly the same as those of the plurality of through-hole via electrodes 164 given above with reference to FIGS. 4A, 4F, and 4H.

Figure 8:
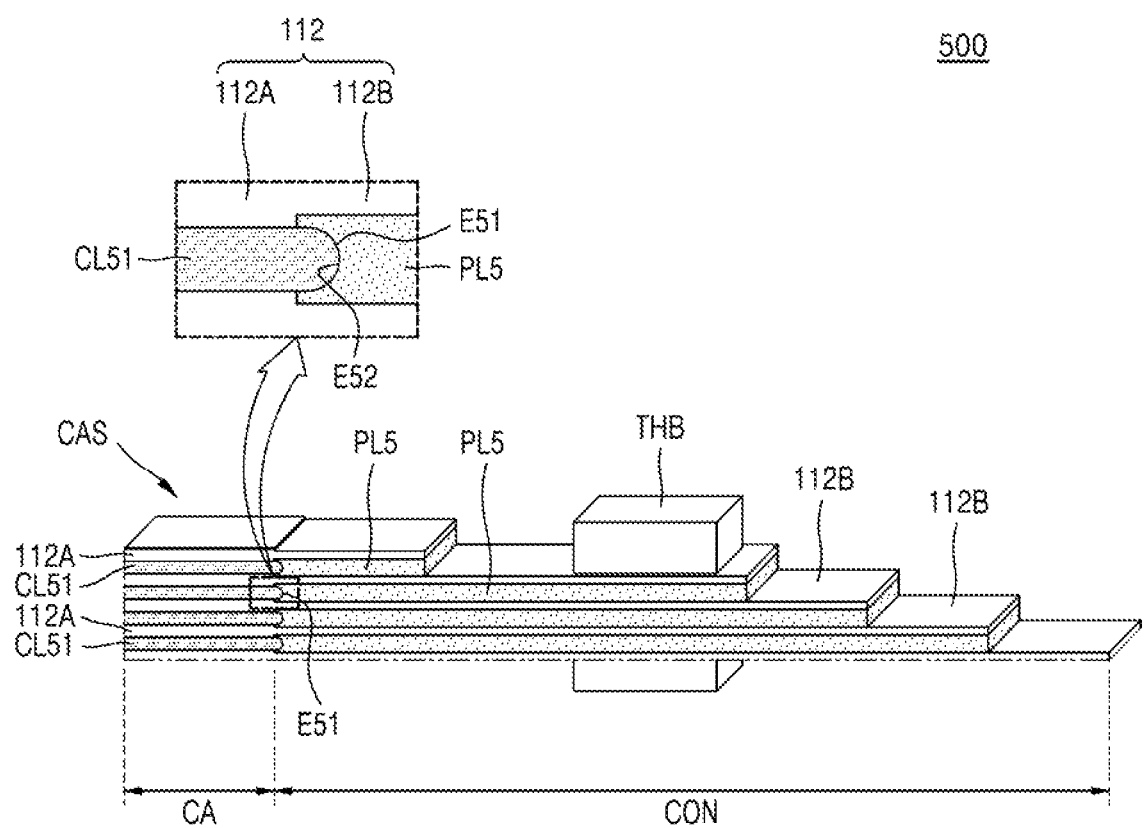
FIG. 8 is a partial perspective view for schematically explaining a resistive memory device according to other example embodiments.
Figure 9:
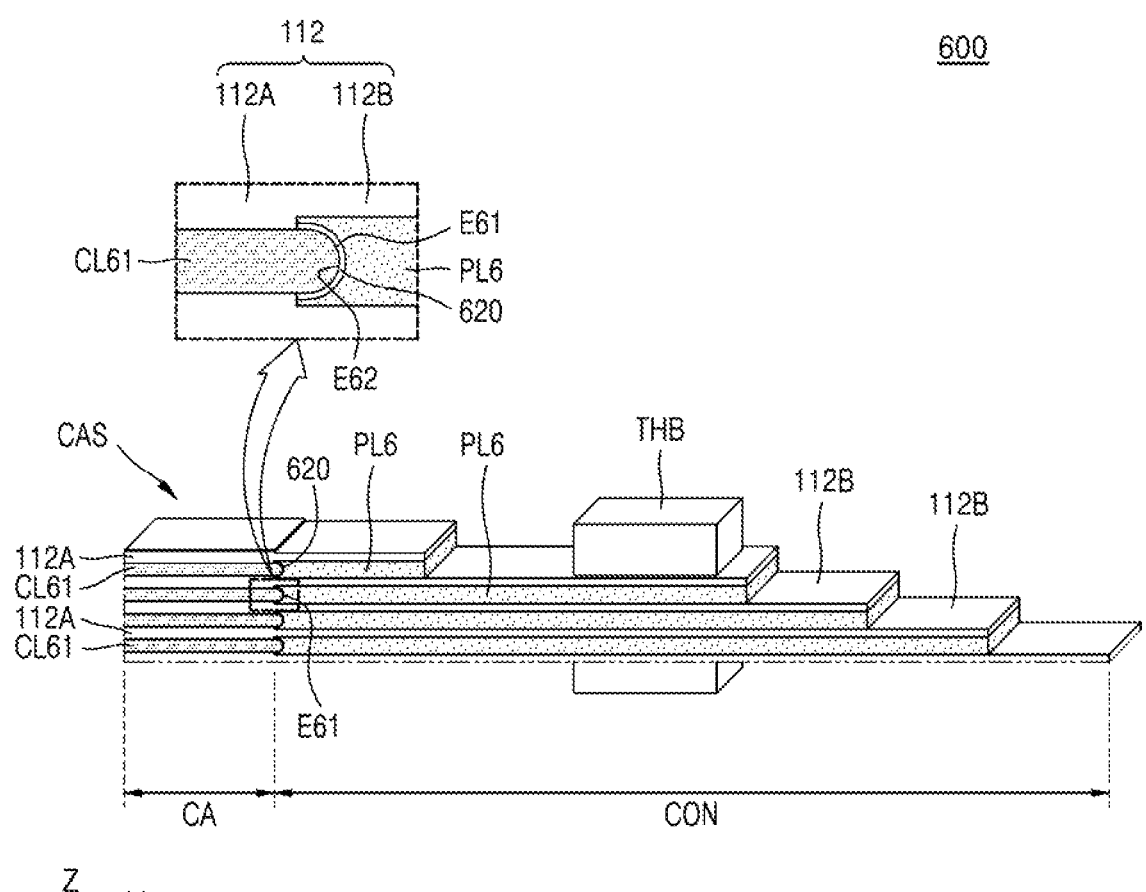
FIG. 9 is a partial perspective view for schematically explaining a resistive memory device according to other example embodiments.
Figure 10:
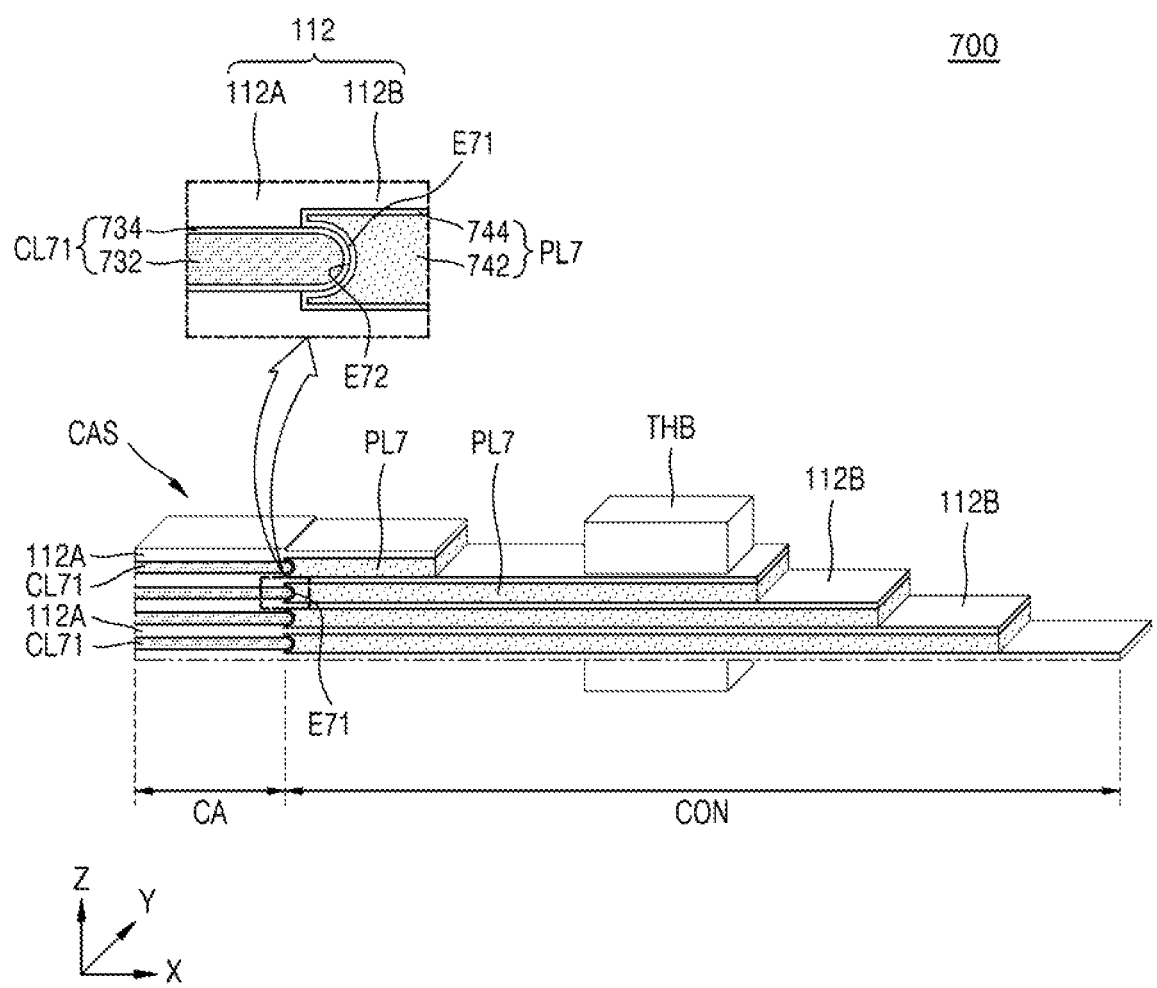
FIG. 10 is a partial perspective view for schematically explaining a resistive memory device according to other example embodiments.

FIGS. 8 through 10 are partial perspective views for explaining resistive memory devices 500, 600, and 700 according to other example embodiments, respectively. The same reference characters and numerals in FIGS. 8 through 10 as those in FIGS. 3 and 4A through 4H denote the same elements, and thus their description will be omitted herein.

Referring to FIG. 8, the resistive memory device 500 has almost the same structure as that of the resistive memory device 100 described above with reference to FIGS. 3 and 4A through 4H. However, the resistive memory device 500 includes a plurality of first conductive lines CL51 arranged in a cell array region CA, and a plurality of conductive pads PL5 arranged in a connection region CON.

The plurality of first conductive lines CL51 and the plurality of conductive pads PL5 may have almost the same structures as the plurality of first conductive lines CL1 and the plurality of conductive pads PL1 described above with reference to FIGS. 4A through 4H. However, each of the plurality of first conductive lines CL51 may have a first end E51 that is convex toward a conductive pad PL5, at a boundary between the cell array region CA and the connection region CON, and each of the plurality of conductive pads PL5 may have a second end E52 that surrounds the first end E51 and is concave toward the first end E51, at the boundary between the cell array region CA and the connection region CON. The first end E51 and the second end E52 may contact each other at the boundary between the cell array region CA and the connection region CON.

Referring to FIG. 9, the resistive memory device 600 has almost the same structure as that of the resistive memory device 100 described above with reference to FIGS. 3 and 4A through 4H. However, the resistive memory device 600 includes a plurality of first conductive lines CL61 arranged in a cell array region CA, and a plurality of conductive pads PL6 arranged in a connection region CON.

The plurality of first conductive lines CL61 and the plurality of conductive pads PL6 may have almost the same structures as the plurality of first conductive lines CL1 and the plurality of conductive pads PL1 described above with reference to FIGS. 4A through 4H. However, each of the plurality of first conductive lines CL61 may have a first end E61 that is convex toward a conductive pad PL6, at a boundary between the cell array region CA and the connection region CON, and each of the plurality of conductive pads PL6 may have a second end E62 that surrounds the first end E61 and is concave toward the first end E61, at the boundary between the cell array region CA and the connection region CON. The first end E61 and the second end E62 may face each other at the boundary between the cell array region CA and the connection region CON, and an oxide layer 620 may be interposed between the first end E61 and the second end E62. A thickness of the oxide layer 620 in the second horizontal direction (Y direction) may be sufficiently small enough to not disturb an electrical connection between the first conductive line CL61 and the conductive pad PL6. The oxide layer 620 may be a metal oxide layer including a metal included in the first conductive line CL61. The oxide layer 620 may be a natural oxide layer formed due to exposure of the first end E61 to the air during the manufacture of the resistive memory device 600.

Referring to FIG. 10, the resistive memory device 700 has almost the same structure as that of the resistive memory device 100 described above with reference to FIGS. 3 and 4A through 4H. However, the resistive memory device 700 includes a plurality of first conductive lines CL71 arranged in a cell array region CA, and a plurality of conductive pads PL7 arranged in a connection region CON.

The plurality of first conductive lines CL71 and the plurality of conductive pads PL7 may have almost the same structures as the plurality of first conductive lines CL1 and the plurality of conductive pads PL1 described above with reference to FIGS. 4A through 4H. However, each of the plurality of first conductive lines CL71 may have a first end E71 that is convex toward a conductive pad PL7, at a boundary between the cell array region CA and the connection region CON, and each of the plurality of conductive pads PL7 may have a second end E72 that surrounds the first end E71 and is concave toward the first end E71, at the boundary between the cell array region CA and the connection region CON. The first end E71 and the second end E72 may face each other at the boundary between the cell array region CA and the connection region CON.

Each of the plurality of first conductive lines CL71 may include a first metal layer 732, and a first conductive barrier layer 734 surrounding the first metal layer 732. Each of the plurality of conductive pads PL7 may include a second metal layer 742, and a second conductive barrier layer 744 surrounding the second metal layer 742. The first conductive barrier layers 734 and the second conductive barrier layers 744 may face each other at interfaces between the plurality of first conductive lines CL71 and the plurality of conductive pads PL7. According to embodiments, each of the first metal layer 732 and the second metal layer 742 may include W, Al, Cu, Co, Au, Ag, Ir, Pt, Pd, Ru, Zr, Rh, Ni, Cr, Sn, Zn, an alloy of each of theses materials, a combination thereof, etc. The first conductive barrier layer 734 and the second conductive barrier layer 744 may be formed of TiN, TaN, a combination thereof, etc.

In another implementation, an oxide layer similar to the oxide layer 620 described above with reference to FIG. 9 may be interposed between the first conductive barrier layer 734 and the second conductive barrier layer 744 at the interface between each of the plurality of first conductive lines CL71 and each of the plurality of conductive pads PL7.

Each of the resistive memory devices 200A, 200B, 300, 400, 500, 600, and 700 described above with reference to FIGS. 5A through 10 includes, in the connection region CON, an insulation box THB that penetrates through each of the plurality of conductive pads PL1, PL5, PL6, and PL7 and the plurality of second isolation insulation layers 112B in the vertical direction (Z direction) and extends in the vertical direction (Z direction). During the manufacture of the resistive memory devices 200A, 200B, 300, 400, 500, 600, and 700, the insulation box THB supports the plurality of second isolation insulation layers 112B to thereby prevent unwanted sagging, deformation, or the like of the plurality of second isolation insulation layers 112B. Because a thickness of each of the plurality of conductive pads PL1, PL5, PL6, and PL7 arranged in the connection regions CON of the resistive memory devices 200A, 200B, 300, 400, 500, 600, and 700 is greater than that of each of the plurality of first conductive lines CL1, CL51, CL61, and CL71 arranged in the cell array regions CA thereof, when an etch process for forming a plurality of contact holes for exposing respective upper surfaces of the plurality of conductive pads PL1, PL5, PL6, and PL7 is performed to form the plurality of peripheral contact plugs 162, unwanted exposure of other conductive pads located lower than target conductive pads PL1, PL5, PL6, and PL7 through the contact holes may be prevented. Accordingly, occurrence of a process defect may be minimized during the manufacture of the resistive memory devices 200A, 200B, 300, 400, 500, 600, and 700, and a stable electrical connection between the plurality of memory cells MC, MC2A, and MC2B and other neighboring circuits may be provided.

A method of manufacturing resistive memory devices according to an example embodiment will now be described.

Figure 11A:
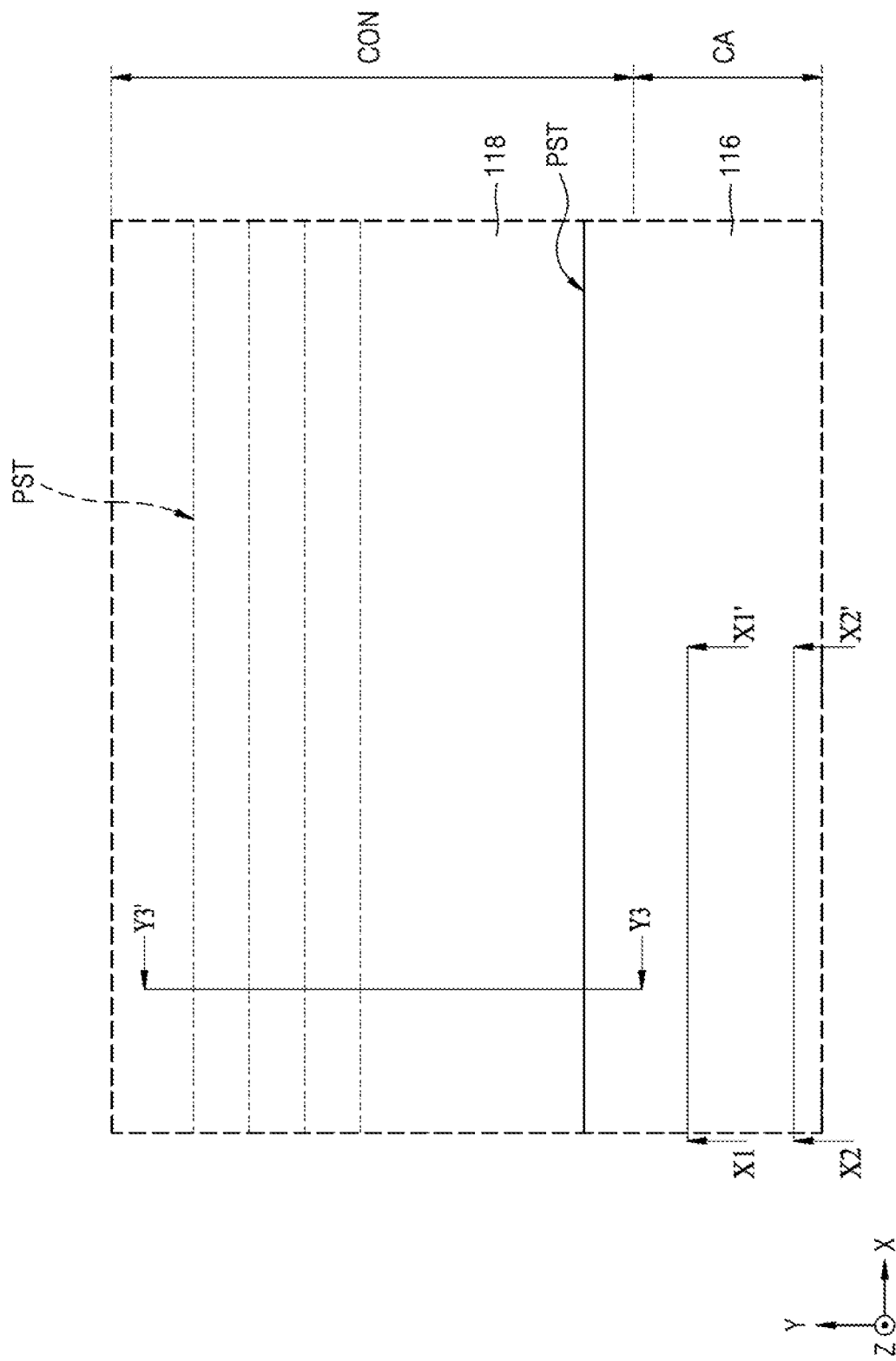
Figure 11B:
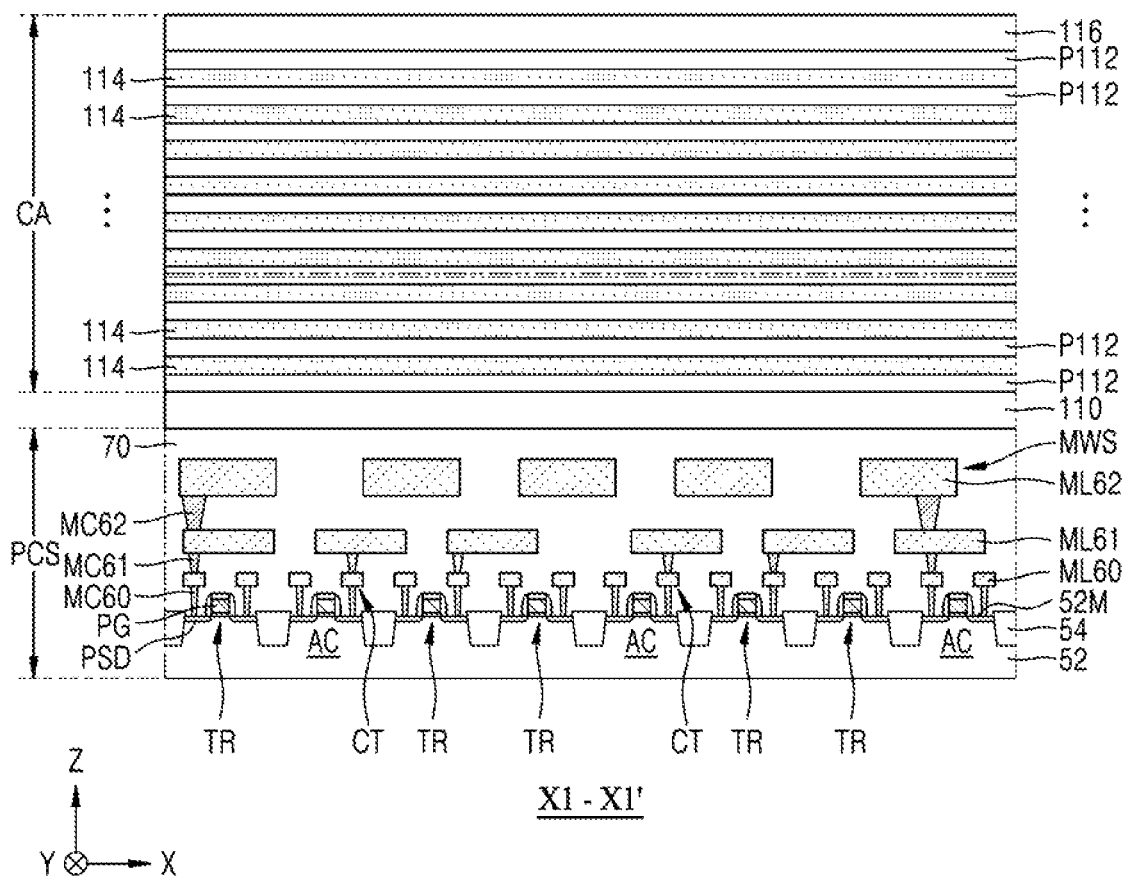
Figure 11C:
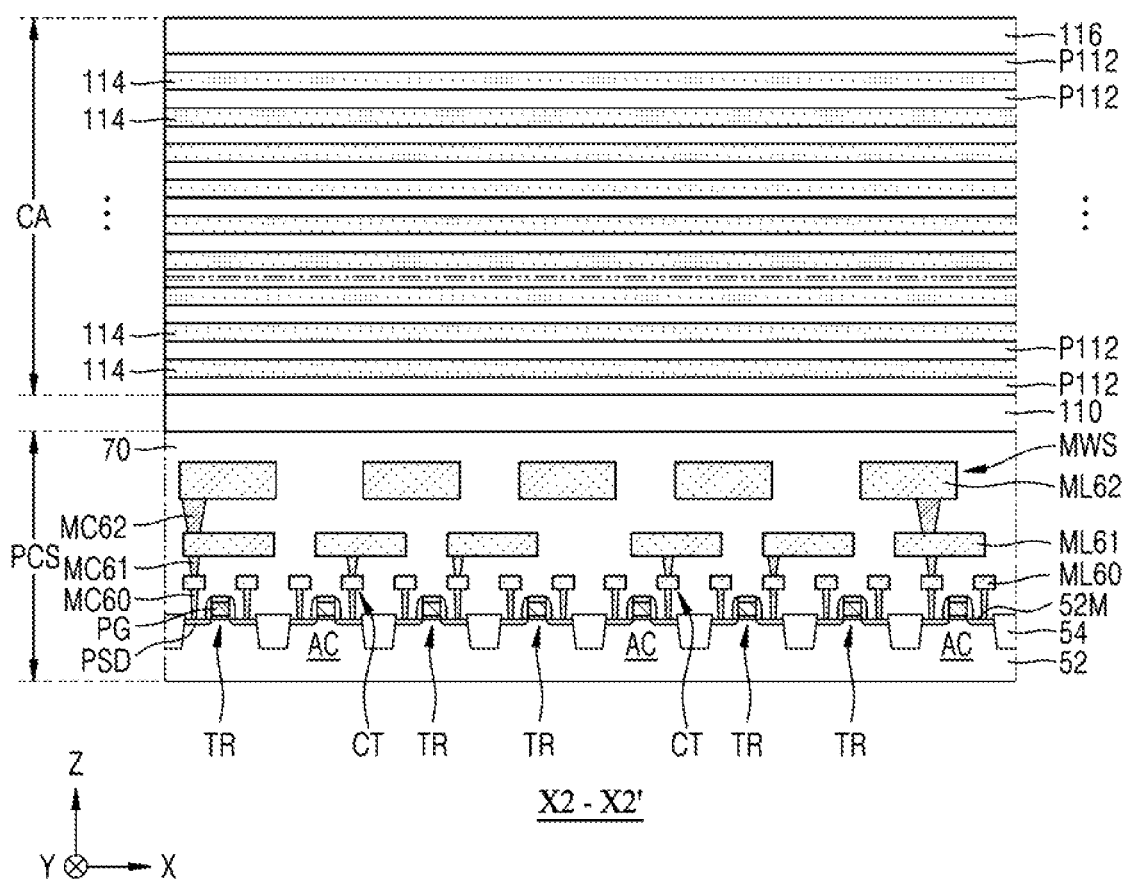
FIG. 11C, FIG. 12C, FIG. 13C, FIG. 14B, and FIG. 15C are cross-sectional views of the local region LA1 along line X2-X2' of FIG. 4A according to a process sequence of the method.
Figure 11D:
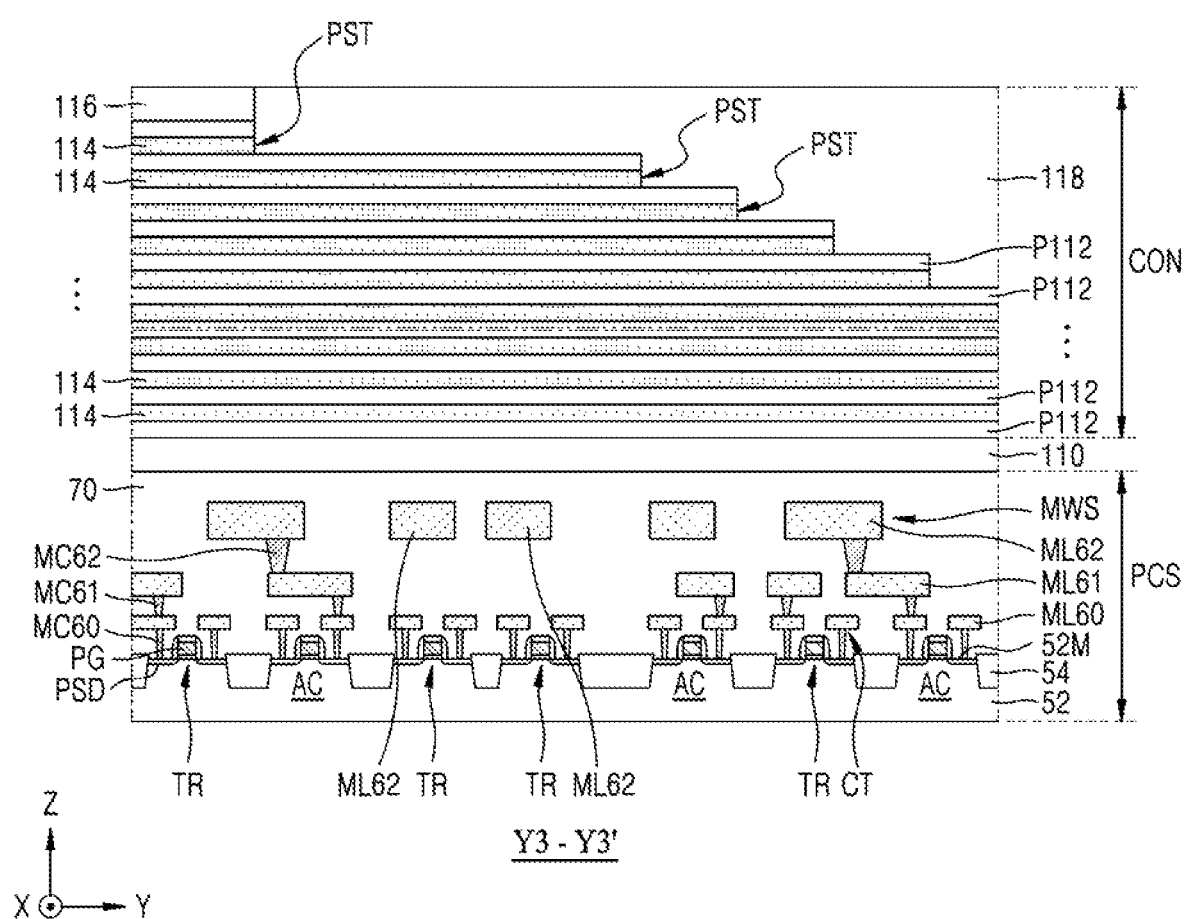
FIG. 11D and FIG. 12D are cross-sectional views of the local region LA1 along line Y3-Y3' of FIG. 4A according to a process sequence of the method.
Figure 20A:
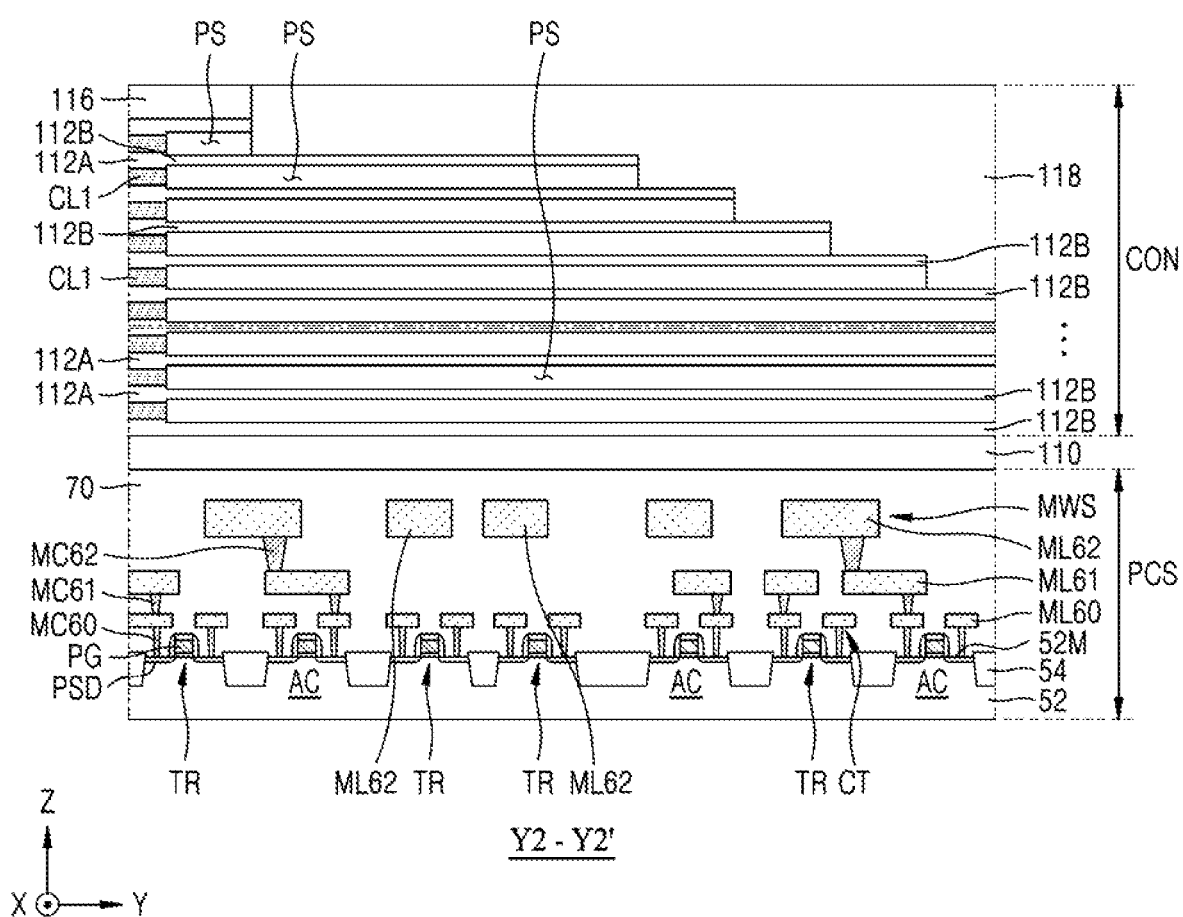
Figure 20B:
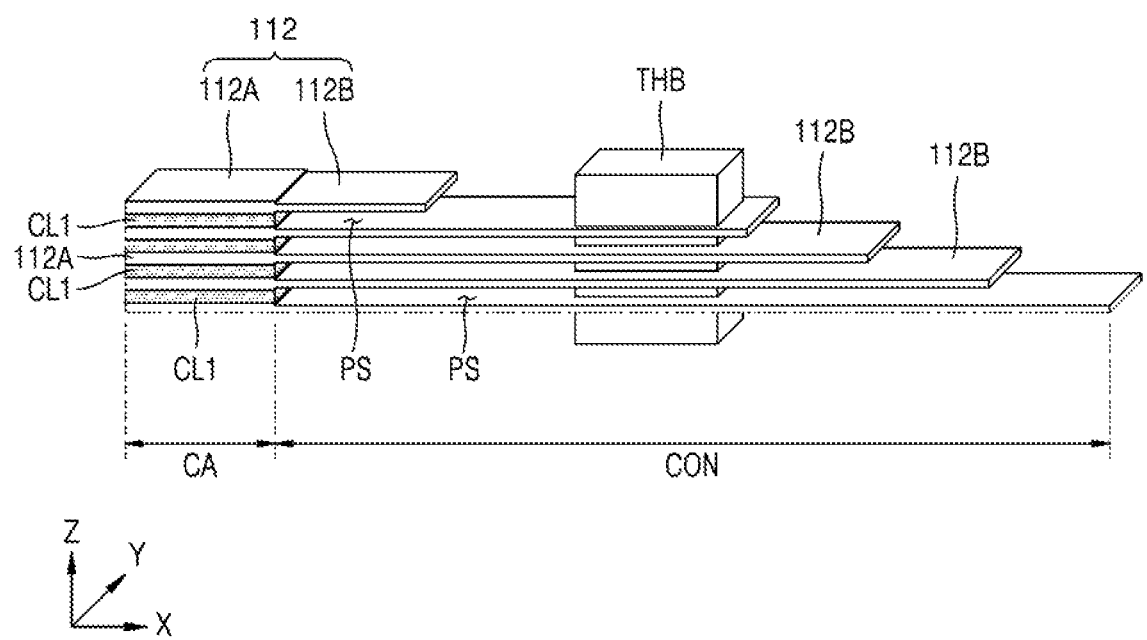
FIG. 20B is a partial perspective view of a partial region of FIG. 20A.
Figure 21A:
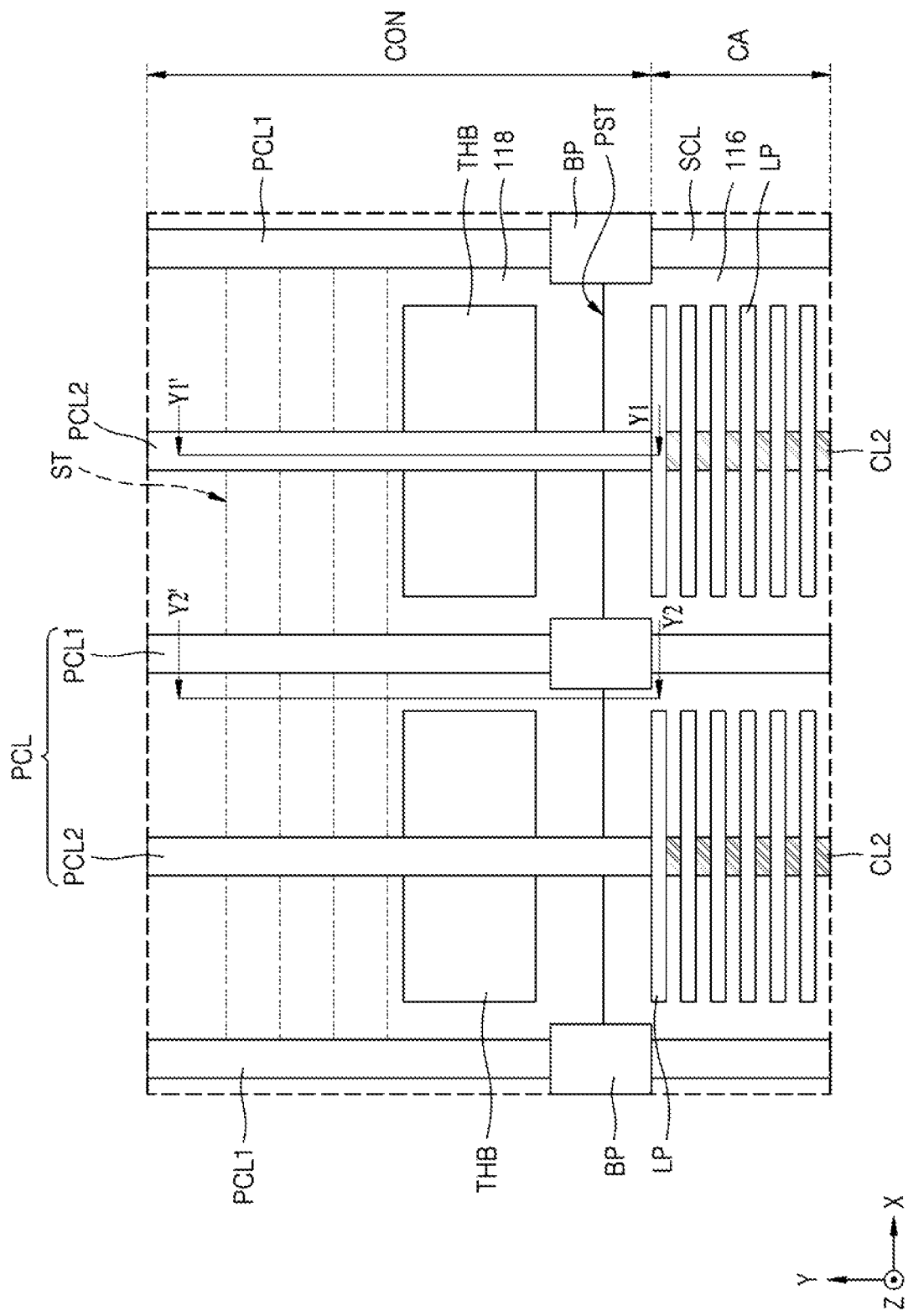
Figure 21B:
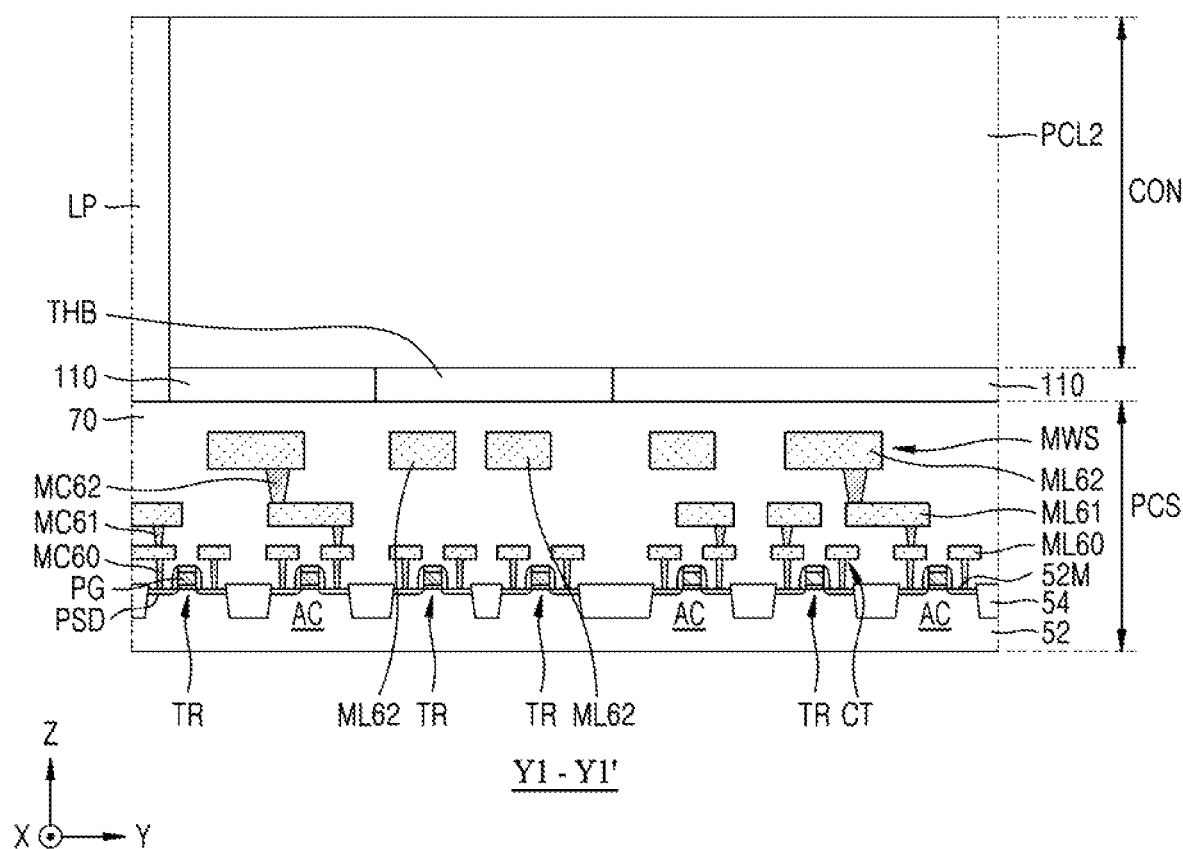
Figure 21C:
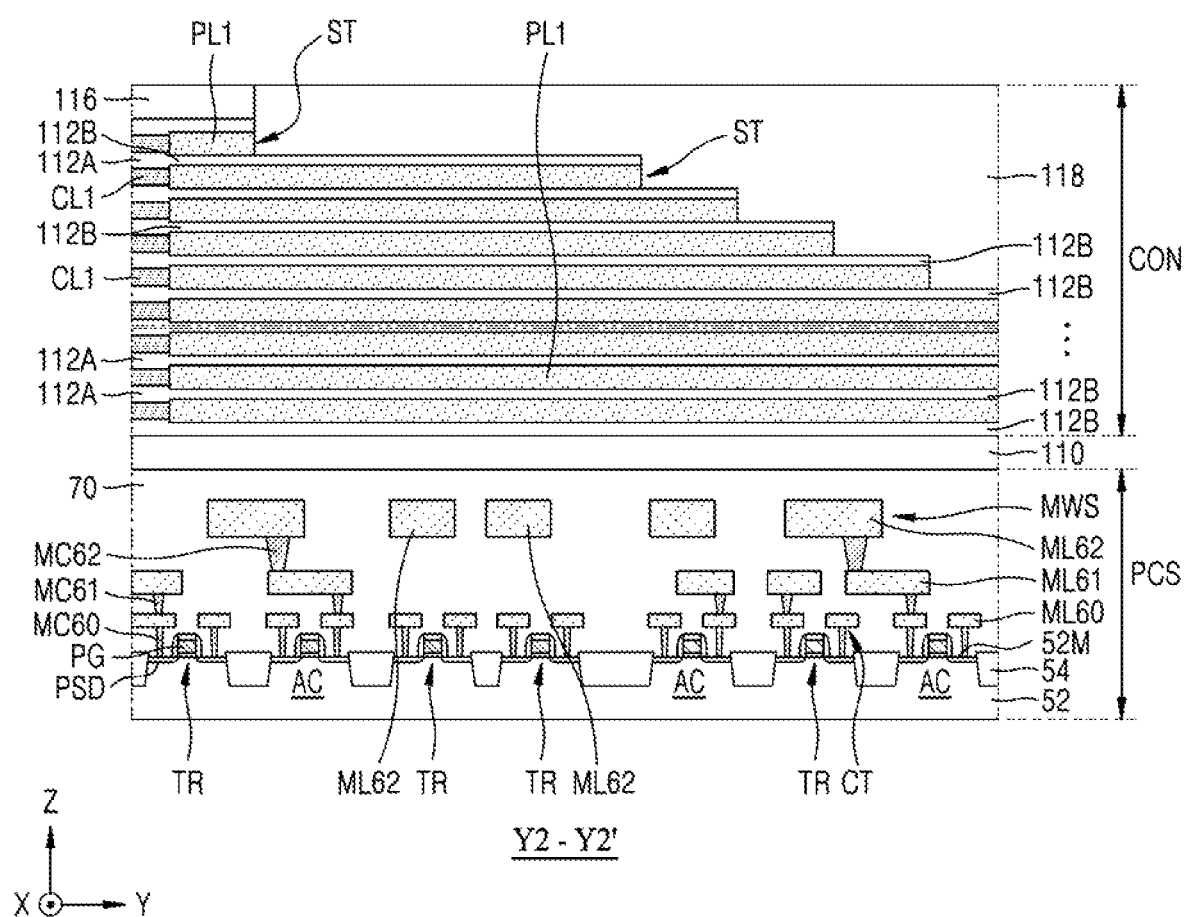
Figure 21D:
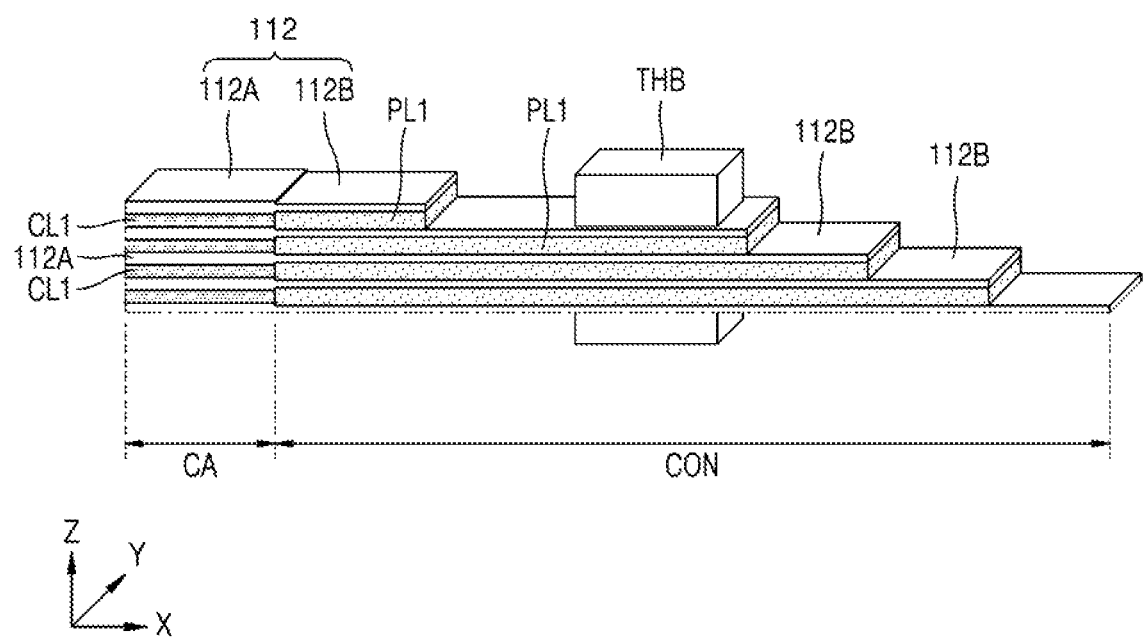

FIGS. 11A through 21D are cross-sectional views for explaining a method of manufacturing a semiconductor device according to an example embodiment. In particular, FIG. 11A, FIG. 12A, FIG. 13A, FIG. 15A, FIG. 16A, FIG. 18A, FIG. 19A, and FIG. 21A are planar layouts of the local region LA1 of FIG. 3 according to a process sequence of the method. FIG. 11B, FIG. 12B, FIG. 13B, FIG. 14A, FIG. 15B, FIG. 16B, FIG. 17, and FIG. 18B are cross-sectional views of the local region LA1 along line X1-X1' of FIG. 4A according to a process sequence of the method. FIG. 11C, FIG. 12C, FIG. 13C, FIG. 14B, and FIG. 15C are cross-sectional views of the local region LA1 along line X2-X2' of FIG. 4A according to a process sequence of the method. FIG. 11D and FIG. 12D are cross-sectional views of the local region LA1 along line Y3-Y3' of FIG. 4A according to a process sequence of the method. FIG. 19B and FIG. 21B are cross-sectional views of the local region LA1 along line Y1-Y1' of FIG. 4A according to a process sequence of the method. FIG. 19C, FIG. 20A, and FIG. 21C are cross-sectional views of the local region LA1 along line Y2-Y2' of FIG. 4A according to a process sequence of the method. FIG. 20B is a partial perspective view of a partial region of FIG. 20A. FIG. 20D is a partial perspective view of a partial region of FIG. 21C. A method of manufacturing the resistive memory device 100 of FIGS. 3 and 4A through 4H will be described with reference to FIGS. 11A through 21D. The same reference characters and numerals in FIGS. 11A through 21D as those in FIGS. 3 and 4A through 4H denote the same elements, and thus their description will be omitted herein.

Referring to FIGS. 11A through 11D, the peripheral circuit structure PCS including the substrate 52, the plurality of transistors TR, the multi-layered wiring structure MWS, and the interlayer insulation layer 70 may be formed.

The support insulation layer 110 may be formed on the interlayer insulation layer 70 of the peripheral circuit structure PCS, a plurality of insulation layers P112 and a plurality of sacrificial layers 114 may be stacked on the support insulation layer 110 to alternate with each other one by one within the cell array region CA and the connection region CON, and the upper insulation layer 116 may be formed to cover an uppermost insulation layer P112 from among the plurality of insulation layers P112. The plurality of sacrificial layers 114 may be formed of polysilicon layers doped with an N-type dopant or a P-type dopant, the plurality of insulation layers P112 may be formed of silicon oxide layers, and the support insulation layer 110 and the upper insulation layer 116 may be formed of silicon nitride layers.

Referring to FIG. 11D, the upper insulation layer 116, the plurality of insulation layers P112, and the plurality of sacrificial layers 114 may be sequentially etched in the connection region CON, and thus a structure having a plurality of preliminary steps PST may be formed. The filling insulation layer 118 covering the structure may be formed. The filling insulation layer 118 may be formed to have a flat upper surface, and the flat upper surface of the filling insulation layer 118 and the upper insulation layer 116 may each extend flatly at the same vertical level.

Referring to FIGS. 12A through 12D, the plurality of buried insulation patterns LP may be formed on a resultant structure of FIGS. 11A through 11D within the cell array region CA, the plurality of insulation boxes THB may be formed within the connection region CON, and the plurality of blocking insulation patterns BP may be formed at the boundary between the cell array region CA and the connection region CON. The plurality of buried insulation patterns LP, the plurality of insulation boxes THB, and the plurality of blocking insulation patterns BP may be formed simultaneously.

To form the plurality of buried insulation patterns LP, the plurality of insulation boxes THB, and the plurality of blocking insulation patterns BP, a plurality of spaces may be formed by partially etching the upper insulation layer 116, the filling insulation layer 118, the plurality of insulation layers P112, the plurality of sacrificial layers 114, and the support insulation layer 110, and an insulation layer may be formed to fill the plurality of spaces. The insulation layer may be formed of a silicon oxide layer.

Figure 12A:
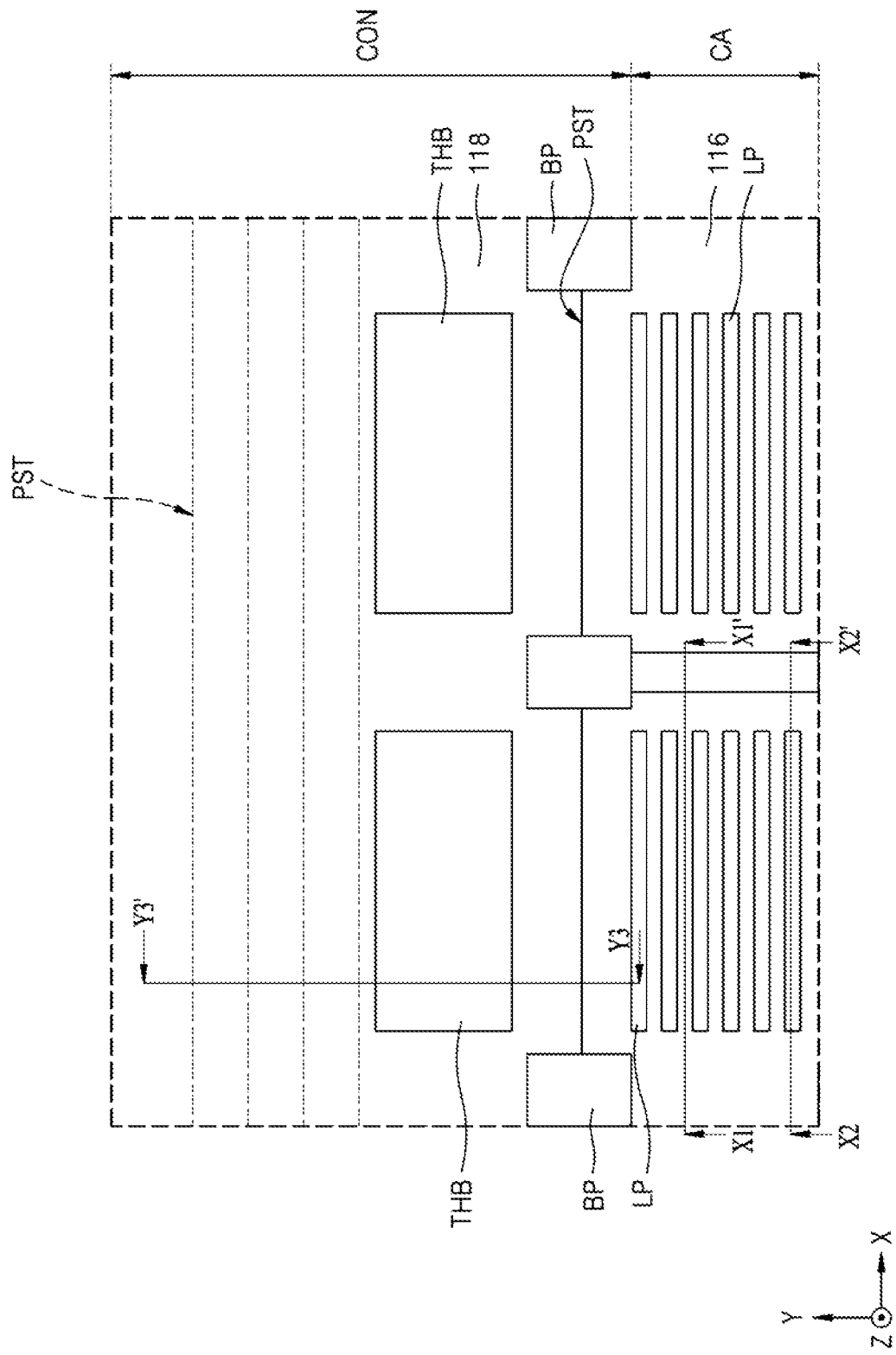
Figure 12B:
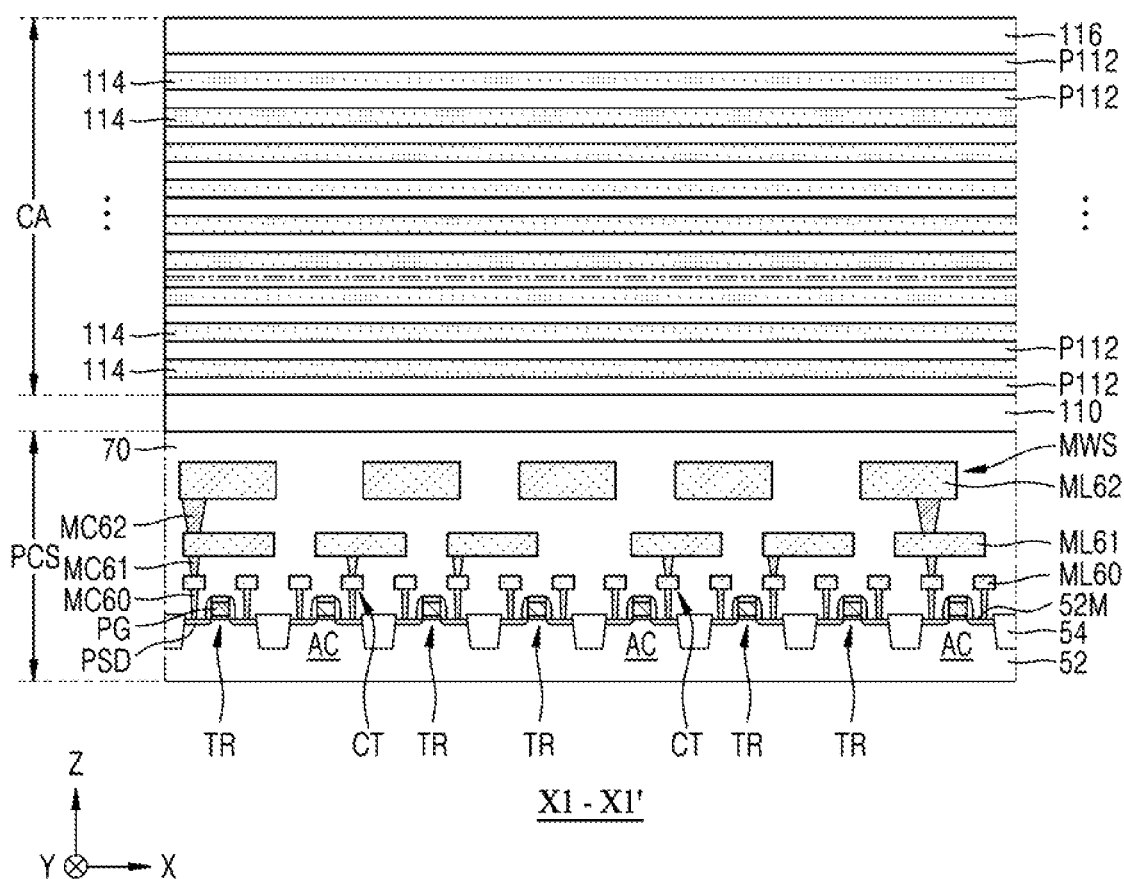
Figure 12C:
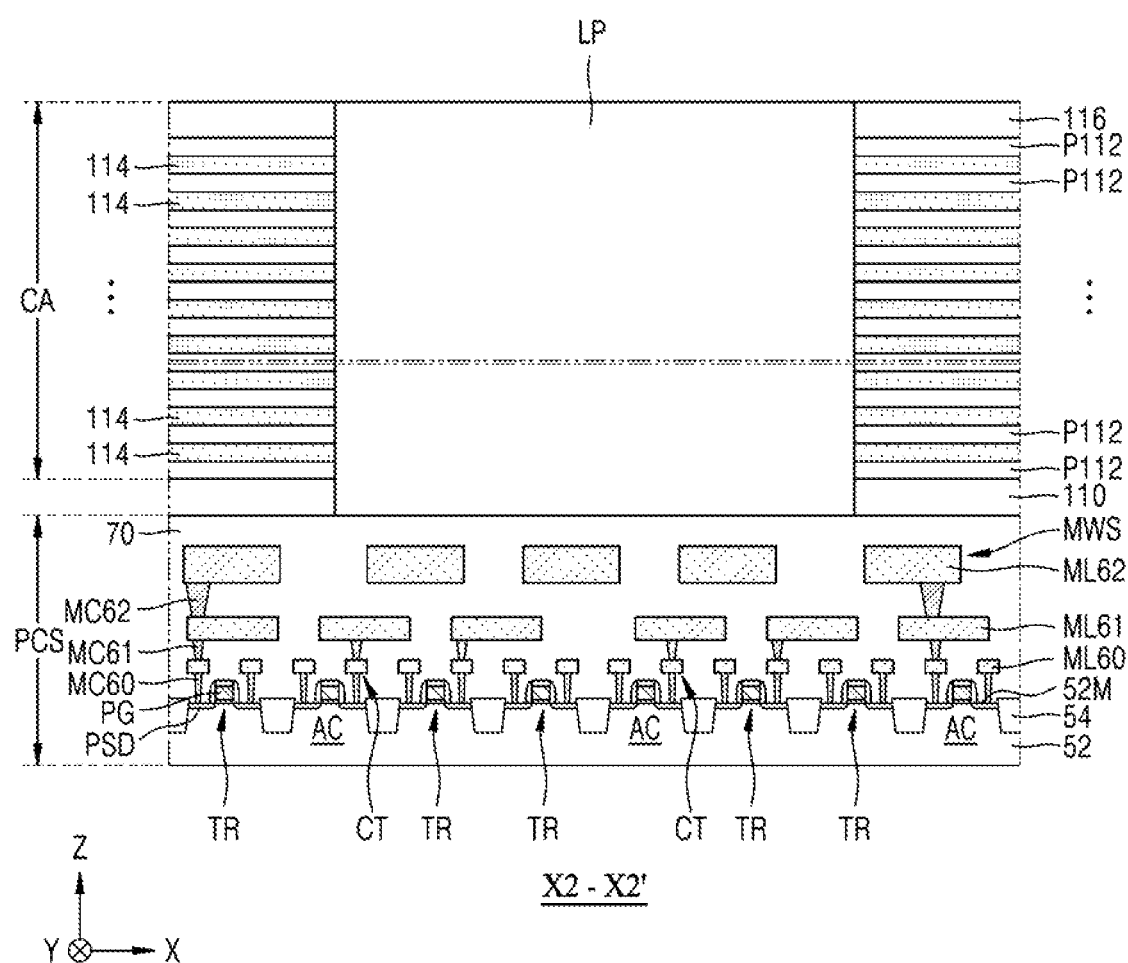
Figure 12D:
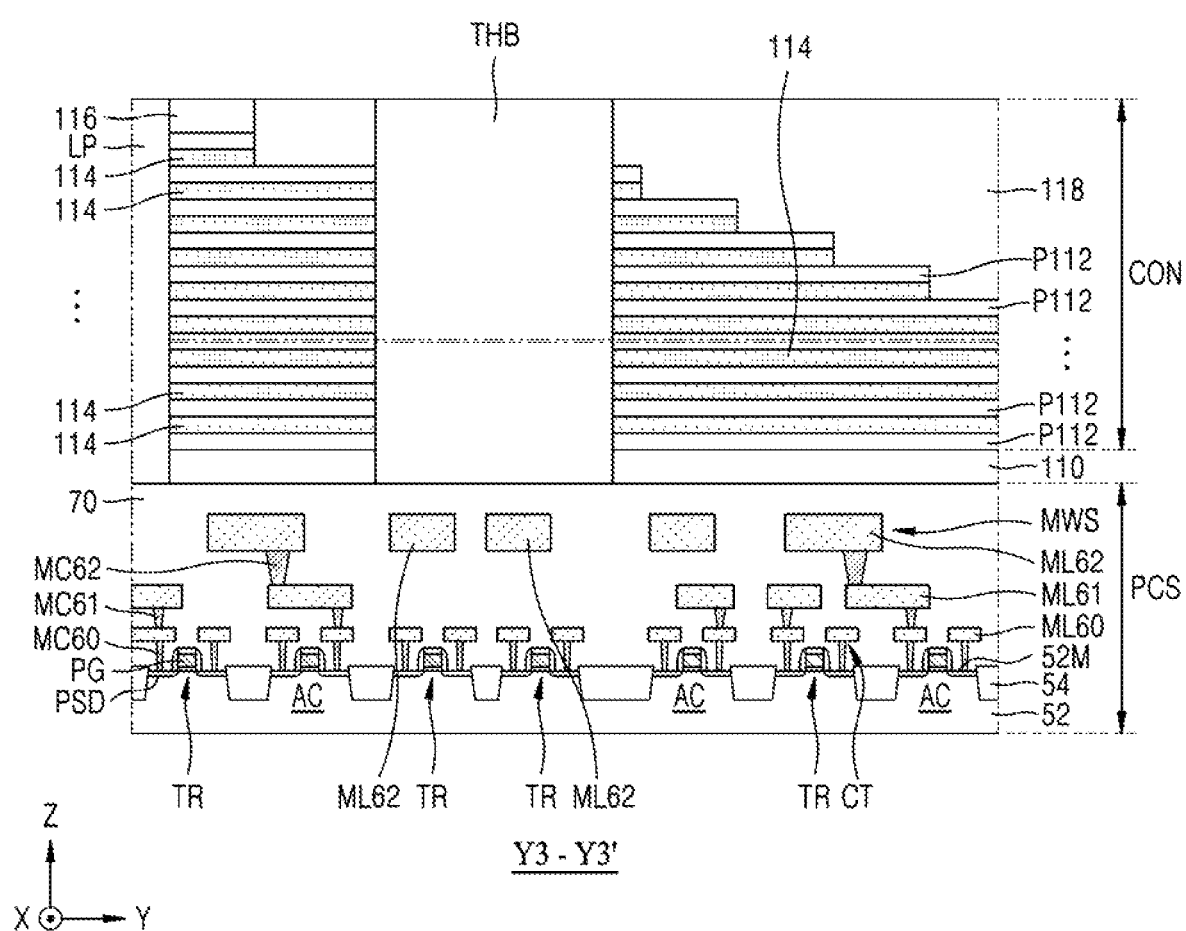

Although FIGS. 12C and 12D illustrate a case where the buried insulation pattern LP and the insulation box THB penetrate through the support insulation layer 110, the buried insulation pattern LP and the insulation box THB may be formed to contact an upper surface of the support insulation layer 110, without penetrating through the support insulation layer 110.

While the plurality of buried insulation patterns LP, the plurality of insulation boxes THB, and the plurality of blocking insulation patterns BP are being formed, the isolation structure INS of FIG. 3 may be formed.

Figure 13A:
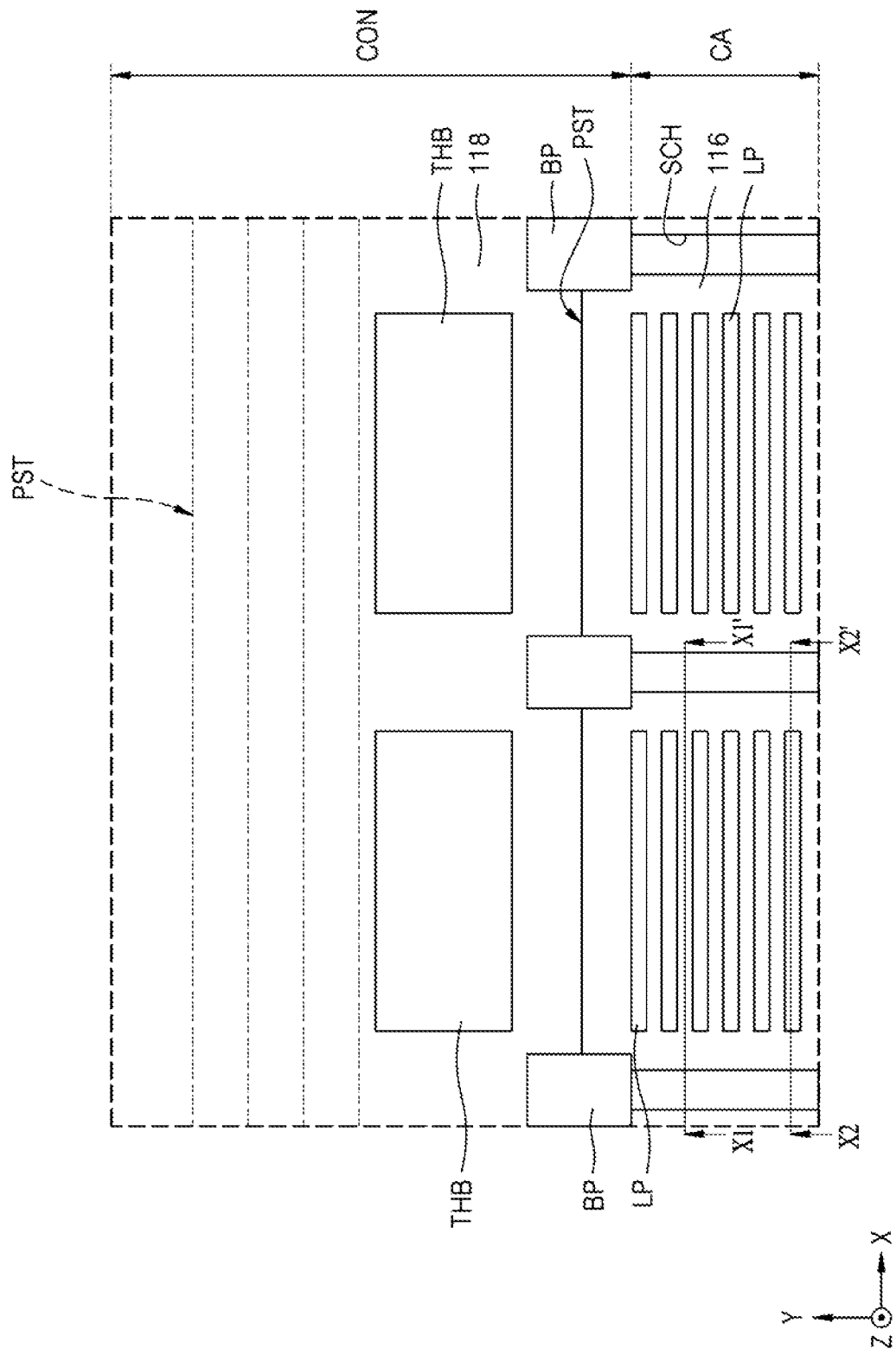
Figure 13B:
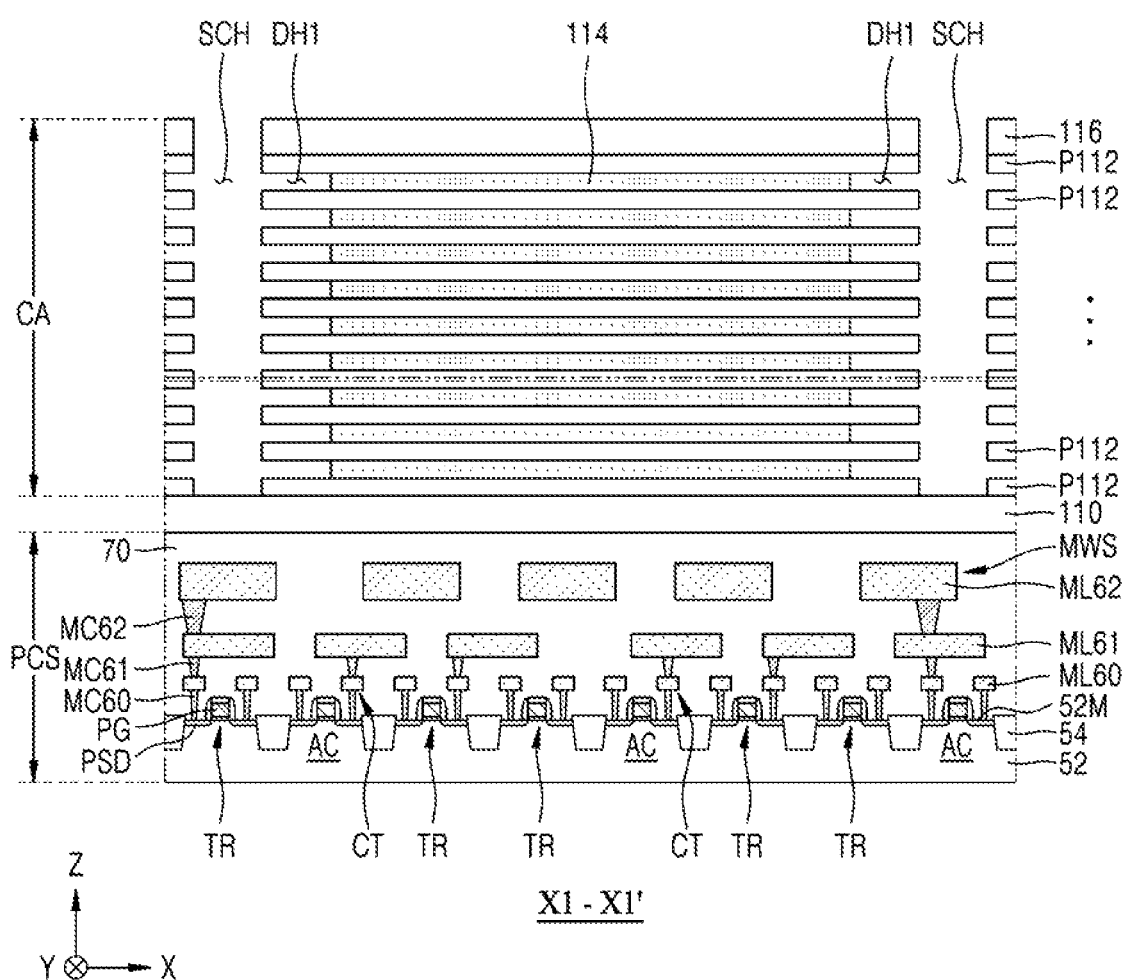
Figure 13C:
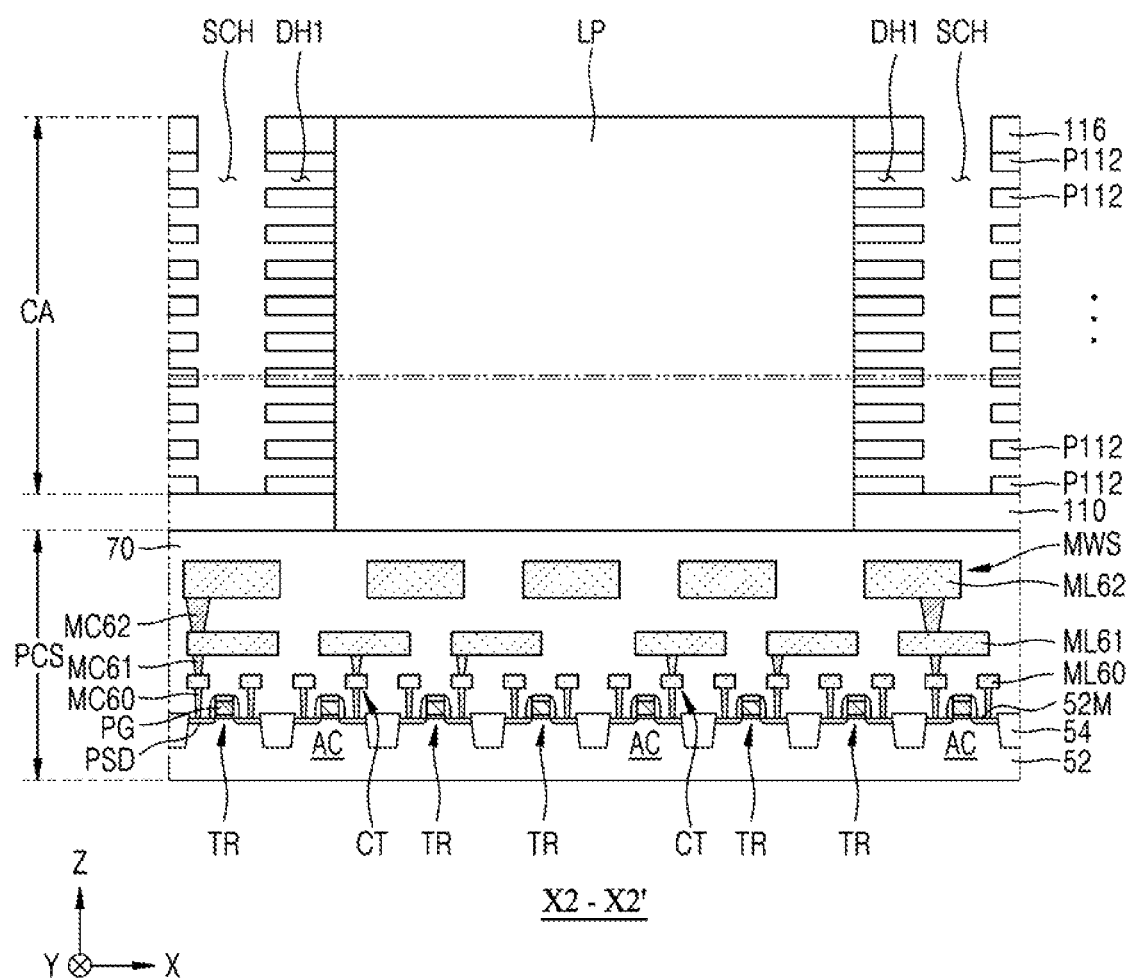

Referring to FIGS. 13A through 13C, a plurality of cell stack cut holes SCH may be formed on the support insulation layer 110 by etching the upper insulation layer 116, the plurality of insulation layers P112, and the plurality of sacrificial layers 114 from a resultant structure of FIGS. 12A through 12D. A plurality of first indent holes DH1 connected to the plurality of cell stack cut holes SCH may be formed by removing respective portions of the plurality of sacrificial layers 114 exposed through respective inner sidewalls of the plurality of cell stack cut holes SCH. Referring to FIGS. 13B and 13C, sidewalls of the plurality of sacrificial layers 114 and a sidewall of the buried insulation pattern LP may be exposed through the plurality of first indent holes DH1.

Figure 14A:
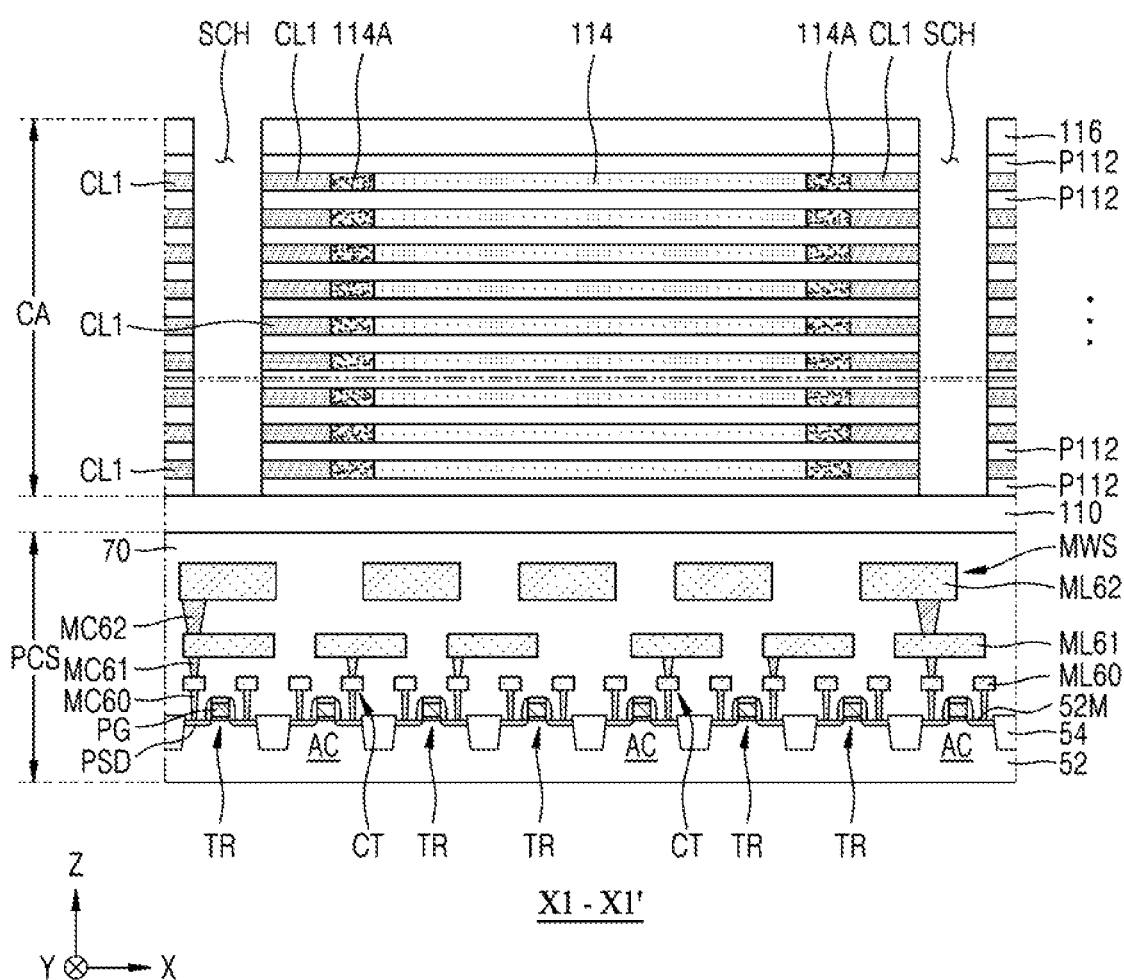
Figure 14B:
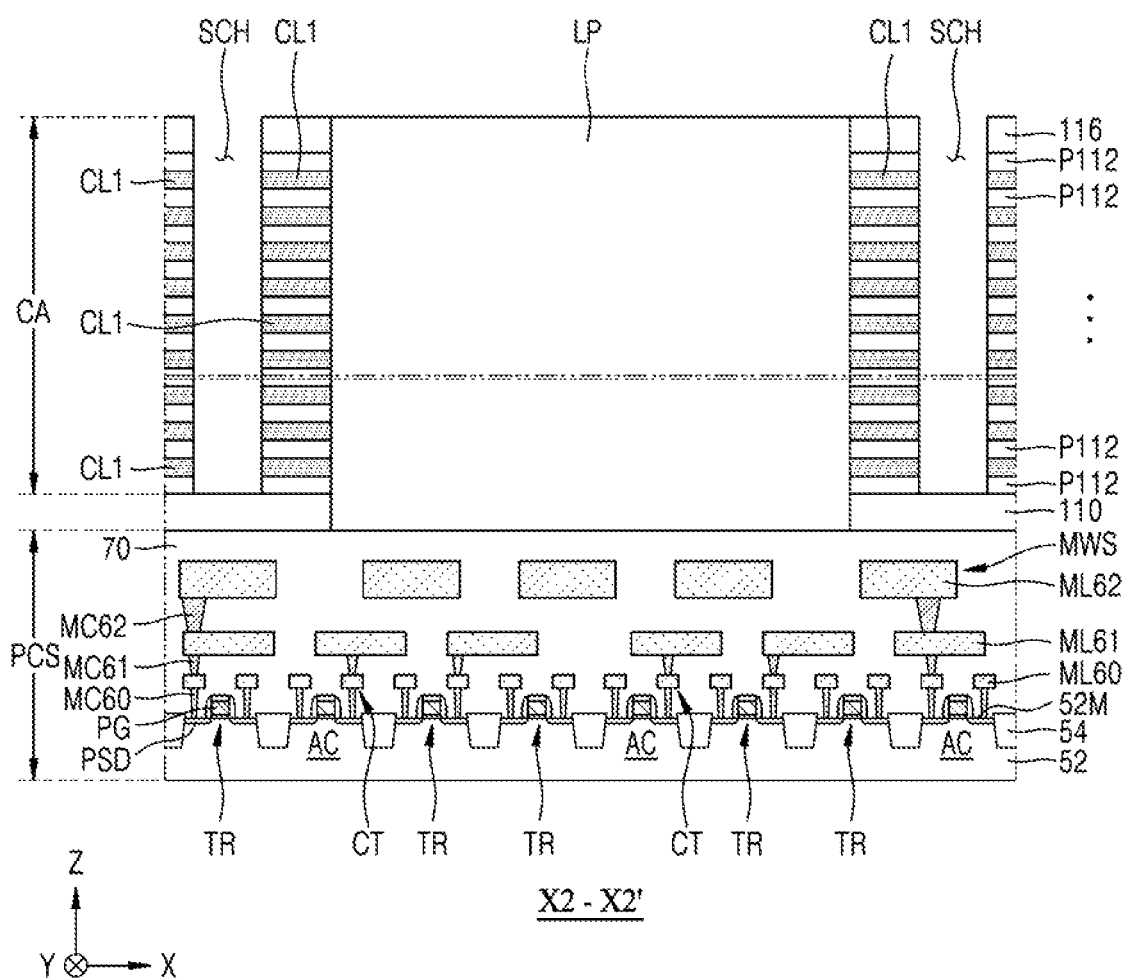

Referring to FIGS. 14A and 14B, the plurality of first junction patterns 114A may be formed from respective partial regions of the plurality of sacrificial layers 114 by injecting a dopant into the respective partial regions of the plurality of sacrificial layers 114 through the cell stack cut holes SCH and the plurality of first indent holes DH1 in a resultant structure of FIGS. 13A through 13C. When the plurality of sacrificial layers 114 are formed of polysilicon doped with an N-type dopant, a P-type dopant may be injected into the respective partial regions of the plurality of sacrificial layers 114 in order to form the plurality of first junction patterns 114A. In this case, within the plurality of first junction patterns 114A, a concentration of the P-type dopant may be greater than that of the N-type dopant. When the plurality of sacrificial layers 114 are formed of polysilicon doped with a P-type dopant, an N-type dopant may be injected into the respective partial regions of the plurality of sacrificial layers 114 in order to form the plurality of first junction patterns 114A. In this case, within the plurality of first junction patterns 114A, a concentration of the N-type dopant may be greater than that of the P-type dopant.

In another implementation, the plurality of first junction patterns 114A of FIG. 14A may be formed using a method of depositing a polysilicon layer including a dopant of a conductivity type opposite to that of the dopant included in the plurality of sacrificial layers 114, instead of using a method of injecting a dopant into the respective partial regions of the plurality of sacrificial layers 114. In more detail, when the plurality of first indent holes DH1 are formed in FIGS. 13A through 13C, respective sizes of the plurality of first indent holes DH1 of FIG. 13B in the first horizontal direction (X direction) may be expanded to up to regions occupied by the plurality of first junction patterns 114A of FIG. 14A by further increasing an etch amount of the plurality of sacrificial layers 114, and then respective partial regions of the expanded plurality of first indent holes DH1 may be filled with the polysilicon layer including the dopant of a conductivity type opposite to that of the dopant included in the plurality of sacrificial layers 114, and thus the plurality of first junction patterns 114A of FIG. 14A may be formed. After the plurality of first junction patterns 114A are formed, the plurality of first conductive lines CL1 may be formed to fill the plurality of first indent holes DH1. To form the plurality of first conductive lines CL1, a conductive material may be deposited through the plurality of cell stack cut holes SCH to fill the plurality of first indent holes DH1, and then respective sidewalls of the plurality of insulation layers P112 may be exposed through the plurality of cell stack cut holes SCH by removing unnecessary portions of the conductive material from the plurality of cell stack cut holes SCH.

Figure 15A:
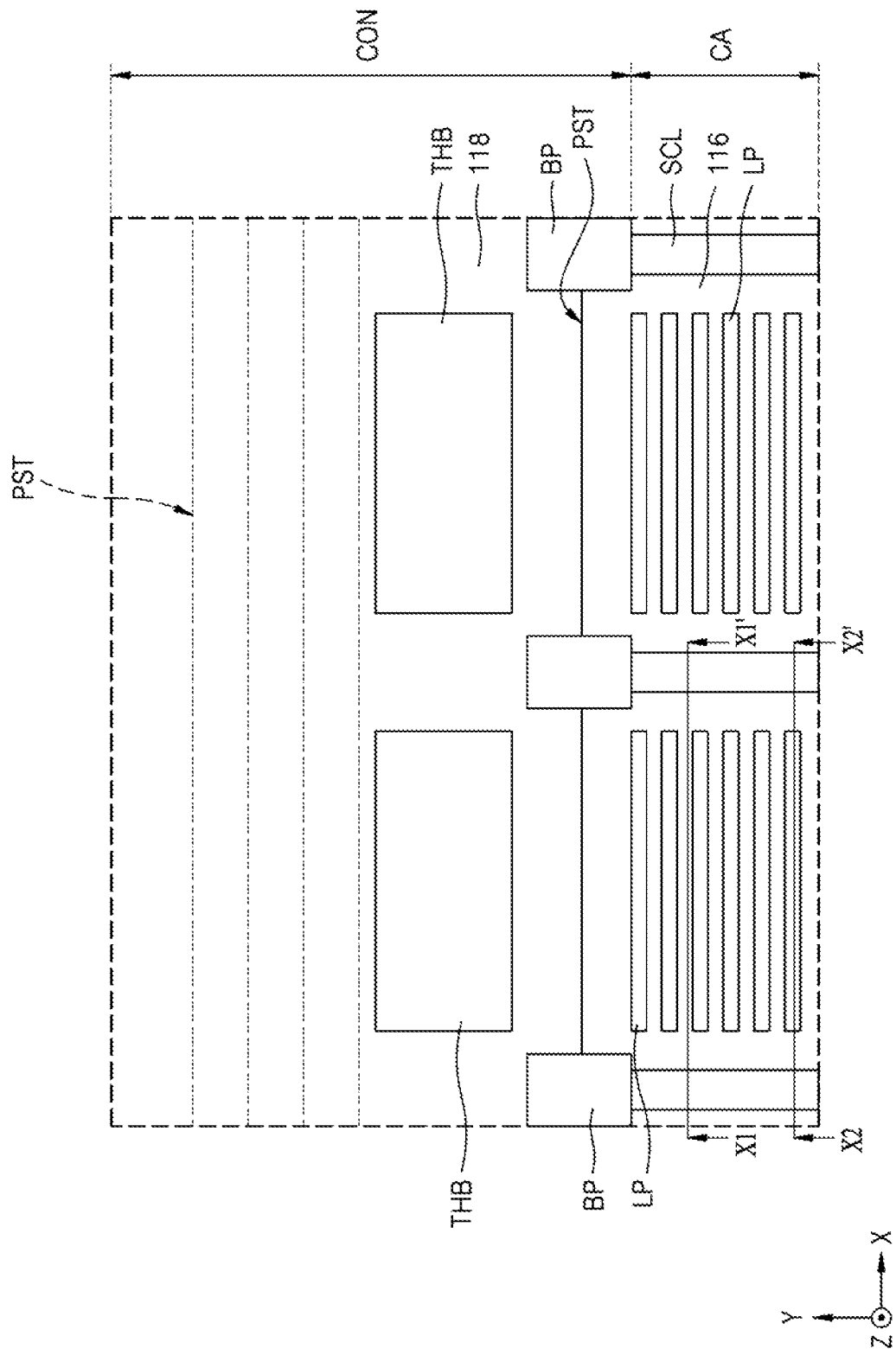
Figure 15B:
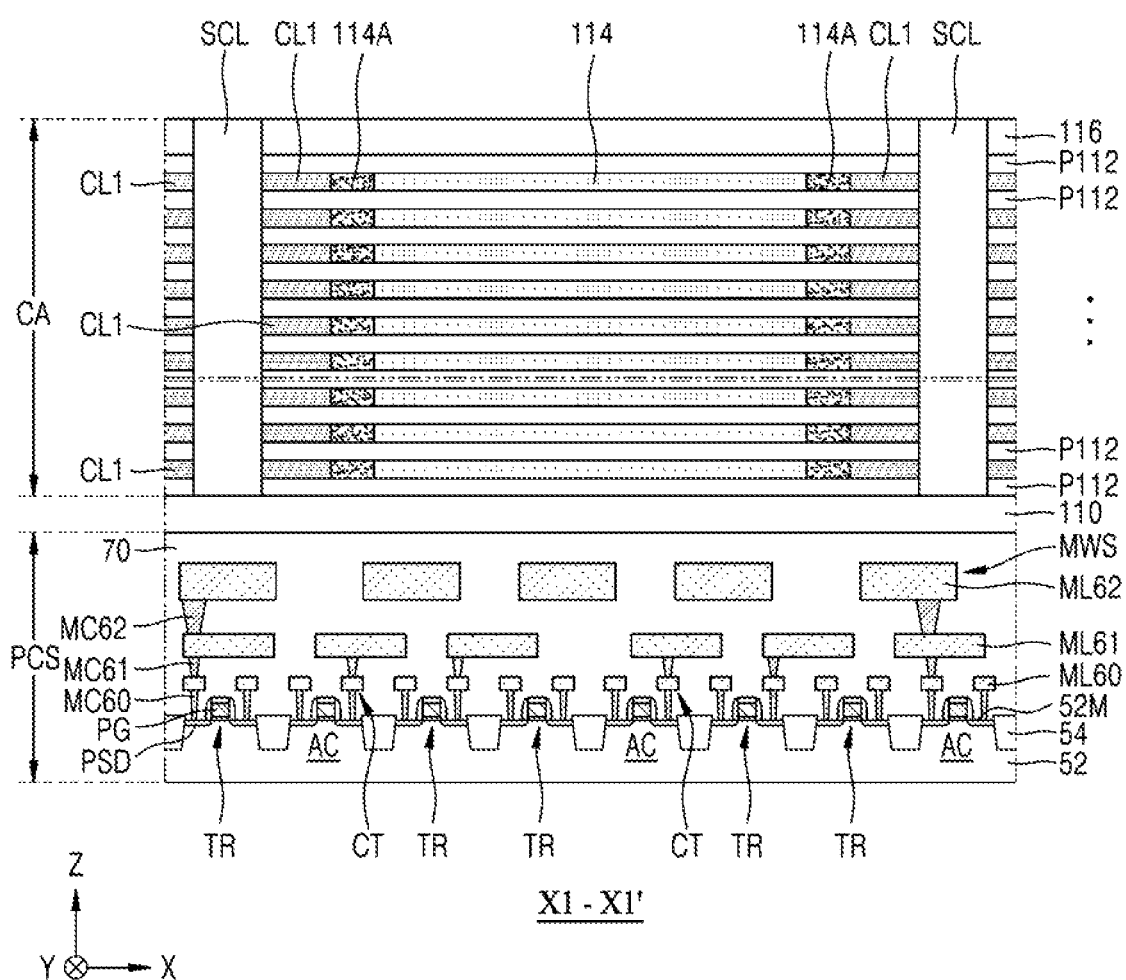
Figure 15C:
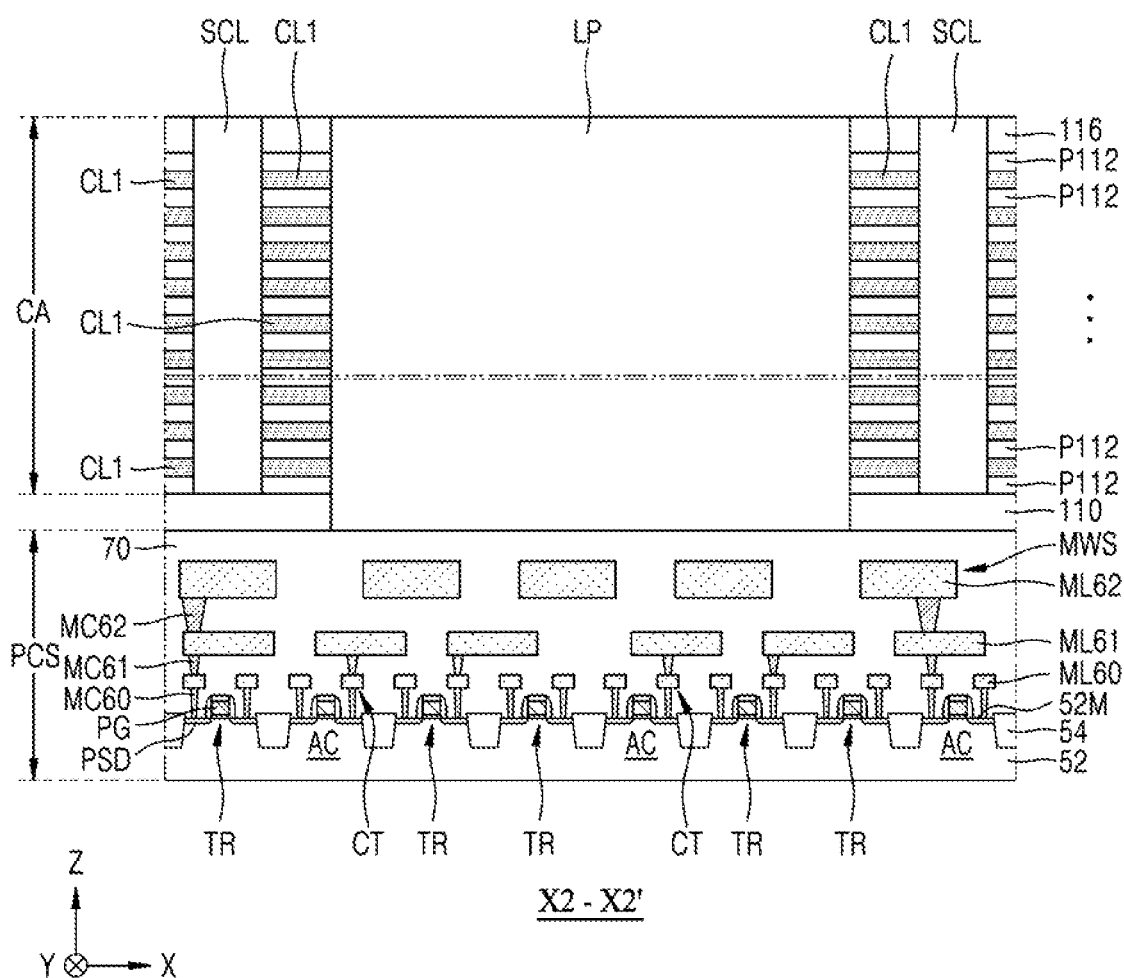

Referring to FIGS. 15A through 15C, the plurality of cell stack cut insulation lines SCL filling the plurality of cell stack cut holes SCH may be formed in a resultant structure of FIGS. 14A and 14B.

To form the plurality of cell stack cut insulation lines SCL, an insulating material may be deposited to fill the plurality of cell stack cut holes SCH in the resultant structure of FIGS. 14A and 14B, and then the upper surface of the upper insulation layer 116 may be exposed by removing an unnecessary insulating material from the outside of the plurality of cell stack cut holes SCH.

Figure 16A:
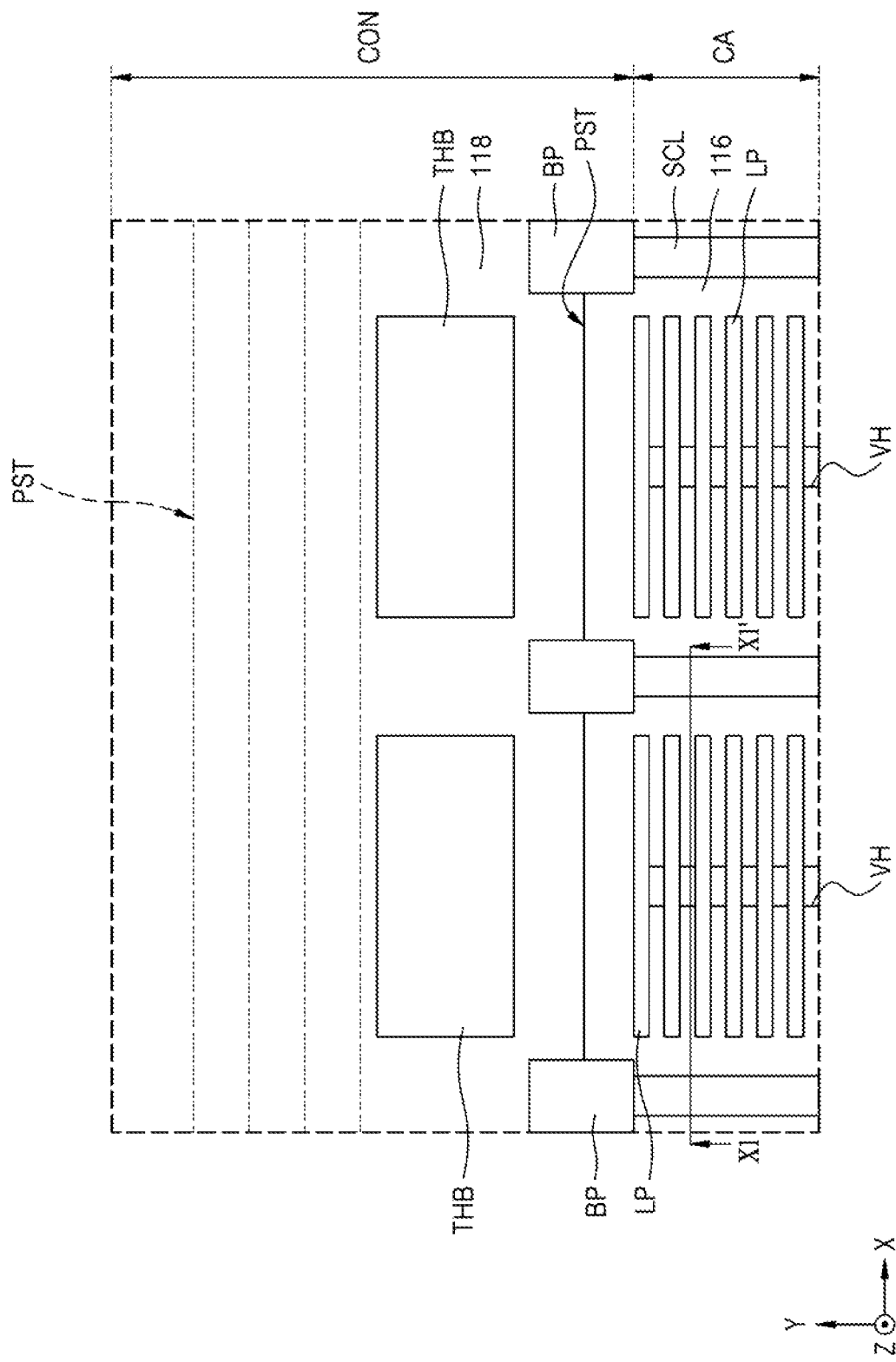
Figure 16B:
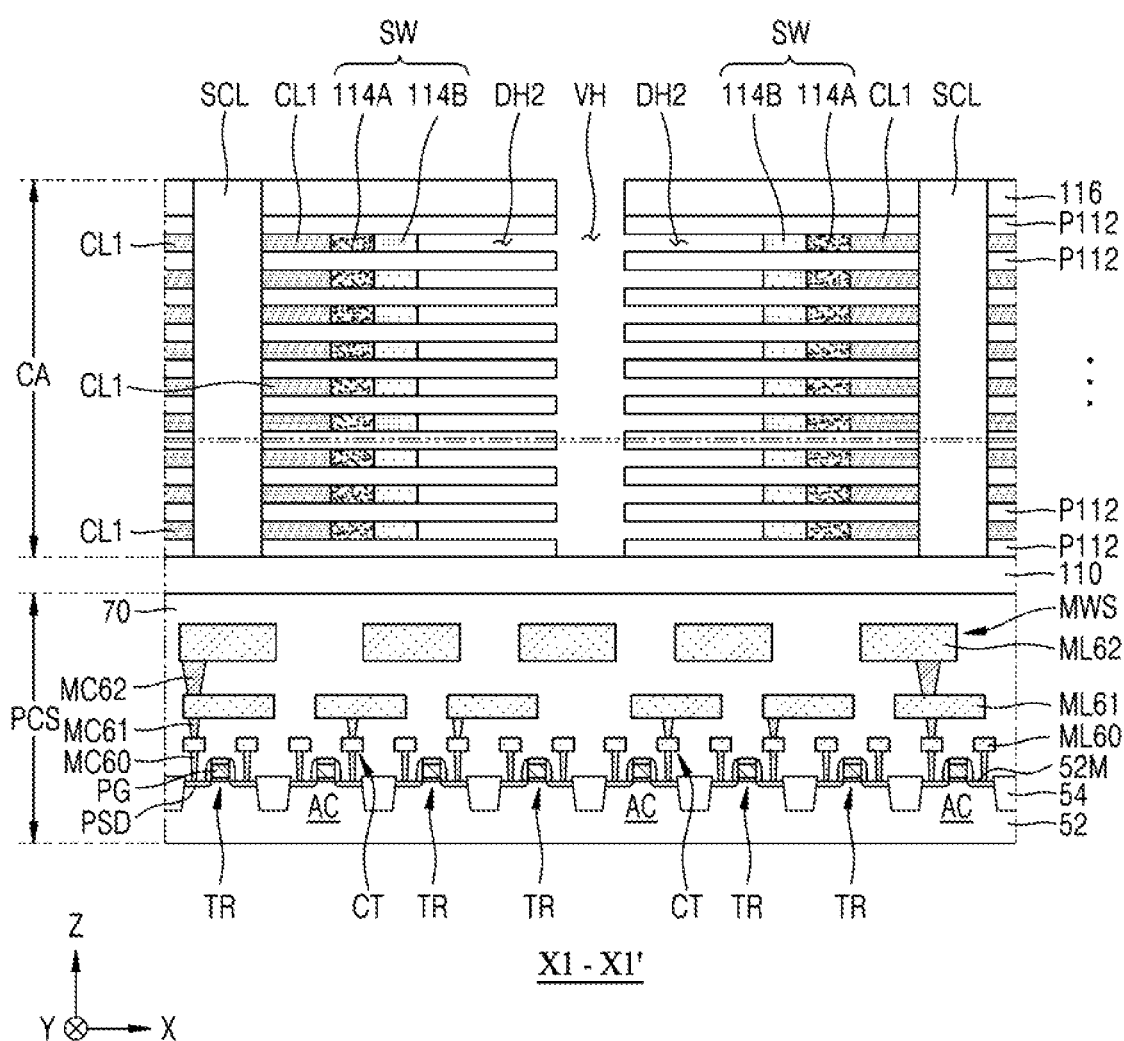

Referring to FIGS. 16A and 16B, a plurality of vertical holes VH may be formed on the support insulation layer 110 by selectively etching respective partial regions of the upper insulation layer 116, the plurality of insulation layers P112, and the plurality of sacrificial layers 114 between the plurality of cell stack cut insulation lines SCL from a resultant structure of FIGS. 15A through 15C, and a plurality of second indent holes DH2 connected to the plurality of vertical holes VH may be formed by removing respective portions of the plurality of sacrificial layers 114 exposed through respective inner sidewalls of the plurality of vertical holes VH. As a result, the plurality of second junction patterns 114B may be formed from remaining portions of the plurality of sacrificial layers 114. Referring to FIG. 16B, sidewalls of the plurality of second junction patterns 114B may be exposed through the plurality of second indent holes DH2.

Figure 17:
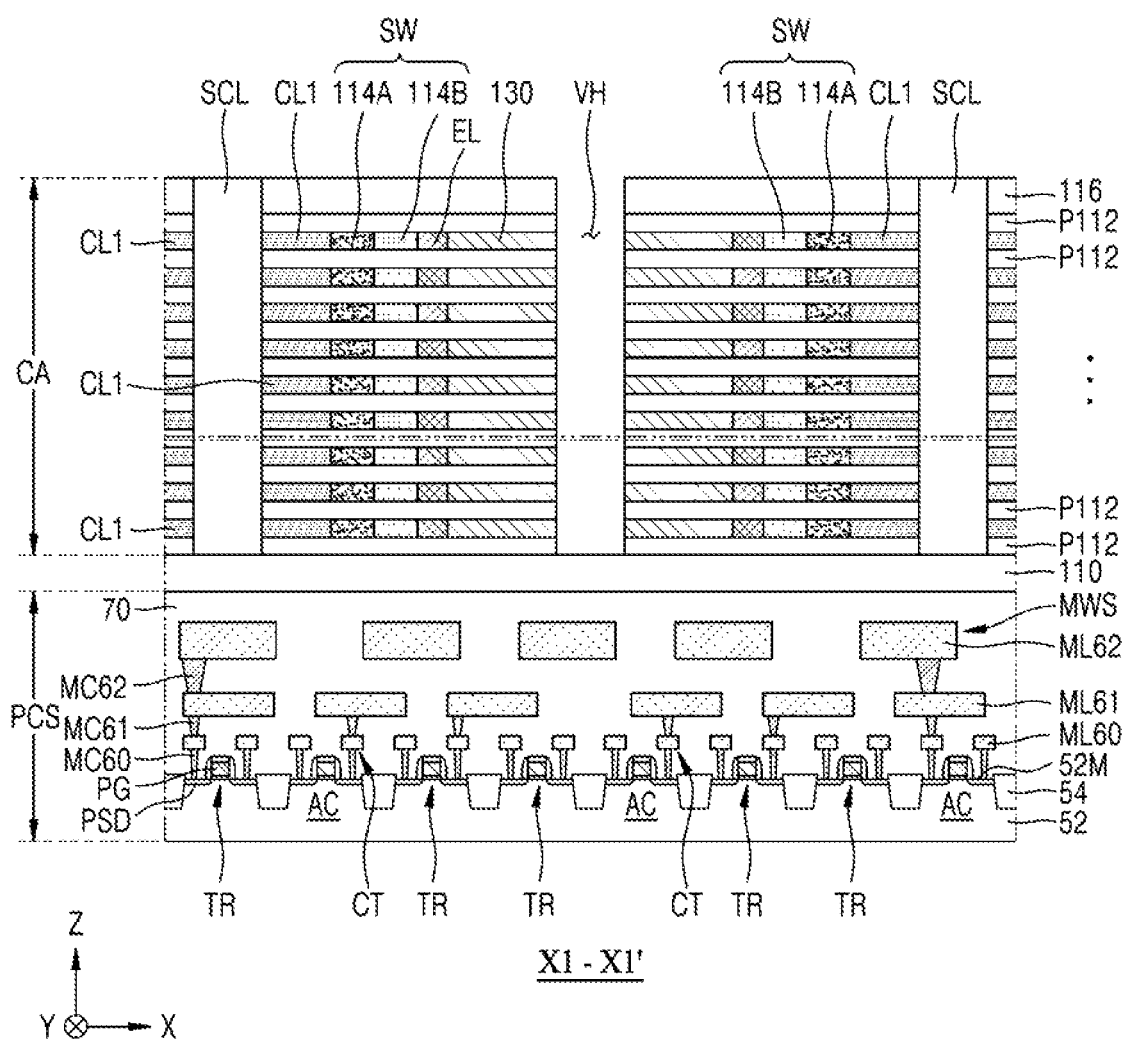

Referring to FIG. 17, the electrode element EL and the variable resistive element 130 may be formed in a remaining space of each of the plurality of second indent holes DH2 remaining on one side of each of the plurality of second junction patterns 114B in a resultant structure of FIGS. 16A and 16B. After the electrode element EL and the variable resistive element 130 are formed, respective sidewalls of the plurality of insulation layers P112 may be exposed through inner sidewalls of the plurality of vertical holes VH.

Figure 18A:
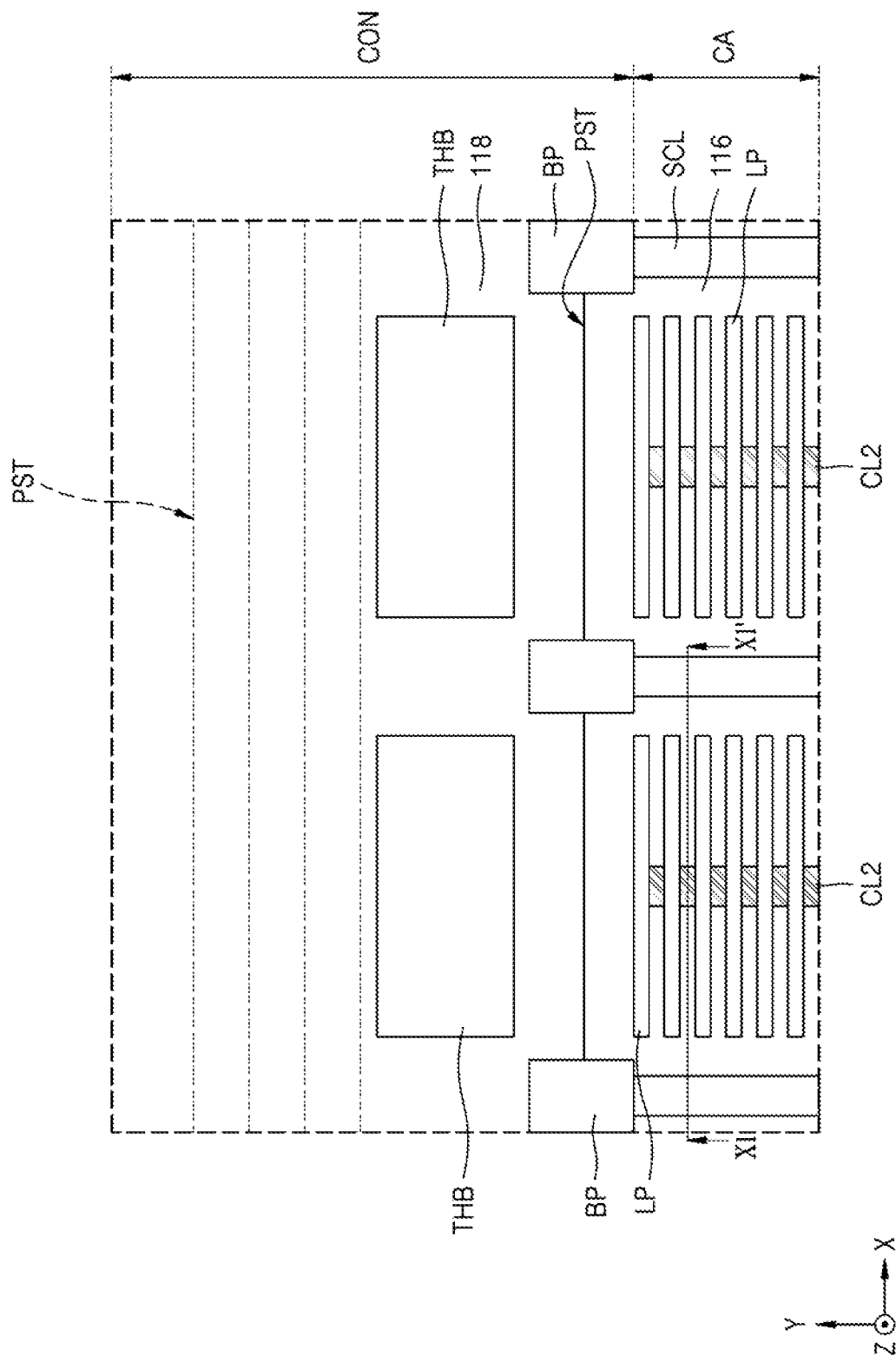
Figure 18B:
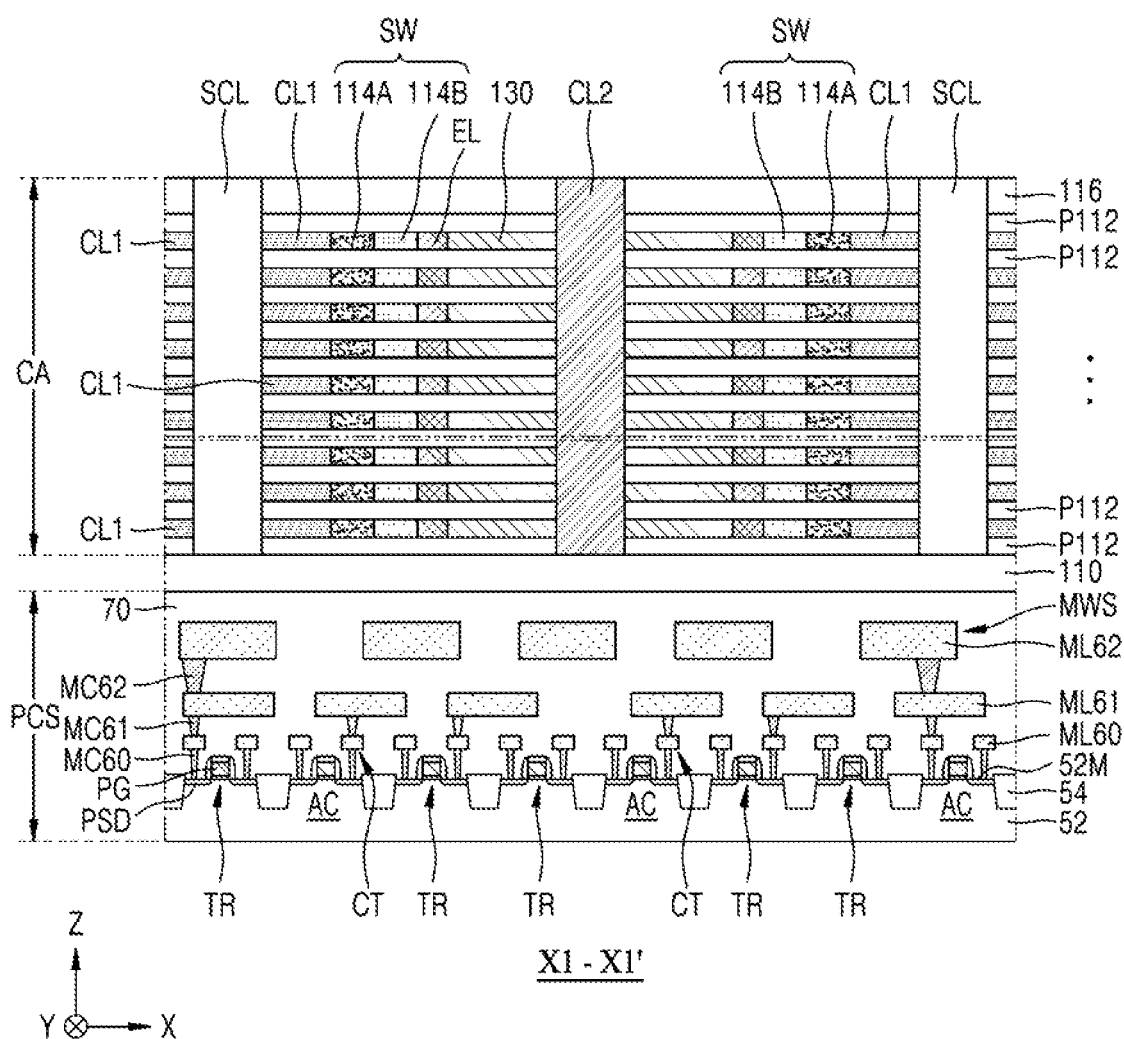

Referring to FIGS. 18A and 18B, the plurality of second conductive lines CL2 filling the plurality of vertical holes VH may be formed in a resultant structure of FIG. 17.

To form the plurality of second conductive lines CL2, a conductive material may be deposited to fill the plurality of vertical holes VH in the resultant structure of FIG. 7, and then the upper surface of the upper insulation layer 116 may be exposed by removing an unnecessary conductive material from the outside of the plurality of vertical holes VH.

Figure 19A:
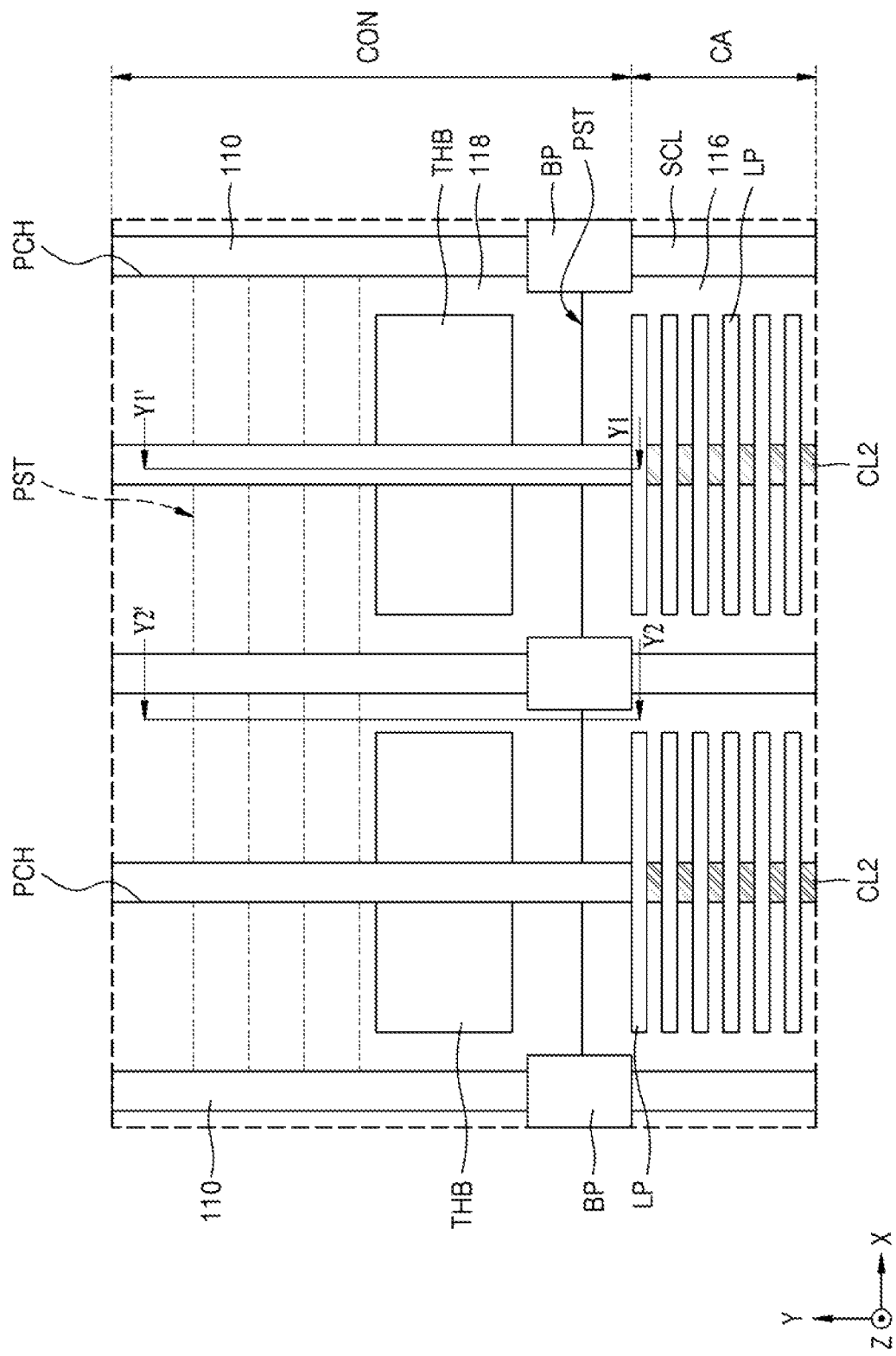
Figure 19B:
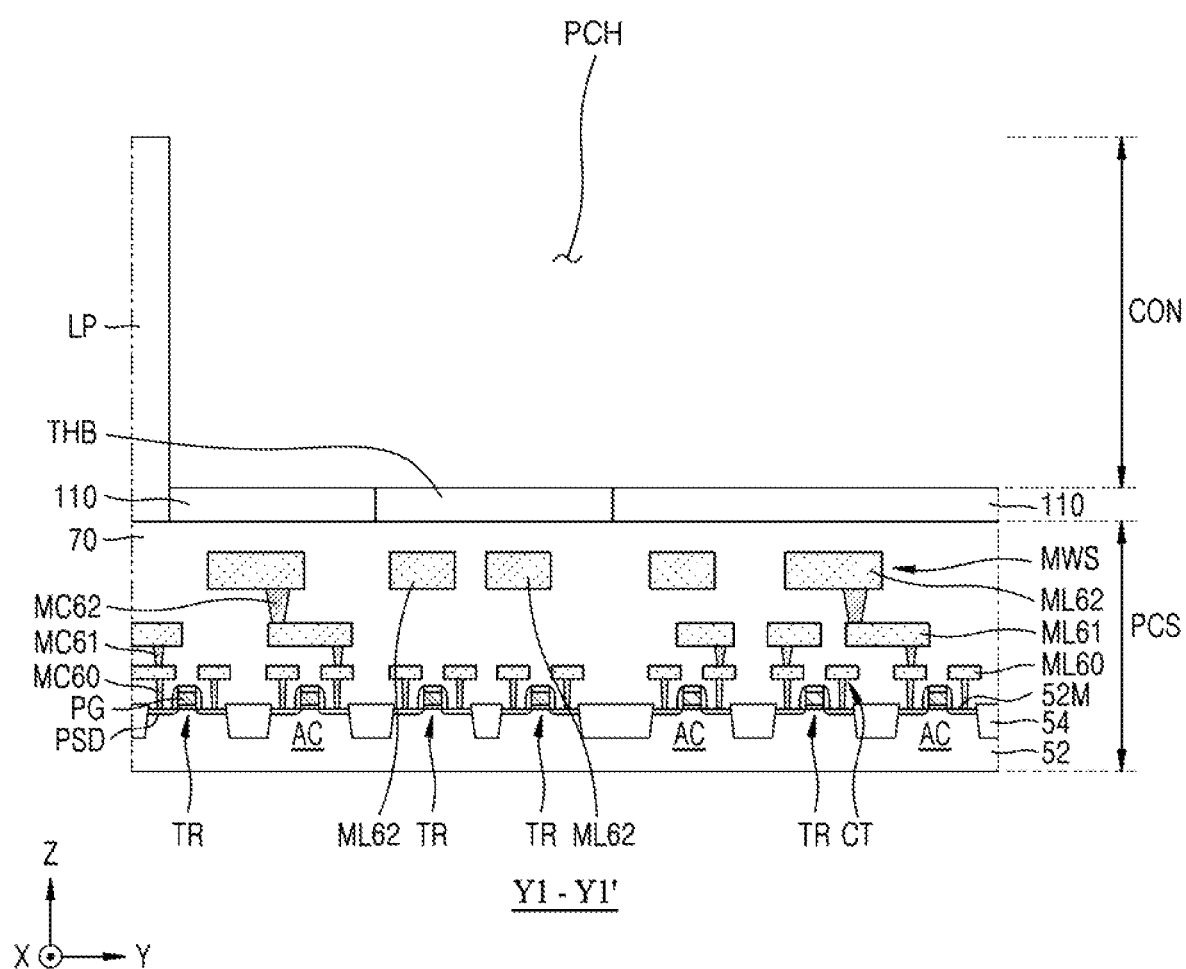
FIG. 19B and FIG. 21B are cross-sectional views of the local region LA1 along line Y1-Y1' of FIG. 4A according to a process sequence of the method.
Figure 19C:
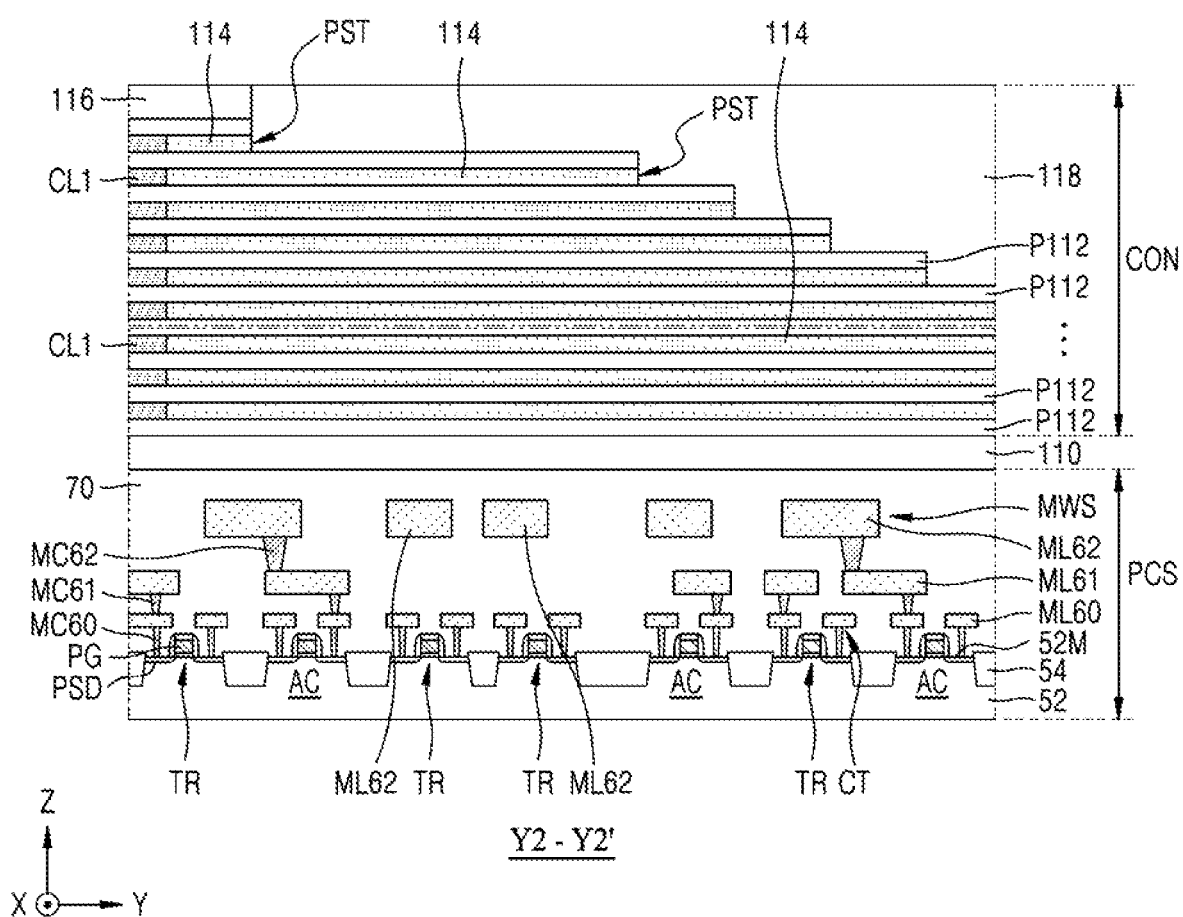
FIG. 19C, FIG. 20A, and FIG. 21C are cross-sectional views of the local region LA1 along line Y2-Y2' of FIG. 4A according to a process sequence of the method.

Referring to FIGS. 19A through 19C, a plurality of pad cut holes PCH are formed in the connection region CON in a resultant structure of FIGS. 18A and 18B. Some pad cut holes PCH from among the plurality of pad cut holes PCH may be aligned with the cell stack cut insulation lines SCL formed in the cell array region CA, in the second horizontal direction (Y direction), and may each extend from a blocking insulation pattern BP in the second horizontal direction (Y direction). The other pad cut holes PCH from among the plurality of pad cut holes PCH may be aligned with the plurality of second conductive lines CL2 formed in the cell array region CA, in the second horizontal direction (Y direction), and may each start from a buried insulation pattern LP, penetrate through an insulation box THB, and extend in the second horizontal direction (Y direction).

After the plurality of pad cut holes PCH are formed, the plurality of insulation layers P112, the plurality of sacrificial layers 114, the insulation box THB, and the filling insulation layer 118 may be exposed through both sidewalls of the plurality of pad cut holes PCH in the first horizontal direction (X direction) from among the inner sidewalls of the plurality of pad cut holes PCH. The upper surface of the support insulation layer 110 may be exposed through respective bottoms of the plurality of pad cut holes PCH.

Referring to FIGS. 20A and 20B, the plurality of sacrificial layers 114 remaining in the connection region CON may be removed from a resultant structure of FIGS. 19A through 19C via the plurality of pad cut holes PCH. As a result, spaces that expose respective upper surfaces and respective lower surfaces of the plurality of insulation layers P112 may be formed between the plurality of pad cut holes PCH. In this state, the plurality of insulation layers P112 may be partially etched starting from respective exposed surfaces thereof such that respective thicknesses of the plurality of insulation layers P112 in the vertical direction (Z direction) decrease, and thus a plurality of second isolation insulation layers 112B may be formed from the plurality of insulation layers P112. A pad space PS may remain between every two of the plurality of second isolation insulation layers 112B. In the vertical direction (Z direction), a height of each of the plurality of pad spaces PS may be greater than that of each first conductive line CL1. The plurality of pad spaces PS may be connected to the pad cut hole PCH of FIG. 19B.

While the plurality of insulation layers P112 are being partially etched starting from their respective exposed surfaces to form the plurality of second isolation insulation layers 112B, respective ends of the plurality of insulation layers P112 in the second horizontal direction (Y direction) may also be partially consumed and the insulation box THB may also be partially consumed. However, these amounts of consumption are insignificant and may not have a significant effect.

While the plurality of pad spaces PS are being formed or after the plurality of pad spaces PS are formed, the plurality of second isolation insulation layers 112B may be supported by the insulation box THB and thus sagging, deformation, or the like of at least respective portions of the plurality of second isolation insulation layers 112B via the pad spaces PS may be prevented.

Referring to FIGS. 21A through 21D, the plurality of conductive pads PL1 may be formed in the plurality of pad spaces PS by filling a conductive material in the plurality of pad spaces PS via the pad cut hole PCH (refer to FIG. 19B) from a resultant structure of FIGS. 19A through 19C, and the plurality of pad cut insulation line PCL including the plurality of first pad cut insulation lines PCL1 and the plurality of second pad cut insulation lines PCL2 may be formed by filling the pad cut hole PCH (refer to FIG. 19B) with an insulating material. A step ST may be formed on one end of each of the plurality of conductive pads PL1.

Thereafter, as shown in FIGS. 4B through 4F, the first interlayer insulation layer 150 covering a resultant structure of FIGS. 21A through 21D may be formed in the cell array region CA and the connection region CON, and the plurality of peripheral contact plugs 162 and the plurality of through-hole via electrodes 164 may be formed in the connection region CON. The plurality of peripheral contact plugs 162 and the plurality of through-hole via electrodes 164 may be formed simultaneously.

Then, the second interlayer insulation layer 170 may be formed to cover the first interlayer insulation layer 150, the plurality of peripheral contact plugs 162, and the plurality of through-hole via electrodes 164, the cell contact plug 182 penetrating through the first interlayer insulation layer 150 and the second interlayer insulation layer 170 and contacting the upper surface of the second conductive line CL2 may be formed in the cell array region CA, and the plurality of contact studs 184 penetrating through the second interlayer insulation layer 170 and contacting respective upper surfaces of the plurality of peripheral contact plugs 162 and the plurality of through-hole via electrodes 164 may be formed in the connection region CON. Next, the cell conductive line 192 may be formed on the second interlayer insulation layer 170 in the cell array region CA, and the plurality of peripheral conductive lines 194 may be formed on the second interlayer insulation layer 170 in the connection region CON. The cell conductive line 192 and the plurality of peripheral conductive lines 194 may be formed simultaneously.

Although the method of manufacturing the resistive memory device 100 of FIGS. 3 and 4A through 4H has been described above with reference to FIGS. 11A through 21D, various modifications and changes may be made to the method of FIGS. 11A through 21D, and thus the resistive memory devices 200A, 200B, 300, 400, 500, 600, and 700 described above with reference to FIGS. 5A through 10 and various other resistive memory devices resulting from various modifications and changes made to the resistive memory devices 200A, 200B, 300, 400, 500, 600, and 700 may be manufactured.

By way of summation and review, an efficiently designed wiring structure for connecting a plurality of memory cells having a 3D layout structure to other neighboring circuits is useful to implement a resistive memory device.

As described above, embodiments relate to memory devices, and more particularly, to a resistive memory device including a plurality of memory cells having a three-dimensional (3D) layout structure. Embodiments may provide a resistive memory device including a plurality of memory cells having a three-dimensional (3D) layout structure, the resistive memory device being manufactured with fewer defects, providing stable electrical connection between the plurality of memory cells and other neighboring circuits, and having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resistive memory device, comprising:
   a plurality of memory cells overlapping one another at locations spaced apart from one another in a vertical direction within a cell array region on a substrate, each of the plurality of memory cells including a switching element and a variable resistive element aligned with each other in a first horizontal direction;

a plurality of first conductive lines overlapping one another at locations spaced apart from one another in the vertical direction within the cell array region on the substrate, each of the plurality of first conductive lines extending in a second horizontal direction perpendicular to the first horizontal direction, and each being connected to the switching element of a corresponding memory cell from among the plurality of memory cells;

a second conductive line extending in the vertical direction within the cell array region on the substrate, being spaced apart from the plurality of first conductive lines in the first horizontal direction with the plurality of memory cells interposed between the second conductive line and the plurality of first conductive lines, and being connected to the variable resistive element of each of the plurality of memory cells; and a plurality of conductive pads arranged in a connection region adjacent to the cell array region on the substrate and connected to one end of a corresponding first conductive line from among the plurality of first conductive lines, the plurality of conductive pads having different lengths in the second horizontal direction, wherein the plurality of conductive pads include a lower conductive pad and an upper conductive pad adjacent to each other in the vertical direction, the lower conductive pad includes a first portion covered by the upper conductive pad and a second portion not covered by the upper conductive pad, and a thickness of each of the first portion and the second portion in the vertical direction is greater than a thickness of each of the plurality of first conductive lines in the vertical direction.

2. The resistive memory device as claimed in claim 1, further comprising:
a plurality of first isolation insulation layers interposed between the plurality of first conductive lines within the cell array region such that one first isolation insulation layer is interposed between every two adjacent first conductive lines; and
a plurality of second isolation insulation layers interposed between the plurality of conductive pads within the connection region such that one second isolation insulation layer is interposed between every two adjacent conductive pads,
wherein a thickness of each of the plurality of second isolation insulation layers in the vertical direction is less than a thickness of each of the plurality of first isolation insulation layers in the vertical direction.

3. The resistive memory device as claimed in claim 1, wherein a separation distance of each of the plurality of conductive pads in the vertical direction is less than a separation distance of each of the plurality of first conductive lines in the vertical direction.

4. The resistive memory device as claimed in claim 1, further comprising:
an insulation box penetrating through some conductive pads from among the plurality of conductive pads within the connection region and extending in the vertical direction; and
a pad cut insulation line penetrating through the insulation box within the connection region, extending in the second horizontal direction, and defining a width of each of the plurality of conductive pads in the first horizontal direction.

5. The resistive memory device as claimed in claim 1, further comprising:
a plurality of isolation insulation layers interposed between the plurality of conductive pads within the connection region such that one isolation insulation layer is interposed between every two adjacent conductive pads; and
an insulation box penetrating through some conductive pads from among the plurality of conductive pads and some isolation insulation layers from among the plurality of isolation insulation layers within the connection region and extending in the vertical direction, and configured to support the some isolation insulation layers by contacting the some isolation insulation layers.

6. The resistive memory device as claimed in claim 1, further comprising:
a cell stack cut insulation line spaced apart from the second conductive line in the first horizontal direction with the plurality of first conductive lines and the plurality of memory cells interposed between the cell stack cut insulation line and the second conductive line, the cell stack cut insulation line extending in the second horizontal direction;
a first pad cut insulation line extending in the second horizontal direction in the connection region and aligned with the cell stack cut insulation line in a straight line in the second horizontal direction; and
a second pad cut insulation line extending in the second horizontal direction in the connection region, defining a width of each of the plurality of conductive pads in the first horizontal direction together with the first pad cut insulation line, and aligned with the second conductive line in a straight line in the second horizontal direction.

7. The resistive memory device as claimed in claim 1, further comprising:
a peripheral circuit structure overlapping the cell array region and the connection region in the vertical direction and including a plurality of wiring layers;
an insulation box penetrating through some conductive pads from among the plurality of conductive pads within the connection region and extending in the vertical direction; and
a through-hole via electrode penetrating through the insulation box in the vertical direction and connected to one wiring layer selected from the plurality of wiring layers.

8. The resistive memory device as claimed in claim 1, further comprising:
a peripheral circuit structure overlapping the cell array region and the connection region in the vertical direction and including a plurality of wiring layers;
an insulation box penetrating through some conductive pads from among the plurality of conductive pads within the connection region and extending in the vertical direction;
a pad cut insulation line penetrating through the insulation box in the connection region, extending in the second horizontal direction, and contacting the insulation box;
a first through-hole via electrode penetrating through the insulation box in the connection region and connected to a first wiring layer selected from the plurality of wiring layers; and a second through-hole via electrode penetrating through the pad cut insulation line in the vertical direction and connected to a second wiring layer selected from the plurality of wiring layers.

9. The resistive memory device as claimed in claim 1, wherein at least one first conductive line selected from the plurality of first conductive lines has a first end that is convex toward a conductive pad selected from the plurality of conductive pads, and the selected conductive pad has a second end surrounding the first end and concave toward the first end.

10. The resistive memory device as claimed in claim 1, further comprising an oxide layer covering a first end closest to the connection region from among at least one first conductive line selected from the plurality of first conductive lines, wherein the plurality of conductive pads includes at least one conductive pad having a second end facing the first end with the oxide layer interposed between the first and second ends.

11. The resistive memory device as claimed in claim 1, wherein each of the plurality of first conductive lines includes a first metal layer and a first conductive barrier layer surrounding the first metal layer;

each of the plurality of conductive pads includes a second metal layer and a second conductive barrier layer surrounding the second metal layer; and the first conductive barrier layer and the second conductive barrier layer face each other between the plurality of first conductive lines and the plurality of conductive pads.

12. A resistive memory device, comprising:

a pair of first conductive lines spaced apart from each other in a first horizontal direction within a cell array region on a substrate and each extending in a second horizontal direction perpendicular to the first horizontal direction at a first vertical level on the substrate;

a second conductive line extending in a vertical direction between the pair of first conductive lines;

a pair of memory cells spaced apart from each other in the first horizontal direction with the second conductive line interposed between the pair of memory cells, and each including a switching element and a variable resistive element, the switching element being arranged at the first vertical level and connected to one of the pair of first conductive lines, and the variable resistive element being arranged at the first vertical level and connected to the second conductive line;

a pair of lower conductive pads arranged at the first vertical level within a connection region adjacent to the cell array region on the substrate and connected to one end of a corresponding first conductive line from among the pair of first conductive lines; and a pair of upper conductive pads arranged at a second vertical level higher than the first vertical level within the connection region and covering respective portions of the pair of lower conductive pads, wherein each of the pair of lower conductive pads includes a first portion and a second portion, the first portion being covered by one upper conductive pad selected from the pair of upper conductive pads, and the second portion not being covered by the selected upper conductive pad, and a thickness of each of the first portion and the second portion in the vertical direction is greater than a thickness of each of the pair of first conductive lines in the vertical direction.

13. The resistive memory device as claimed in claim 12, further comprising:

a peripheral circuit structure overlapping the cell array region and the connection region in the vertical direction and including a plurality of wiring layers;

an insulation box penetrating through the pairs of upper and lower conductive pads in the vertical direction within the connection region; and a through-hole via electrode penetrating through the insulation box in the vertical direction within the connection region and connected to one wiring layer selected from the plurality of wiring layers.

14. The resistive memory device as claimed in claim 12, further comprising:

an insulation box penetrating through the pairs of upper and lower conductive pads in the vertical direction within the connection region; and a pad cut insulation line penetrating through the insulation box in the second horizontal direction and extending in the second horizontal direction between adjacent pairs of upper and lower conductive pads.

15. The resistive memory device as claimed in claim 12, further comprising:

a peripheral circuit structure overlapping the cell array region and the connection region in the vertical direction and including a plurality of wiring layers;

a pair of peripheral contact plugs arranged on the pair of lower conductive pads within the connection region and each extending from an upper surface of each of the pair of lower conductive pads upwards in the vertical direction;

an insulation box penetrating through the pairs of upper and lower conductive pads in the vertical direction within the connection region; and a through-hole via electrode penetrating through the insulation box in the vertical direction within the connection region and connected to one wiring layer selected from the plurality of wiring layers, wherein respective upper surfaces of the pair of peripheral contact plugs and an upper surface of the through-hole via electrode are at a same vertical level on the substrate.

16. The resistive memory device as claimed in claim 12, further comprising:

a pair of cell stack cut insulation lines spaced apart from each other in the first horizontal direction with the pair of first conductive lines interposed between the pair of cell stack cut insulation lines within the cell array region, each of the cell stack cut insulation lines extending in the second horizontal direction;

a pair of first pad cut insulation lines spaced apart from each other in the first horizontal direction with the pairs of upper and lower conductive pads interposed between the pair of first pad cut insulation lines in the connection region, the first pad cut insulation lines being aligned with the pair of cell stack cut insulation lines in a straight line in the second horizontal direction;

an insulation box penetrating through the pairs of upper and lower conductive pads in the vertical direction within the connection region; and a second pad cut insulation line penetrating through the insulation box in the second horizontal direction and extending in the second horizontal direction between the pairs of upper and lower conductive pads, the second pad cut insulation line being aligned with the second conductive line in a straight line in the second horizontal direction.

17. The resistive memory device as claimed in claim 12, further comprising:
- a pair of cell stack cut insulation lines spaced apart from each other in the first horizontal direction with the pair of first conductive lines interposed between the pair of cell stack cut insulation lines within the cell array region, the cell stack cut insulation lines each extending in the second horizontal direction;
- a pair of pad cut insulation lines spaced apart from each other in the first horizontal direction with the pairs of upper and lower conductive pads interposed between the pair of pad cut insulation lines in the connection region, the pad cut insulation lines being aligned with the pair of cell stack cut insulation lines in a straight line in the second horizontal direction; and
- a pair of blocking insulation patterns interposed between the pair of cell stack cut insulation lines and the pair of pad cut insulation lines at locations adjacent to a boundary between the cell array region and the connection region, each of the blocking insulation patterns contacting a cell stack cut insulation line and a pad cut insulation line adjacent to each of the pair of blocking insulation patterns from among the pair of cell stack cut insulation lines and the pair of pad cut insulation lines, and extending in the vertical direction.

18. A resistive memory device, comprising:
- a peripheral circuit structure arranged on a substrate and including a plurality of circuits and a plurality of wiring layers;
- a pair of first conductive lines spaced apart from each other in a first horizontal direction within a cell array region on the peripheral circuit structure and each extending in a second horizontal direction perpendicular to the first horizontal direction at a first vertical level on the peripheral circuit structure;
- a second conductive line extending in a vertical direction between the pair of first conductive lines within the cell array region;
- a pair of memory cells arranged at the first vertical level within the cell array region and spaced apart from each other in the first horizontal direction with the second conductive line interposed between the pair of memory cells, each of the pair of memory cells including a switching element and a variable resistive element, the switching element being connected to one of the pair of first conductive lines, and the variable resistive element being arranged at the first vertical level and connected to the second conductive line;
- a pair of conductive pads arranged at the first vertical level within a connection region adjacent to the cell array region on the peripheral circuit structure, the conductive pads being connected to one end of a corresponding first conductive line from among the pair of first conductive lines; and
- a pair of upper conductive pads arranged at a second vertical level higher than the first vertical level within the connection region, the upper conductive pads covering respective portions of the pair of conductive pads,
- wherein each of the pair of conductive pads includes a first portion and a second portion, the first portion being covered by one upper conductive pad selected from the pair of upper conductive pads, and the second portion not being covered by the selected upper conductive pad, and a thickness of each of the first portion and the second portion in the vertical direction is greater than a thickness of each of the pair of first conductive lines in the vertical direction.

19. The resistive memory device as claimed in claim 18, further comprising:
- an insulation box penetrating through the pair of conductive pads in the vertical direction within the connection region;
- at least one through-hole via electrode penetrating through the insulation box in the vertical direction within the connection region and connected to at least one wiring layer selected from the plurality of wiring layers; and
- a pair of peripheral contact plugs arranged on the pair of conductive pads within the connection region, and each extending from an upper surface of each of the pair of conductive pads upwards in the vertical direction,
- wherein upper surfaces of the at least one through-hole via electrode and respective upper surfaces of the pair of peripheral contact plugs are at a same vertical level on the substrate.

20. The resistive memory device as claimed in claim 18, wherein each of the pair of first conductive lines has a first end that is convex toward a conductive pad selected from the pair of conductive pads, and
- each of the pair of conductive pads has a second end surrounding the first end and concave toward the first end.

* * * * *